United States Patent
Hong et al.

(10) Patent No.: US 12,507,588 B2
(45) Date of Patent: Dec. 23, 2025

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Jin-Ri Hong, Gyeonggi-do (KR); Hyo-Jung Lee, Gyeonggi-do (KR); Hyo-Soon Park, Gyeonggi-do (KR); Ye-Jin Jeon, Gyeonggi-do (KR); Sang-Hee Cho, Gyeonggi-do (KR); Tae-Jun Han, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

(21) Appl. No.: 17/070,136

(22) Filed: Oct. 14, 2020

(65) Prior Publication Data

US 2021/0119142 A1    Apr. 22, 2021

(30) Foreign Application Priority Data

Oct. 22, 2019  (KR) .................. 10-2019-0131351

(51) Int. Cl.
  *C07D 491/048* (2006.01)
  *C07D 493/04* (2006.01)
  *C07D 495/04* (2006.01)
  *C09K 11/06* (2006.01)
  *H10K 85/60* (2023.01)
  *H10K 50/11* (2023.01)

(52) U.S. Cl.
  CPC ....... *H10K 85/657* (2023.02); *C07D 491/048* (2013.01); *C09K 11/06* (2013.01); *H10K 85/636* (2023.02); *H10K 85/654* (2023.02); *H10K 85/6572* (2023.02); *C09K 2211/1007* (2013.01); *C09K 2211/1018* (2013.01); *H10K 50/11* (2023.02)

(58) Field of Classification Search
  CPC .................. C07D 491/048; C07D 495/04; C07D 493/04; H01L 51/0071; H01L 51/0072; H01L 51/0067; H01L 51/0061; H01L 51/5012; C09K 11/06; C09K 2211/1007; C09K 2211/1018
  See application file for complete search history.

(56) References Cited

U.S. PATENT DOCUMENTS

| | | | |
|---|---|---|---|
| 2014/0001442 A1 | 1/2014 | Lee et al. | |
| 2014/0027741 A1 | 1/2014 | Park et al. | |
| 2016/0225992 A1* | 8/2016 | Ito | C09B 57/02 |

FOREIGN PATENT DOCUMENTS

KR  20180011980 A  2/2018

OTHER PUBLICATIONS

Chen, H., S. Yang, Z. Tsai, W. Hung, T. Wang, and K. Wong, "1,3,5-Triazine derivatives as new electron transport-type host materials for highly efficient green phosphorescent OLEDs", J. Mater. Chem. (2009), 19: pp. 8112-8118. (Year: 2009).*
Cited Reference from Japan Patent Office for Japan patent application No. 2020-176107; Application Date: Oct. 20,2020.

* cited by examiner

Primary Examiner — Kamal A Saeed
Assistant Examiner — Sagar Patel
(74) Attorney, Agent, or Firm — G. Creston Campbell

(57) ABSTRACT

The present disclosure relates to an organic electroluminescent compound and an organic electroluminescent device comprising the same. By comprising the organic electroluminescent compound according to the present disclosure, an organic electroluminescent device having low driving voltage and/or high luminous efficiency and/or long lifespan can be provided.

1 Claim, No Drawings

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

The TPD/Alq$_3$ bilayer small molecule organic electroluminescent device with green-emission, which is constituted with a light-emitting layer and a charge transport layer, was first developed by Tang, et al., of Eastman Kodak in 1987. Thereafter, the studies on an organic electroluminescent device have been rapidly commercialized.

An organic electroluminescent device (OLED) changes electric energy into light by applying electricity to an organic electroluminescent material, and commonly comprises an anode, a cathode, and a multi-layered organic layer formed between the two electrodes. The organic layer used in the organic electroluminescent device can be classified into a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc. In such an organic electroluminescent device, holes from the anode and electrons from the cathode are injected into a light-emitting layer by the application of electric voltage, and excitons having high energy are produced by the recombination of the holes and electrons. The organic light-emitting compound moves into an excited state by the energy and emits light from energy when the organic light-emitting compound returns to the ground state from the excited state.

In the multi-layered organic electroluminescent device, there are barriers between the respective layers, and in particular, due to a hole injection barrier, an efficient hole injection is difficult, whereas the electron is faster than the hole in view of injection and transport speed. Due to the difference in the movement degree of holes and electrons to the light-emitting layer, the combination region between holes and electrons is not located in the center of the light-emitting layer, but is located at the interlayer interface, that is, the interface between the light-emitting layer and the hole transport layer, As a result, there is a problem in that the luminous efficiency decreases and the driving voltage increases. In order to solve this problem, the movement degree of electrons and holes should be balanced so that the combination region of electrons and holes exist in the light emitting layer.

DISCLOSURE OF INVENTION

Technical Problem

The object of the present disclosure is firstly, to provide an organic electroluminescent compound which is able to produce an organic electroluminescent device having low driving voltage and/or high luminous efficiency and/or long lifespan, and secondly, to provide an organic electroluminescent device comprising the organic electroluminescent compound.

Solution to Problem

As a result of intensive studies to solve the technical problems above, the present inventors found that the aforementioned objective can be achieved by the organic electroluminescent compound represented by the following formula 1, which maintains the balance of movement degree of holes and electrons in the organic electroluminescent device, and then completed the present invention.

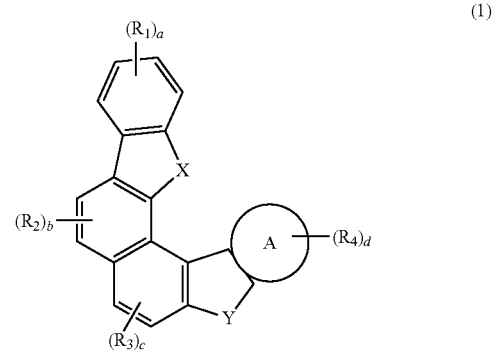

(1)

In formula 1,

Ring A represents a substituted or unsubstituted (C6-C30) aryl or a substituted or unsubstituted (5- to 30-membered)heteroaryl;

X and Y each independently represent O, S, $CR_{11}R_{12}$, $SiR_{13}R_{14}$, or $NR_{15}$;

$R_{11}$ to $R_{14}$ each independently represent hydrogen, deuterium, halogen, cyano, a substituted or unsubstituted (C1-C30)alkyl, a substituted or unsubstituted (C6-C30) aryl, or a substituted or unsubstituted (3- to 30-membered)heteroaryl; or $R_{11}$ and $R_{12}$ or $R_{13}$ and $R_{14}$ may be linked to each other to form a ring;

$R_1$ to $R_4$ and $R_{15}$ each independently represent *-$L_1$-$(Ar_1)_e$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted (C1-C30)alkyl(C6-C30)arylamino, or a substituted or unsubstituted mono- or di-(C6-C30)arylamino;

provided that when at least one of X and Y is $NR_{15}$, at least one of $R_1$ to $R_4$ and $R_{15}$ represent(s)*-$L_1$-$(Ar_1)_e$, or when all of X and Y are not $NR_{15}$, at least one of $R_1$ to $R_4$ represent(s) *-$L_1$-$(Ar_1)_e$;

$L_1$ represents a single bond, a substituted or unsubstituted (C6-C30)arylene, or a substituted or unsubstituted (3- to 30-membered)heteroarylene;

$Ar_1$ represents a substituted or unsubstituted (C6-C30) aryl, a substituted or unsubstituted (3- to 30-membered) heteroaryl, a substituted or unsubstituted mono- or di-(C1-C30)alkylamino, a substituted or unsubstituted (C1-C30)alkyl(C6-C30)arylamino, or a substituted or unsubstituted mono- or di-(C6-C30)arylamino;

provided that when Y is NR$_{15}$, R$_3$ does not include a substituted or unsubstituted triazine or a substituted or unsubstituted pyrimidine;

a and e represent an integer of 1 to 4, b and c represent an integer of 1 or 2, d represents an integer of 1 to 16, when a to e represent an integer of 2 or more, each of R$_1$ to R$_4$ and each of Ar$_1$ may be the same or different;

wherein when the ring A is a benzene ring and Y represent N-L$_1$-(Ar$_1$)$_e$, Ar$_1$ represents any one selected from a substituted or unsubstituted (C6-C30)aryl (provided that the case including p-terphenyl is excluded among the substituted or unsubstituted (C6-C30)aryl), a substituted or unsubstituted dibenzofuran, a substituted or unsubstituted dibenzothiophene, a substituted or unsubstituted di(C6-C30)arylamino, or the following formulas A and B; and wherein when L$_1$ is a single bond, Ar$_1$ represents a substituted or unsubstituted phenyl, a substituted or unsubstituted p-biphenyl, a substituted or unsubstituted o-terphenyl, a substituted or unsubstituted dibenzofuran, a substituted or unsubstituted dibenzothiophene, a substituted or unsubstituted quinoxaline, or a substituted or unsubstituted benzoquinoxaline; with the proviso that the compounds represented by the following formulas 2 to 4 are excluded;

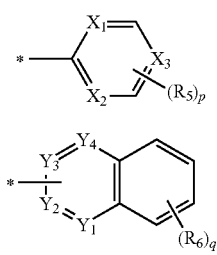
(A)

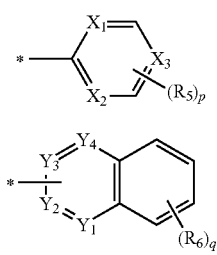
(B)

In formulas A and B,

X$_1$ to X$_3$ and Y$_1$ to Y$_4$ each independently represent CR$_a$ or N, at least one of X$_1$ to X$_3$ represent(s) N, at least one of Y$_1$ to Y$_4$ represent(s) N;

R$_a$ represents hydrogen, a substituted or unsubstituted (C1-C30)alkyl, a substituted or unsubstituted (C2-C30)alkenyl, or a substituted or unsubstituted (C6-C30)aryl;

R$_5$ and R$_6$ each independently represent hydrogen, a substituted or unsubstituted (C1-C30)alkyl, or a substituted or unsubstituted (C6-C30)aryl; or the adjacent R$_6$s may be linked to each other to form a ring;

p represents an integer of 1 to 3, q represents an integer of 1 to 4, when p and q represent an integer of 2 or more, each of R$_5$ and R$_6$ may be the same or different; and \* represents a linking point with L$_1$;

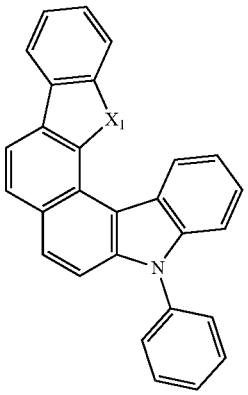
(2)

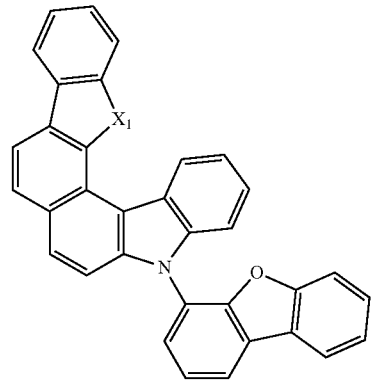
(3)

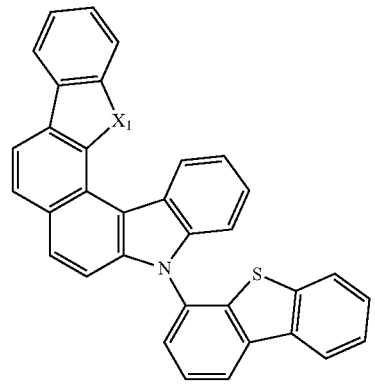
(4)

In formulas 2 to 4,

X$_1$ represents —C(CH$_3$)$_2$, —CPh, —O—, or —S—.

Advantageous Effects of Invention

By comprising the organic electroluminescent compound according to the present disclosure, an organic electroluminescent device having low driving voltage and/or high luminous efficiency and/or long lifespan can be prepared.

MODE FOR THE INVENTION

Hereinafter, the present disclosure will be described in detail. However, the following description is intended to explain the invention, and is not meant in any way to restrict the scope of the invention.

The present disclosure relates to an organic electroluminescent compound represented by formula 1 above, an organic electroluminescent material comprising the organic electroluminescent compound, and an organic electroluminescent device comprising the organic electroluminescent compound.

The term "organic electroluminescent compound" in the present disclosure means a compound that may be used in an organic electroluminescent device, and may be comprised in any material layer constituting an organic electroluminescent device, as necessary.

Herein, "organic electroluminescent material" means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, or an electron injection material, etc.

Herein, "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, etc. Herein, "(C3-C30)cycloalkyl" is a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. Herein, "(C6-C30)aryl(ene)" is a monocyclic or fused ring radical derived from an aromatic hydrocarbon having 6 to 30 ring backbone carbon atoms, in which the number of the ring backbone carbon atoms is preferably 6 to 20, more preferably 6 to 15, may be partially saturated, and comprise a spiro structure. Examples of the aryl specifically include phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluorene-fluorene]yl, spiro[fluorene-benzofluorene]yl, azulenyl, etc. More specifically; the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, etc. Herein, "(3- to 30-membered)heteroaryl(ene)" is an aryl having 3 to 30 ring backbone atoms, in which the number of ring backbone atoms is preferably 5 to 25, including at least one, preferably 1 to 4 heteroatoms selected from the group consisting of B, N, O, S, Si, P, and Ge. The above heteroaryl may be a monocyclic ring, or a fused ring condensed with at least one benzene ring; and may be partially saturated. Also, the above heteroaryl herein may be one formed by linking at least one heteroaryl or aryl group to a heteroaryl group via a single bond(s). Examples of the heteroaryl specifically may include a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acrylidinyl, silafluorenyl, germafluorenyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazole-1-yl, azacarbazole-2-yl, azacarbazole-3-yl, azacarbazole-4-yl, azacarbazole-5-yl, azacarbazole-6-yl, azacarbazole-7-yl, azacarbazole-8-yl, azacarbazole-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acrylidinyl, 2-acrylidinyl, 3-acrylidinyl, 4-acrylidinyl, 9-acrylidinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. Herein, "Halogen" includes F, Cl, Br, and I.

In addition, "ortho (o)" "meta (m)," and "para (p)" are meant to signify the substitution position of all substituents. Ortho position is a compound with substituents, which are adjacent to each other, e.g., at the 1 and 2 positions on benzene, Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, "a ring formed in linking to an adjacent substituent" means a substituted or unsubstituted (3- to 30-membered) mono- or polycyclic, alicyclic, aromatic ring, or a combination thereof, formed by linking or fusing two or more adjacent substituents, preferably may be a substituted or unsubstituted (3- to 26-membered) mono- or polycyclic, alicyclic, aromatic ring, or a combination thereof and comprises a spiro ring. Further, the formed ring may be included at least one heteroatom selected from the group consisting of B, N, O, S, Si and P, preferably, N, O and S. According to one embodiment of the present disclosure, the ring formed in linking to an adjacent substituent may be a spiro ring wherein the number of atoms in the ring skeleton is 5 to 20; according to another embodiment of the present disclosure, the ring formed in linking to an adjacent substituent may be a spiro ring wherein the number of atoms in the ring skeleton is 5 to 15.

In addition, "substituted" in the expression "substituted or unsubstituted" according to the present disclosure means that a hydrogen atom in a certain functional group is replaced with another atom or functional group, i.e., a substituent. The substituents of the substituted (C1-C30) alkyl, the substituted (C3-C30)cycloalkyl, the substituted (3- to 7-membered)heterocycloalkyl, the substituted (C6-C30)aryl(ene), the substituted (3- to 30-membered)heteroaryl(ene), the substituted tri(C1-C30)alkylsilyl, the substituted di(C1-C30)alkyl(C6-C30)arylsilyl, the substituted (C1-C30)alkyldi (C6-C30)arylsilyl, the substituted tri(C6-C30)arylsilyl, the substituted mono- or di-(C1-C30)alkylamino, the substituted (C1-C30)alkyl(C6-C30)arylamino, and the substituted mono- or di-(C6-C30)arylamino in $R_1$ to $R_4$, $R_{11}$ to $R_{15}$, $L_1$, and $Ar_1$ according to the present disclosure are, preferably, each independently at least one selected from the group consisting of deuterium, halogen, cyano, carboxyl, nitro, hydroxyl, (C1-C30)alkyl, halo(C1-C30)alkyl, (C2-C30)alkenyl; (C2-C30)alkynyl; (C1-C30)alkoxy, (C1-C30)alkylthio, (C3-C30)cycloalkyl, (C3-C30)cycloalkenyl, (3- to 7-membered)heterocycloalkyl, (C6-C30)aryloxy, (C6-C30)arylthio, (C6-C30)aryl-substituted or unsubstituted (5- to 30-membered)heteroaryl, (5- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di(C1-C30)alkylamino, (C1-C30)alkyl-substituted or unsubstituted mono- or di(C6-C30)arylamino, (C1-C30)alkyl(C6-C30)arylamino, (C1-C30)alkylcarbonyl, (C1-C30)alkoxycarbonyl, (C6-C30)arylcarbonyl, di(C6-C30)arylboronyl, di(C1-C30)alkylboronyl, (C1-C30)alkyl(C6-C30)arylboronyl, (C6-C30)ar(C1-C30)alkyl, and (C1-C30)alkyl(C6-C30)aryl. For example, the substituents may be phenyl, biphenyl, triazinyl, or biphenyldimethylfluorenylamino, etc.

Hereinafter, the organic electroluminescent compound according to one embodiment will be described.

The organic electroluminescent compound according to one embodiment is represented by the following formula 1.

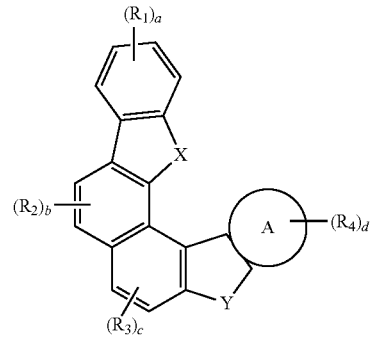

(1)

In formula 1,

Ring A represents a substituted or unsubstituted (C6-C30) aryl or a substituted or unsubstituted (5- to 30-membered)heteroaryl;

X and Y each independently represent O, S, $CR_{11}R_{12}$, $SiR_{13}R_{14}$, or $NR_{15}$;

$R_{11}$ to $R_{14}$ each independently represent hydrogen, deuterium, halogen, cyano, a substituted or unsubstituted (C1-C30)alkyl, a substituted or unsubstituted (C6-C30) aryl, or a substituted or unsubstituted (3- to 30-membered)heteroaryl; or $R_{11}$ and $R_{12}$ or $R_{13}$ and $R_{14}$ may be linked to each other to form a ring;

$R_1$ to $R_4$ and $R_{15}$ each independently represent *-$L_1$-$(Ar_1)_e$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi (C6-C30)arylsilyl, a substituted or unsubstituted tri (C6-C30)arylsilyl, a substituted or unsubstituted mono- or di-(C1-C30)alkylamino, a substituted or unsubstituted (C1-C30)alkyl(C6-C30)arylamino, or a substituted or unsubstituted mono- or di-(C6-030)arylamino;

provided that when at least one of X and Y is $NR_{15}$, at least one of $R_1$ to $R_4$ and $R_{15}$ represent(s) *-$L_1$-$(Ar_1)_e$, or when all of X and Y are not $NR_{15}$, at least one of $R_1$ to $R_4$ represent(s) *-$L_1$-$(Ar_1)_e$;

$L_1$ represents a single bond, a substituted or unsubstituted (C6-C30)arylene, or a substituted or unsubstituted (3- to 30-membered)heteroarylene;

$Ar_1$ represents a substituted or unsubstituted (C6-C30) aryl, a substituted or unsubstituted (3- to 30-membered) heteroaryl, a substituted or unsubstituted mono- or di-(C1-C30)alkylamino, a substituted or unsubstituted (C1-C30)alkyl(C6-C30)arylamino, or a substituted or unsubstituted mono- or di-(C6-C30)arylamino;

provided that when Y is $NR_{15}$, $R_3$ does not include a substituted or unsubstituted triazine or a substituted or unsubstituted pyrimidine;

a and e represent an integer of 1 to 4, b and c represent an integer of 1 or 2, d represents an integer of 1 to 16, when a to e represent an integer of 2 or more, each of $R_1$ to $R_4$ and each of $Ar_1$ may be the same or different;

wherein when the ring A is a benzene ring and Y represent N-$L_1$-$(Ar_1)_e$, $Ar_1$ represents any one selected from a substituted or unsubstituted (C6-C30)aryl (provided that the case including p-terphenyl is exclude among the substituted or unsubstituted (C6-C30)aryl), a substituted or unsubstituted dibenzofuran, a substituted or unsubstituted dibenzothiophene, a substituted or unsubstituted di(C6-C30)arylamino, or the following formulas A and B; and wherein when $L_1$ is a single bond, $Ar_1$ represents a substituted or unsubstituted phenyl, a substituted or unsubstituted p-biphenyl, a substituted or unsubstituted o-terphenyl, a substituted or unsubstituted dibenzofuran, a substituted or unsubstituted dibenzothiophene, a substituted or unsubstituted quinoxaline, or a substituted or unsubstituted benzoquinoxaline; with the proviso that the compounds represented by the following formulas 2 to 4 are excluded;

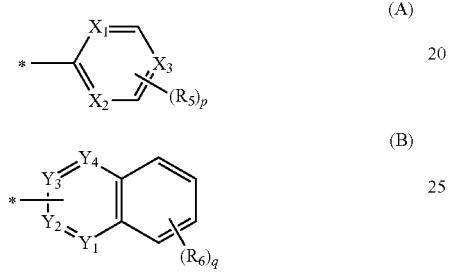

(A)

(B)

In formulas A and B, $X_1$ to $X_3$ and $Y_1$ to $Y_4$ each independently represent $CR_a$ or N, at east one of $X_1$ to $X_3$ represent(s) N, at least one of $Y_1$ to $Y_4$ represent(s) N;

$R_a$ represents hydrogen, a substituted or unsubstituted (C1-C30)alkyl, a substituted or unsubstituted (C2-C30)alkenyl, or a substituted or unsubstituted (C6-C30)aryl;

$R_5$ and $R_6$ each independently represent hydrogen, a substituted or unsubstituted (C1-C30)alkyl, or a substituted or unsubstituted (C6-C30)aryl; or the adjacent $R_6$s may be linked to each other to form a ring;

p represents an integer of 1 to 3, q represents an integer of 1 to 4, when p and q represent an integer of 2 or more, each of $R_5$ and $R_6$ may be the same or different; and

* represents a linking point with $L_1$;

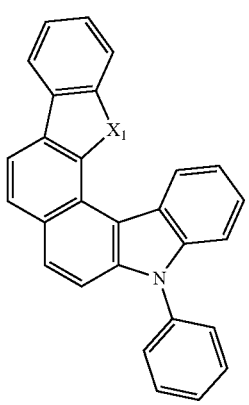

(2)

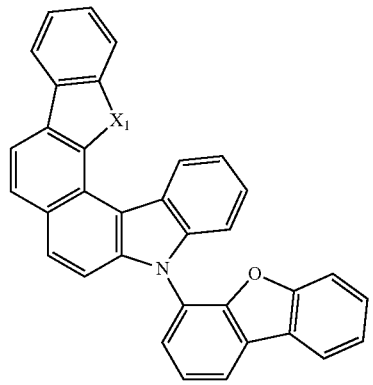

(3)

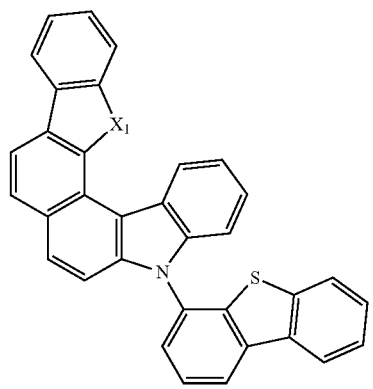

(4)

In formulas 2 to 4, $X_1$ represents —C(CH$_3$)$_2$, —CPh, —O—, or —S—.

In one embodiment, the ring A may be a substituted or unsubstituted (C6-C30)aryl or a substituted or unsubstituted (5- to 30-membered)heteroaryl, preferably, a substituted or unsubstituted (C6-C25)aryl, more preferably a substituted or unsubstituted (C6-C18)aryl. Specifically, the ring A may be a substituted or unsubstituted benzene ring, a substituted or unsubstituted naphthalene ring, a substituted or unsubstituted anthracene ring, or a substituted or unsubstituted phenanthrene ring.

In one embodiment, X and Y each independently represent O, S, $CR_{11}R_{12}$, $SiR_{13}R_{14}$, or $NR_{15}$, preferably X and Y each independently may be O, S, $CR_{11}R_{12}$, or $NR_{15}$.

In one embodiment, $R_{11}$ to $R_{14}$ each independently represent hydrogen, deuterium, halogen, cyano, a substituted or unsubstituted (C1-C30)alkyl, a substituted or unsubstituted (C6-C30)aryl, or a substituted or unsubstituted (3- to 30-membered)heteroaryl; or $R_{11}$ and $R_{12}$ or $R_{13}$ and $R_{14}$ may be linked to each other to form a ring; preferably, hydrogen, deuterium, a substituted or unsubstituted (C1-C20)alkyl, or a substituted or unsubstituted (C6-C25)aryl; or $R_{11}$ and $R_{12}$ or $R_{13}$ and $R_{14}$ may be linked to each other to form a substituted or unsubstituted (5- to 30-membered) mono- or polycyclic, alicyclic, aromatic ring, or a combination thereof; more preferably, hydrogen, deuterium, a substituted or unsubstituted (C1-C10)alkyl, or a substituted or unsubstituted (C6-C18)aryl; $R_{11}$ and $R_{12}$ or $R_{13}$ and $R_{14}$ may be linked to each other to form a substituted or unsubstituted (5- to 30-membered) polycyclic, alicyclic, aromatic ring, or a combination thereof, and $R_{11}$ and $R_{12}$ or $R_{13}$ and $R_{14}$ may be linked to each other to form a spiro ring. Specifically, to $R_{14}$ each independently represent hydrogen, a substituted or unsubstituted methyl, or a substituted or unsubstituted phenyl; or $R_{11}$ and $R_{12}$ or $R_{13}$ and $R_{14}$ may be linked to each other to form a substituted or unsubstituted spirobifluorene, etc.

In one embodiment, $R_1$ to $R_4$ and $R_{15}$ each independently represent $*-L_1-(Ar_1)_e$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted (C1-C30)alkyl(C6-C30)arylamino, or a substituted or unsubstituted mono- or di-(C6-C30)arylamino, preferably, may be $*-L_1-(Ar_1)_e$, hydrogen, deuterium, a substituted or unsubstituted (C6-C30)aryl, a substituted or unsubstituted (3- to 30-membered)heteroaryl, or a substituted or unsubstituted mono- or di-(C6-C30)arylamino, more preferably, $*-L_1-(Ar_1)_e$, hydrogen, deuterium, a substituted or unsubstituted (C6-C25)aryl, a substituted or unsubstituted nitrogen-containing (5- to 25-membered)heteroaryl, or a substituted or unsubstituted di(C6-C30)arylamino. Specifically, $R_1$ to $R_4$ each independently may be a substituted or unsubstituted phenyl, a substituted or unsubstituted naphthyl, a substituted or unsubstituted m-biphenyl, a substituted or unsubstituted pyrimidinyl, a substituted or unsubstituted triazinyl, a substituted or unsubstituted quinoxalinyl, a substituted or unsubstituted quinazolinyl, or amino substituted with at least two of phenyl, biphenyl, and dimethylfluorenyl, etc.

In one embodiment, when at least one of X and Y represent(s) $NR_{15}$, at least one of $R_1$ to $R_4$ and $R_{15}$ represent(s) $*-L_1-(Ar_1)_e$, or when all of X and Y are not $NR_{15}$, at least one of $R_1$ to $R_4$ represents $*-L_1-(Ar_1)_e$.

In one embodiment, $L_1$ represents a single bond, a substituted or unsubstituted (C6-C30)arylene, or a substituted or unsubstituted (3- to 30-membered)heteroarylene, preferably may be a single bond, a substituted or unsubstituted (C6-C25)arylene, or a substituted or unsubstituted (5- to 25-membered)heteroarylene, more preferably, a single bond, a substituted or unsubstituted (C6-C18)arylene or a substituted or unsubstituted (5- to 20-membered)heteroarylene. Specifically, $L_1$ may be a single bond, or a substituted or unsubstituted phenylene, a substituted or unsubstituted naphthylene, a substituted or unsubstituted m-biphenylene, a substituted or unsubstituted pyridylene, a substituted or unsubstituted triazinylene, a substituted or unsubstituted quinoxalinylene, or a substituted or unsubstituted benzoquinoxalinylene, etc.

In one embodiment, $Ar_1$ represents a substituted or unsubstituted (C6-C30)aryl, a substituted or unsubstituted (3- to 30-membered)heteroaryl, a substituted or unsubstituted mono- or di-(C1-C30)alkylamino, a substituted or unsubstituted (C1-C30)alkyl(C6-C30)arylamino, or a substituted or unsubstituted mono- or di-(C6-C30)arylamino, preferably may be a substituted or unsubstituted (C6-C25)aryl, a substituted or unsubstituted (5- to 25-membered)heteroaryl, or a substituted or unsubstituted di(C6-C25)arylamino, more preferably, a substituted or unsubstituted (C6-C18)aryl, a substituted or unsubstituted (5- to 20-membered)heteroaryl, or a substituted or unsubstituted di(C6-C18)arylamino. Specifically, $Ar_1$ may be a substituted or unsubstituted phenyl, a substituted or unsubstituted naphthyl, a substituted or unsubstituted m-biphenyl, a substituted or unsubstituted p-biphenyl, a substituted or unsubstituted o-terphenyl, a substituted or unsubstituted dibenzofuranyl, a substituted or unsubstituted dibenzothiophenyl, a substituted or unsubstituted pyridine, a substituted or unsubstituted pyrimidyl, a substituted or unsubstituted triazinyl, a substituted or unsubstituted quinoxaline, a substituted or unsubstituted quinazoline, a substituted or unsubstituted benzoquinoxaline, or amino substituted with at least two of phenyl, biphenyl, and dimethylfluorenyl, etc.

In one embodiment, a and e represent an integer of 1 to 4, b and c represent an integer of 1 or 2, d represents an integer of 1 to 16, when a to e represent an integer of 2 or more, each of $R_1$ to $R_4$ and each of $Ar_1$ may be the same or different.

According to one embodiment, when Y represents $NR_{15}$, the compound represented by formula 1 above does not include the compounds in that $R_3$ represents a substituted or unsubstituted triazine, or a substituted or unsubstituted pyrimidine.

According to one embodiment, in the compound represented by formula 1 above, when the ring A is a C6 aryl ring, i.e., a benzene ring and Y represents $N-L_1-(Ar_1)_e$, $Ar_1$ may be any one selected from a substituted or unsubstituted (C6-C30)aryl (provided that the case including p-terphenyl is exclude among the substituted or unsubstituted (C6-C30) aryl), a substituted or unsubstituted dibenzofuran, a substituted or unsubstituted dibenzothiophene, a substituted or unsubstituted di(C6-C30)arylamino, or the following formulas A and B.

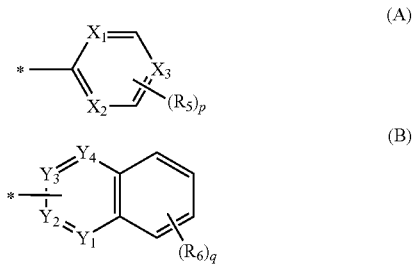

In formulas A and B, $X_1$ to $X_3$ and $Y_1$ to $Y_4$ each independently represent $CR_a$ or N, at least one of $X_1$ to $X_3$ represents N, at least one of $Y_1$ to $Y_4$ represents N;

$R_a$ represents hydrogen, a substituted or unsubstituted (C1-C30)alkyl, a substituted or unsubstituted (C2-C30) alkenyl or a substituted or unsubstituted (C6-C30)aryl;

$R_5$ and $R_6$ each independently represent hydrogen, a substituted or unsubstituted (C1-C30)alkyl, or a substituted or unsubstituted (C6-C30)aryl; or the adjacent $R_6$s may be linked to each other to form a ring;

p represents an integer of 1 to 3, q represents an integer of 1 to 4, when p and q represent an integer of 2 or more, each of $R_5$ and $R_6$ may be the same or different; and

* represent a linking point with $L_1$.

In one embodiment, $X_1$ to $X_3$ each independently represent $CR_a$ or N, at least one of $X_1$ to $X_3$ represents N, preferably at least two of $X_1$ to $X_3$ may be N, more preferably all of $X_1$ to $X_3$ may be N. Specifically, the compounds represented by the formula A may be a substituted or unsubstituted pyridine, a substituted or unsubstituted pyrimidine, or a substituted or unsubstituted triazine.

In one embodiment, $Y_1$ to $Y_4$ each independently represent $CR_a$ or N, at least one of $Y_1$ to $Y_4$ represents N, preferably at least two of $Y_1$ to $Y_4$ may be N, more preferably, $Y_1$ and $Y_3$ may be N, $Y_2$ and $Y_4$ each independently may be $CR_a$; or $Y_1$ and $Y_4$ may be N, $Y_2$ and $Y_3$ each independently may be $CR_a$. Specifically, the compounds represented by the formula B may be a substituted or unsubstituted quinoline, a substituted or unsubstituted quinazoline, a substituted or unsubstituted quinoxaline, a substituted or unsubstituted benzoquinoline, a substituted or unsubstituted benzoquinazoline, a substituted or unsubstituted benzoquinoxaline, a substituted or unsubstituted dibenzoquinoline, a substituted or unsubstituted dibenzoquinazoline, or a substituted or unsubstituted dibenzoquinoxaline.

In one embodiment, $R_a$ represents hydrogen, a substituted or unsubstituted (C1-C30)alkyl, a substituted or unsubstituted (C2-C30)alkenyl or a substituted or unsubstituted (C6-C30)aryl, preferably may be hydrogen, a substituted or unsubstituted (C1-C10)alkyl, or a substituted or unsubstituted (C6-C25)aryl, more preferably, hydrogen or a substituted or unsubstituted (C6-C18)aryl. Specifically, $R_a$ may be hydrogen, or a substituted or unsubstituted phenyl, or a substituted or unsubstituted biphenyl, etc.

In one embodiment, $R_5$ and $R_6$ each independently represent hydrogen, a substituted or unsubstituted (C1-C30)alkyl, or a substituted or unsubstituted (C6-C30)aryl; or the adjacent $R_6$s may be linked to each other to form a ring, preferably may be hydrogen or a substituted or unsubstituted (C6-C25)aryl; or the adjacent $R_6$s may be linked to each other to form a substituted or unsubstituted (5- to 30-membered) mono- or polycyclic, alicyclic, aromatic ring or a combination thereof, more preferably, hydrogen or a substituted or unsubstituted (C6-C18)aryl; or the adjacent $R_6$s may be linked to each other to form a substituted or unsubstituted (5- to 25-membered) mono- or polycyclic, aromatic ring. Specifically, $R_5$ and $R_6$ each independently represent hydrogen or a substituted or unsubstituted phenyl; or the adjacent $R_6$s may be linked to each other to form a substituted or unsubstituted benzene ring.

According to one embodiment, in the compound represented by the formula 1 in that the ring A represents a benzene ring, when $L_1$ represent a single bond, $Ar_1$ represents a substituted or unsubstituted phenyl, a substituted or unsubstituted p-biphenyl, a substituted or unsubstituted o-terphenyl, a substituted or unsubstituted dibenzofuran, a substituted or unsubstituted dibenzothiophene, a substituted or unsubstituted quinoxaline, or a substituted or unsubstituted benzoquinoxaline; with the proviso that the compounds represented by the following formulas 2 to 4 are excluded.

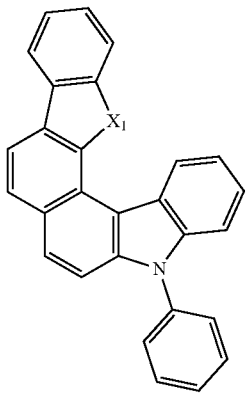

(2)

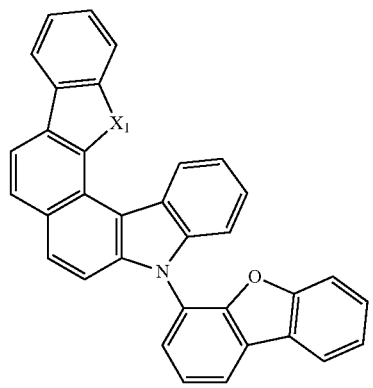

(3)

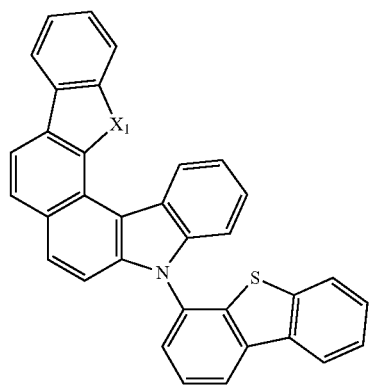

(4)

In the formulas 2 to 4, $X_1$ represents —C(CH$_3$)$_2$—, —CPh, —O—, or —S—.

The compound represented by the formula 1 above according to one embodiment may be represented by any one of the following formulas 1-1 to 1-11.

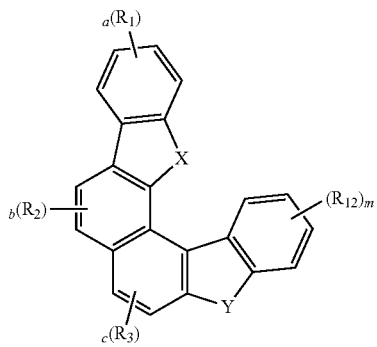

(1-1)

-continued
(1-2)
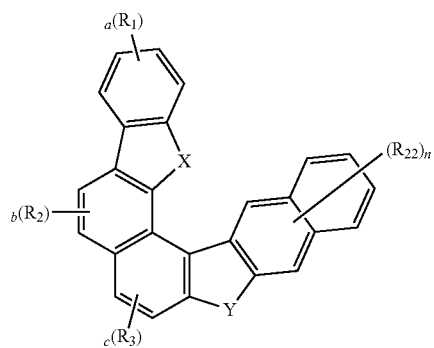
(1-3)
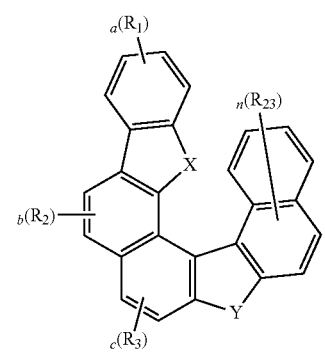
(1-4)
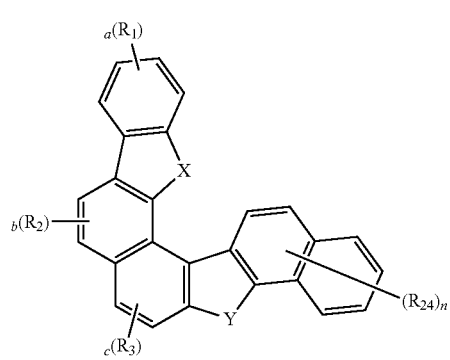
(1-5)
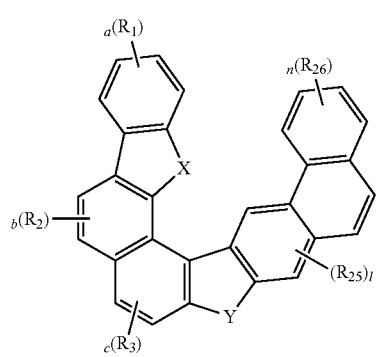
(1-6)
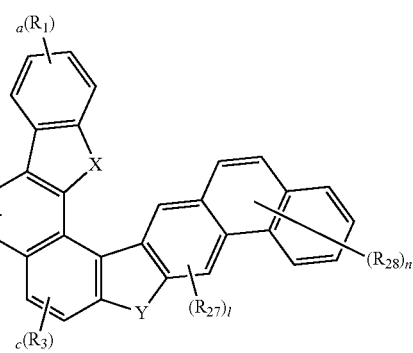
(1-7)
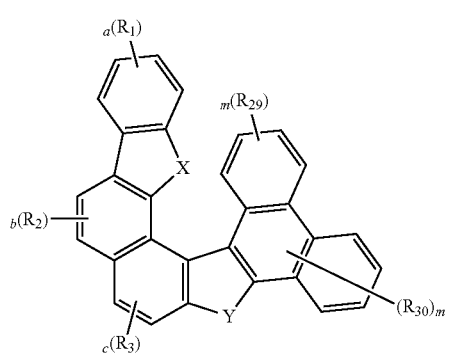
(1-8)
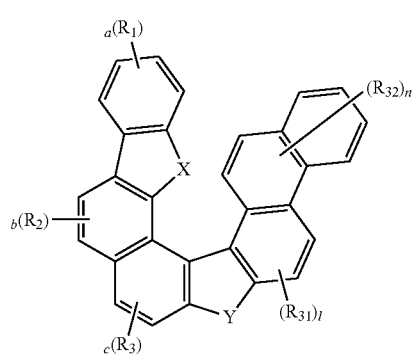
(1-9)
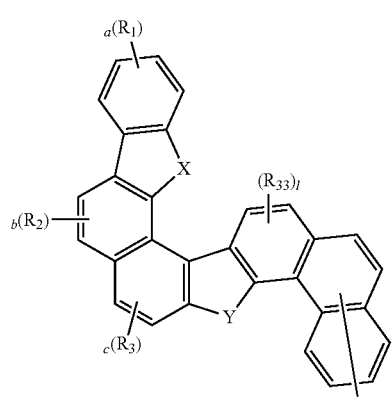

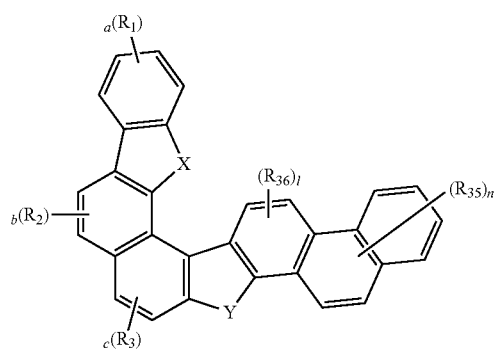

(1-10)

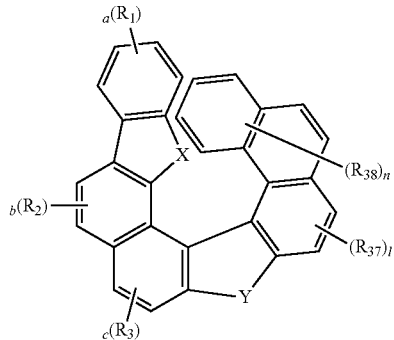

(1-11)

In formulas 1-1 to 1-11, $R_1$ to $R_3$, X, Y, and a to c are as defined in the formula 1;
$R_{21}$ to $R_{38}$ each independently are as defined as $R_4$ in the formula 1;
m represents an integer of 1 to 4, n represents an integer of 1 to 6, l represents an integer of 1 or 2, when m, n, and l represent an integer of 2 or more, each of $R_{21}$ to $R_{38}$ may be the same or different.

In the compound represented by the formula 1-1 above according to one embodiment, Y represents N-$L_1$-$(Ar_1)_e$; $L_1$ represents a single bond, a substituted or unsubstituted (C6-C18)arylene, or a substituted or unsubstituted (5- to 18-membered)heteroarylene; $Ar_1$ may be any one selected from a substituted or unsubstituted (C6-C18)aryl, a substituted or unsubstituted dibenzofuran, a substituted or unsubstituted dibenzothiophene, a substituted or unsubstituted di(C6-C18)arylamino, or the formulas A and B, preferably $Ar_1$ may be a substituted or unsubstituted phenyl, a substituted or unsubstituted m-biphenyl, a substituted or unsubstituted p-biphenyl, a substituted or unsubstituted o-terphenyl, a substituted or unsubstituted pyridyl, a substituted or unsubstituted pyrimidinyl, a substituted or unsubstituted triazinyl, a substituted or unsubstituted quinazolinyl, a substituted or unsubstituted quinoxalinyl, a substituted or unsubstituted benzoquinoxalinyl, a substituted or unsubstituted dibenzofuranyl, a substituted or unsubstituted dibenzothiophenyl, or amino substituted with at least two of phenyl, biphenyl, and dimethylfluorenyl. When $L_1$ represents a single bond, $Ar_1$ represents substituted or unsubstituted phenyl (the compound of formula 2 is excluded), a substituted or unsubstituted p-biphenyl, a substituted or unsubstituted o-terphenyl, a substituted or unsubstituted dibenzofuranyl (the compound of formula 3 is excluded), a substituted or unsubstituted dibenzothiophenyl (the compound of formula 4 is excluded), a substituted or unsubstituted quinoxalinyl, or a substituted or unsubstituted benzoquinoxalinyl.

In the compound represented by the formula 1-1 above according to one embodiment, Y represents O, S, $CR_{11}R_{12}$, or $SiR_{13}R_{14}$, at least one of $R_1$ to $R_3$ and $R_{21}$ represents *-$L_1$-$(Ar_1)_e$; $L_1$ represents a single bond or a substituted or unsubstituted (C6-C18)arylene; $Ar_1$ may be a substituted or unsubstituted nitrogen-containing (5- to 18-membered)heteroaryl or a substituted or unsubstituted di(C6-C30)arylamino, preferably $Ar_1$ may be a substituted or unsubstituted pyrimidyl, a substituted or unsubstituted triazinyl, a substituted or unsubstituted quinoxalinyl, or amino substituted with at least two of phenyl, biphenyl, and dimethylfluorenyl.

In the compound represented by the formulas 1-2 to 1-11 above according to one embodiment, X and Y each independently represent O, S, or $NR_{15}$; at least one of $R_1$ to $R_3$, $R_{15}$, and $R_{22}$ to $R_{38}$ represents *-$L_1$-$(Ar_1)_e$; $L_1$ represents a single bond or a substituted or unsubstituted (C6-C18) arylene; $Ar_1$ may be a substituted or unsubstituted nitrogen-containing (5- to 18-membered)heteroaryl or a substituted or unsubstituted di(C6-C30)arylamino, preferably $Ar_1$ may be a substituted or unsubstituted o-terphenyl, a substituted or unsubstituted triazinyl, a substituted or unsubstituted quinazolinyl, a substituted or unsubstituted quinoxalinyl, or amino substituted with at least two of phenyl and biphenyl.

According to one embodiment, the organic electroluminescent compound represented by formula 1 above may be more specifically illustrated by the following compounds, but is not limited thereto.

C-1

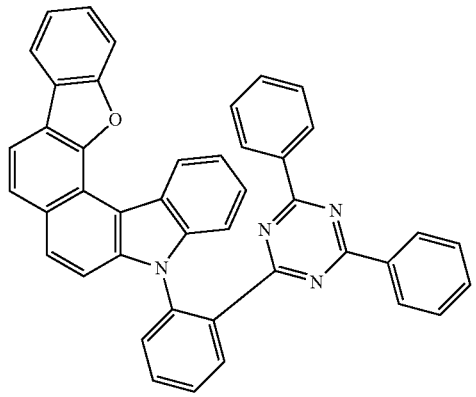

C-2

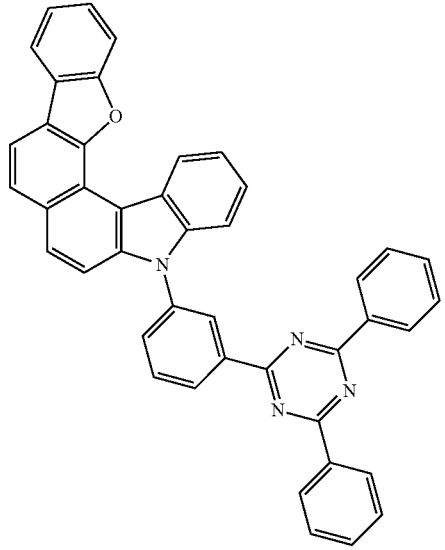

C-3
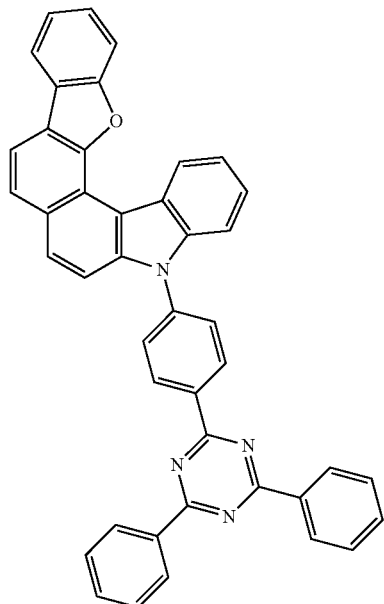
C-6
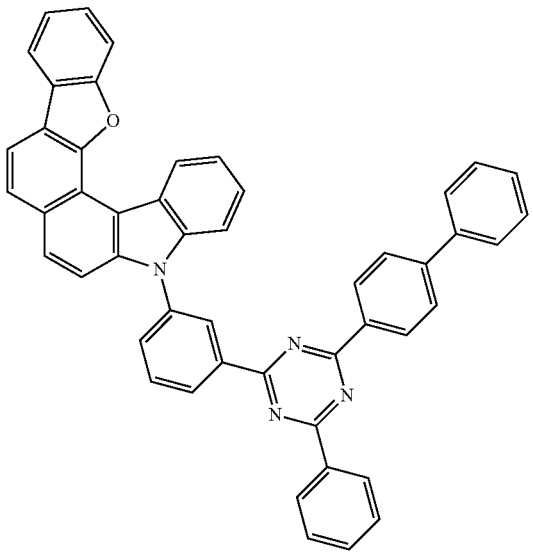
C-4
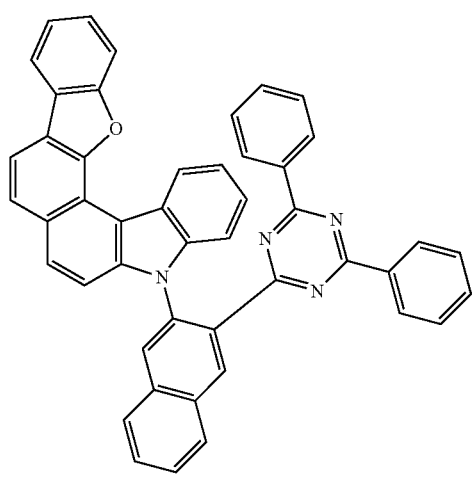
C-7
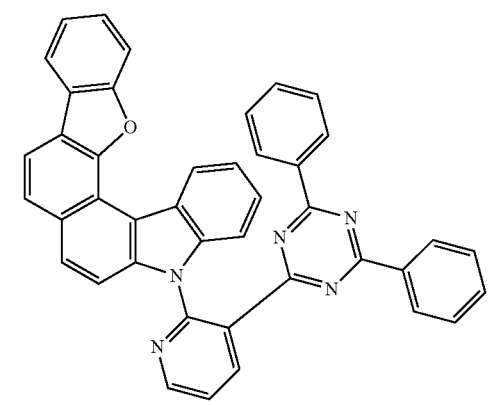
C-5
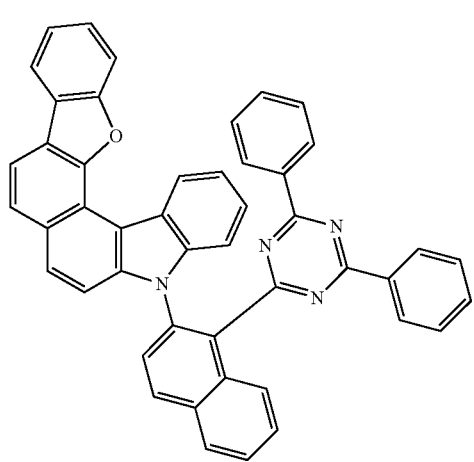
C-8
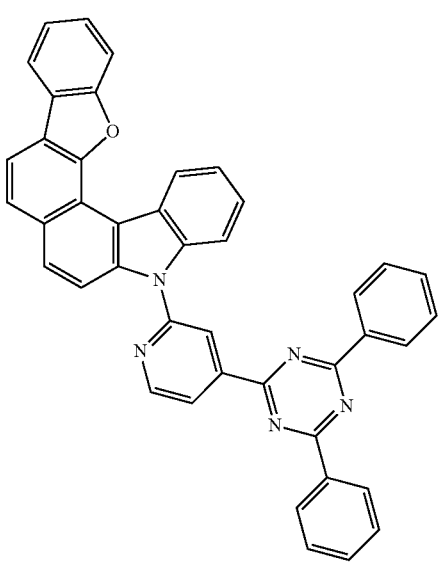

C-9
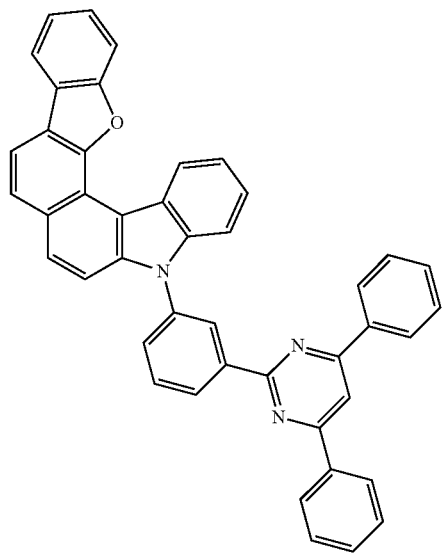
C-10
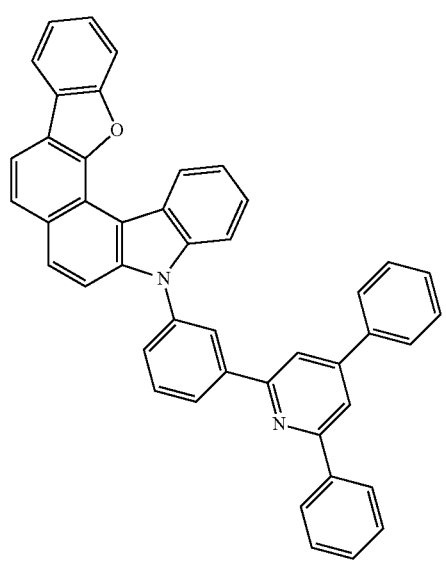
C-11
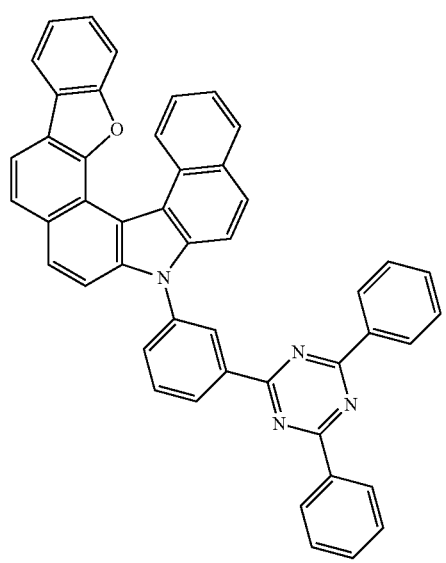
C-12
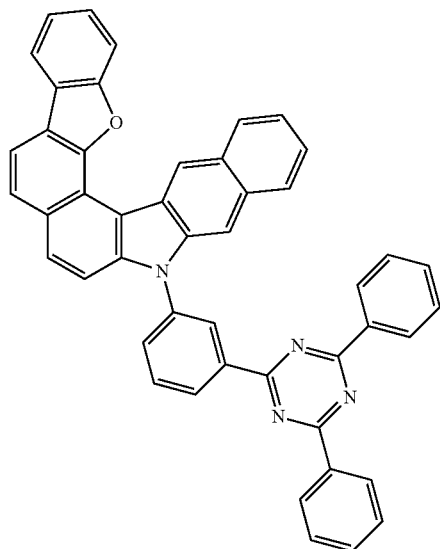
C-13
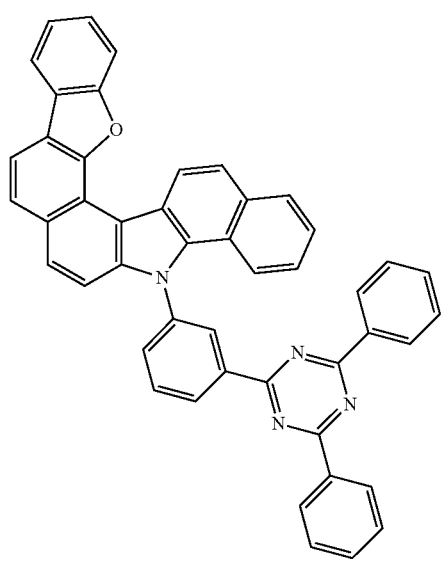
C-14
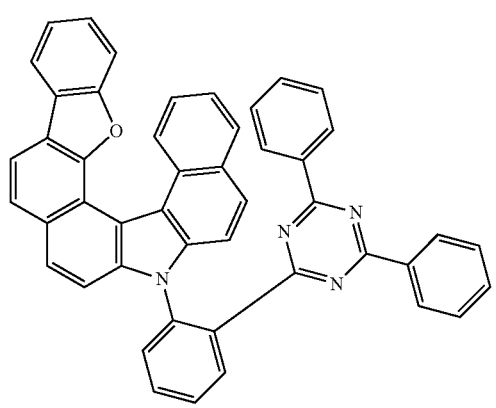

-continued
C-15
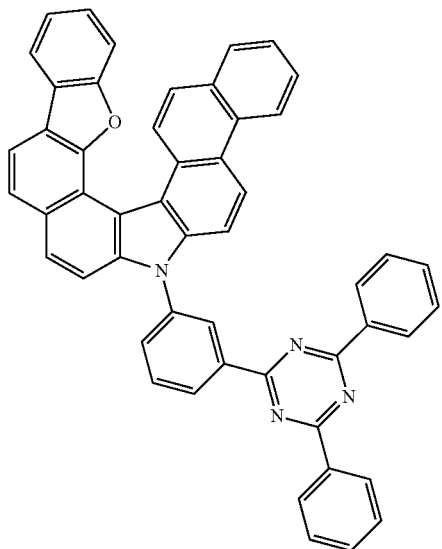
C-16
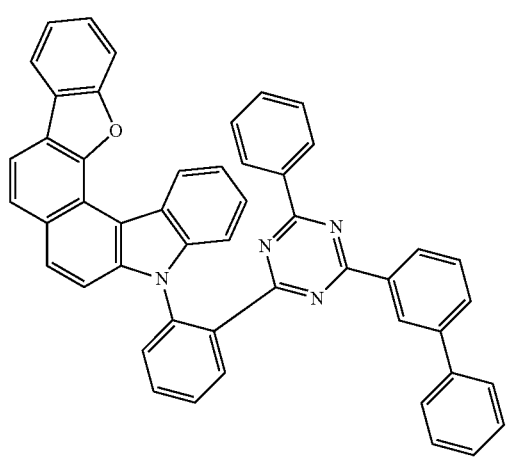
C-17
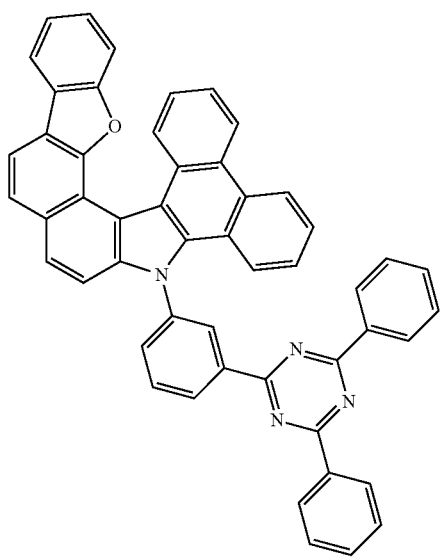
-continued
C-18
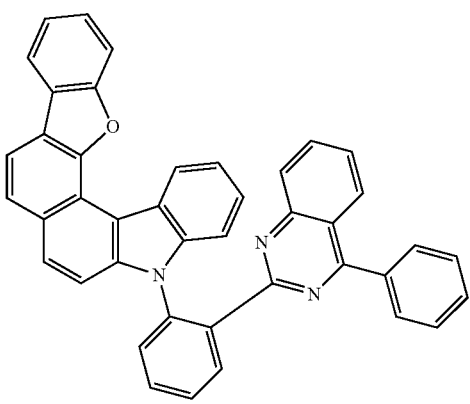
C-19
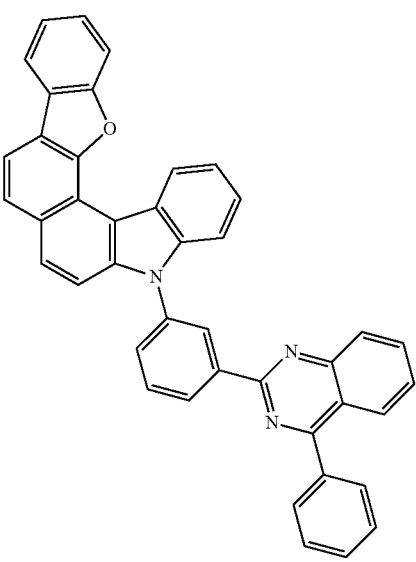
C-20
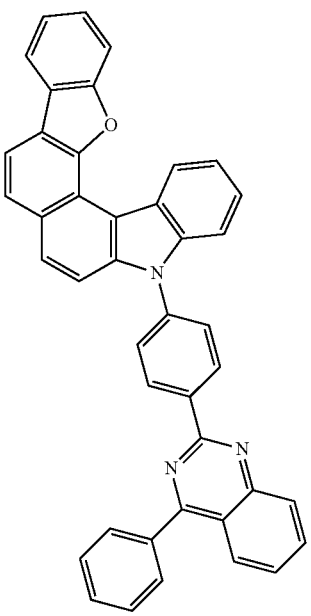

-continued
C-21
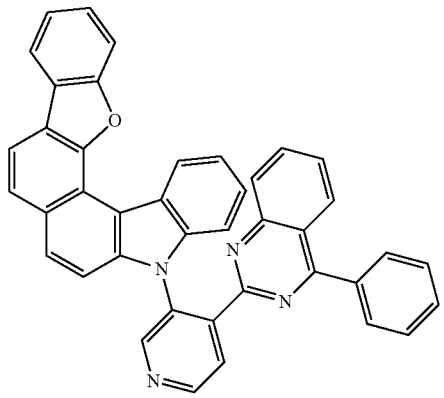
C-22
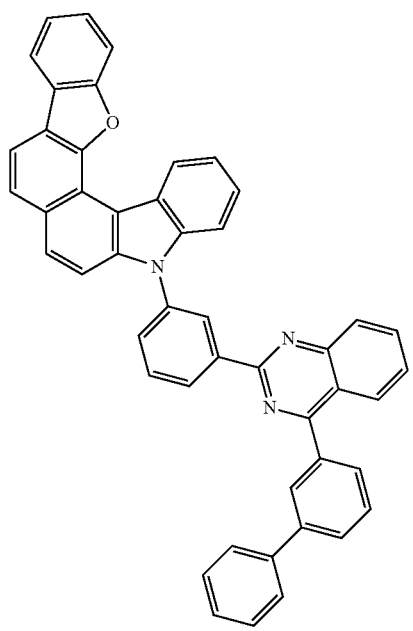
C-23
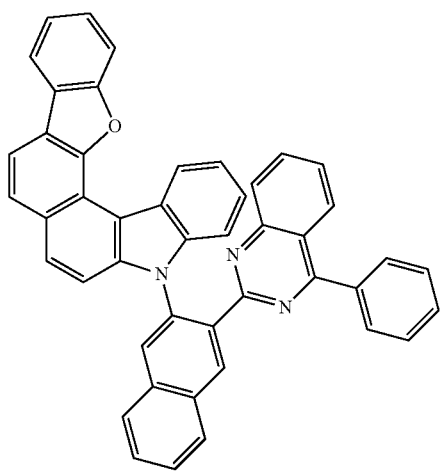
-continued
C-24
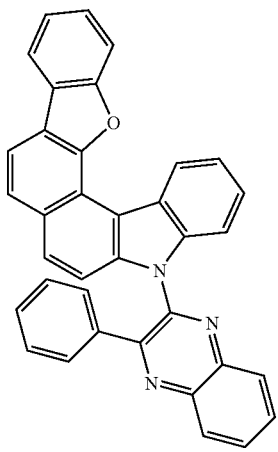
C-25
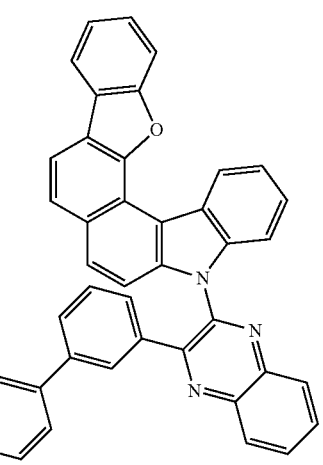
C-26
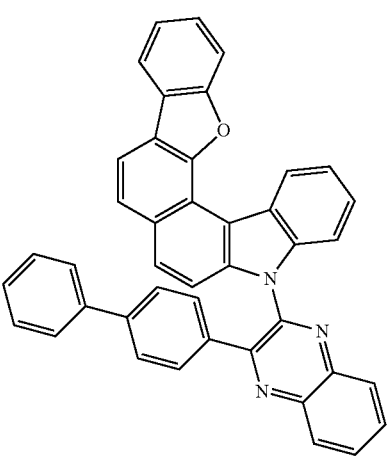

C-27
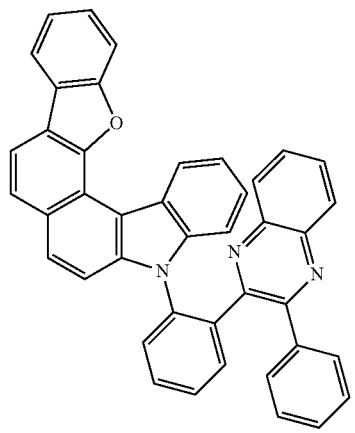
C-28
C-29
C-30
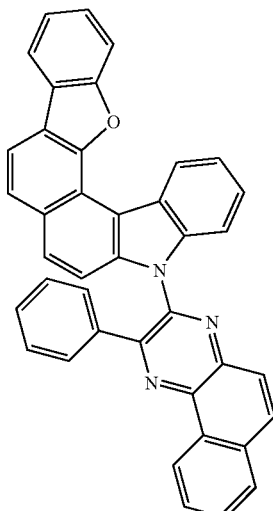
C-31
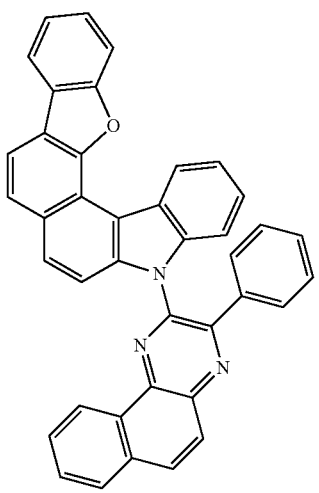
C-32
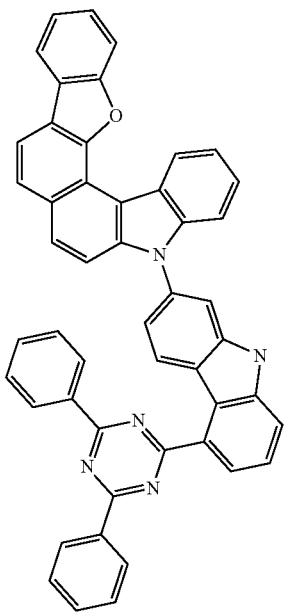

C-33
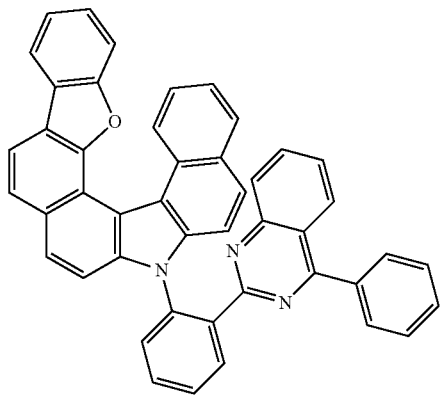
C-34
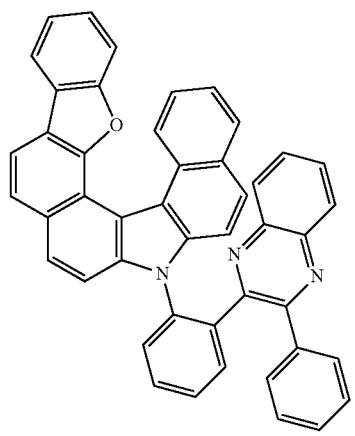
C-35
C-36
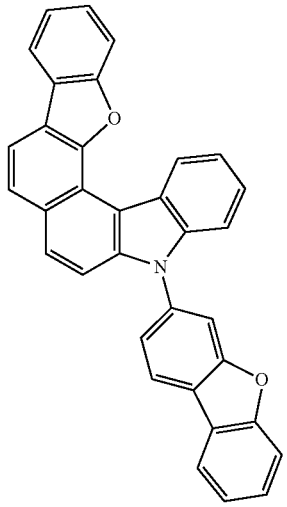
C-37
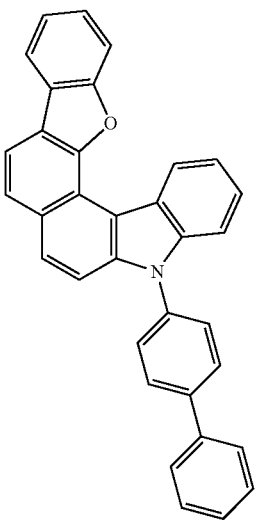
C-38
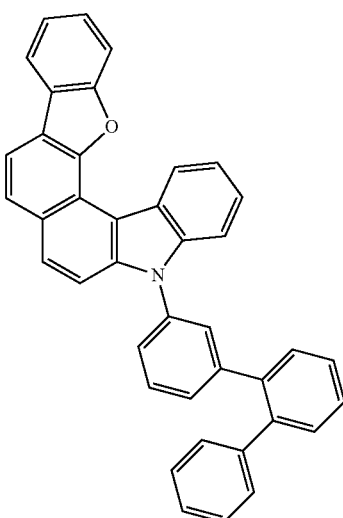

-continued
C-39
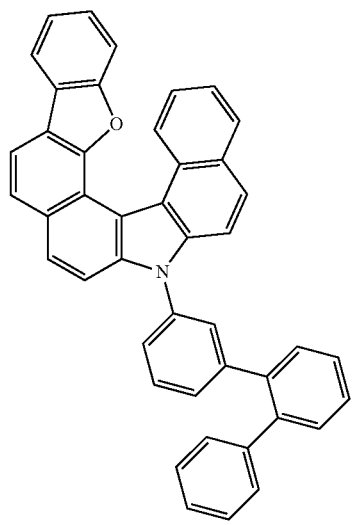
C-40
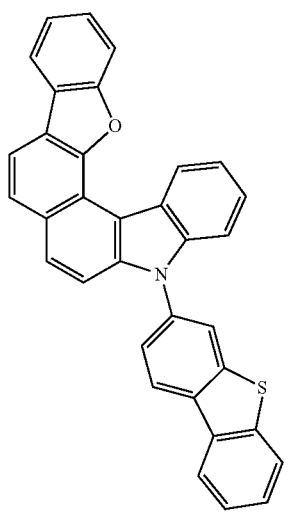
C-41
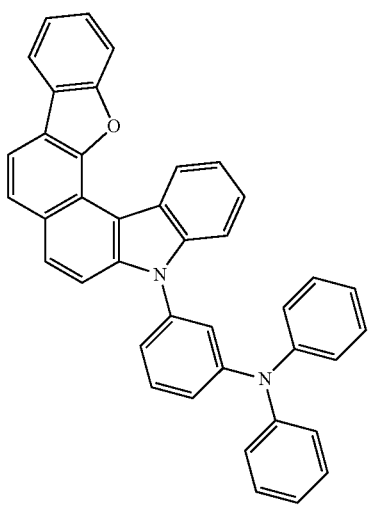
-continued
C-42
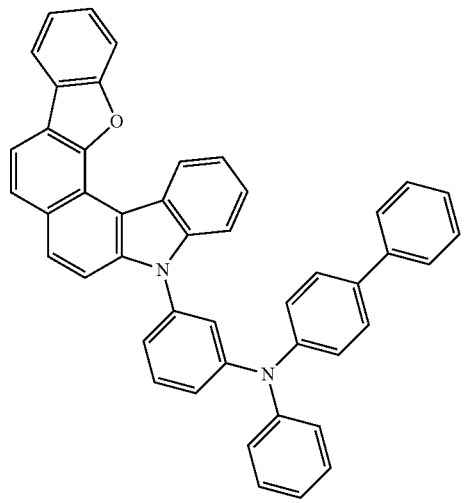
C-43
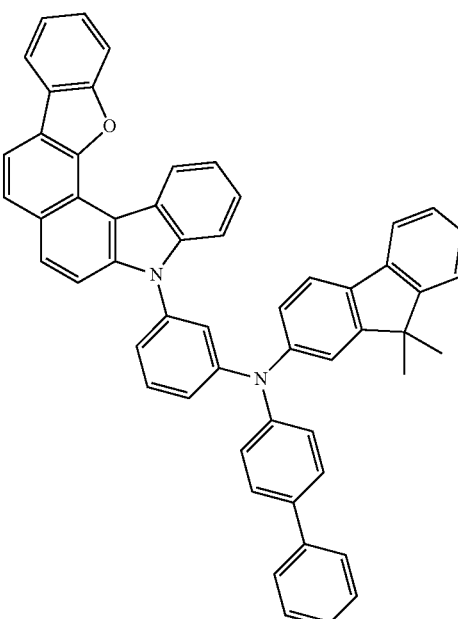
C-44
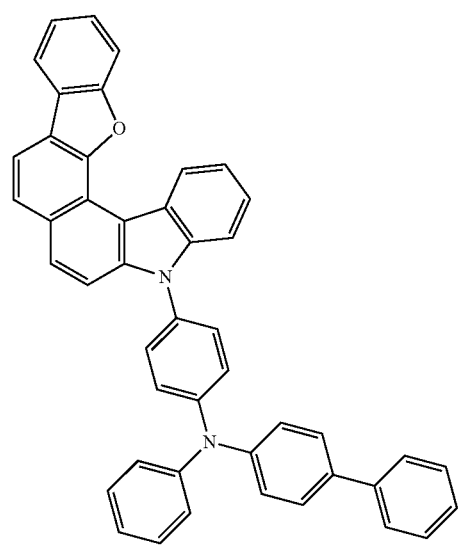

C-45
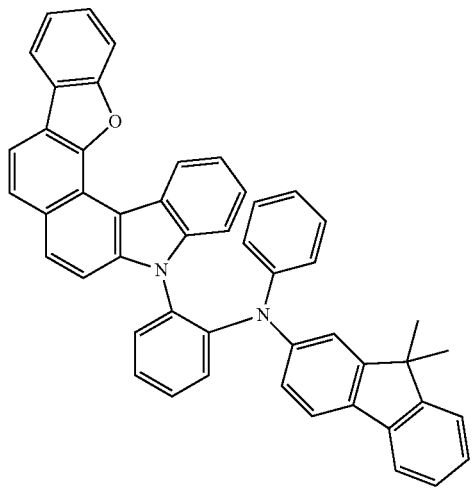
C-46
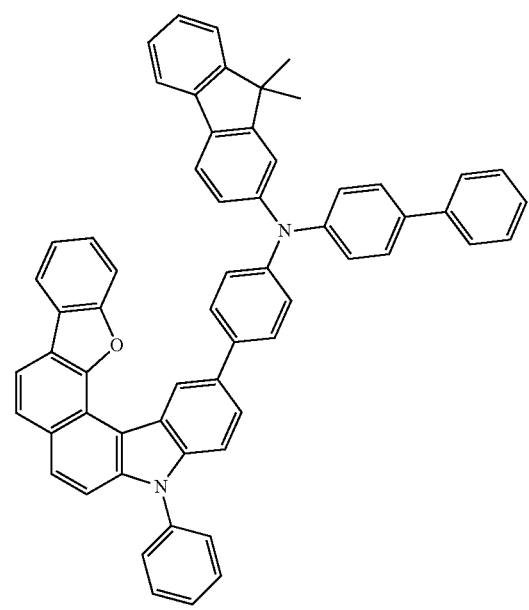
C-47
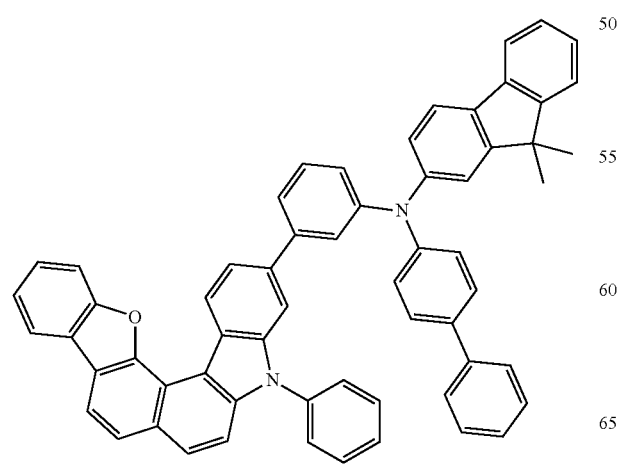
C-48
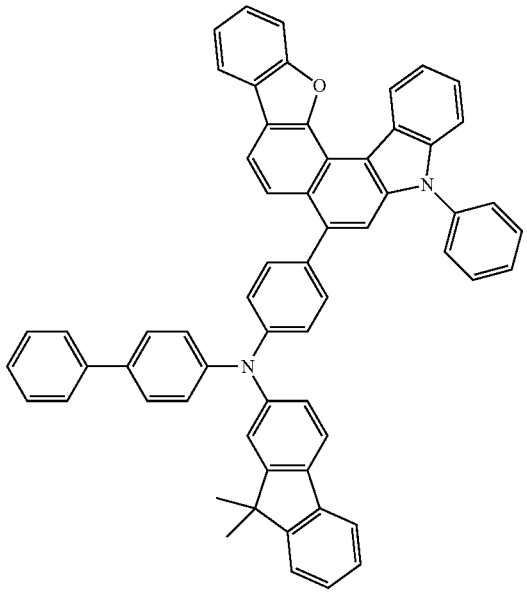
C-49
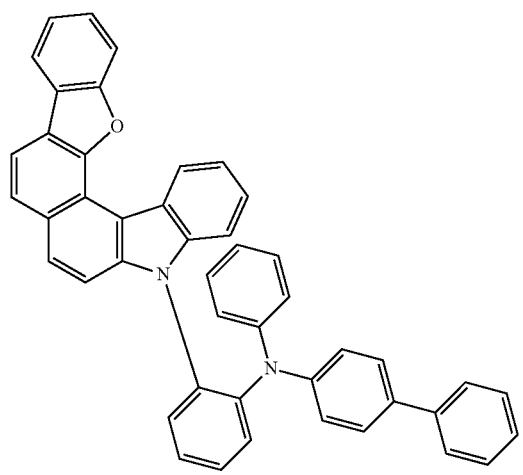
C-50
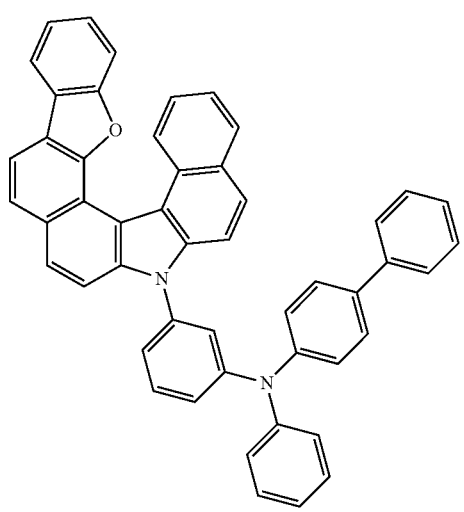

-continued
C-51
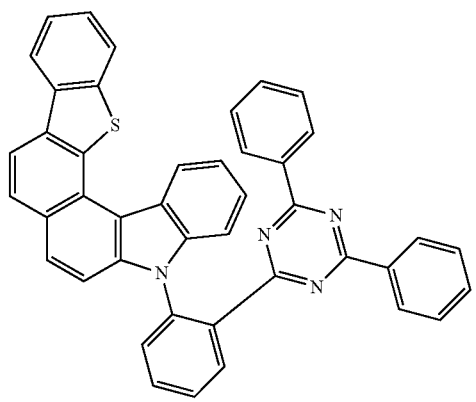
C-52
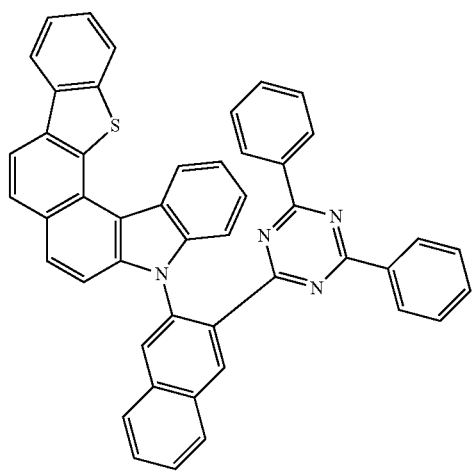
C-53
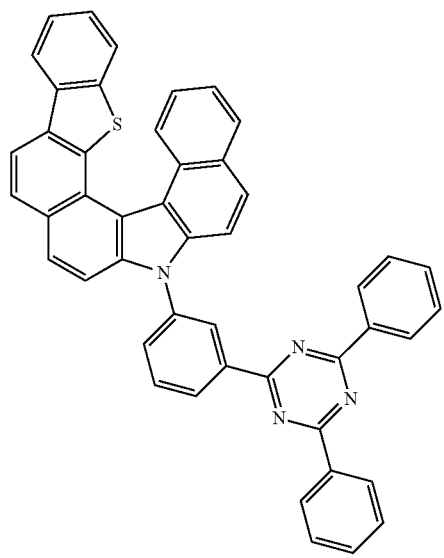
-continued
C-54
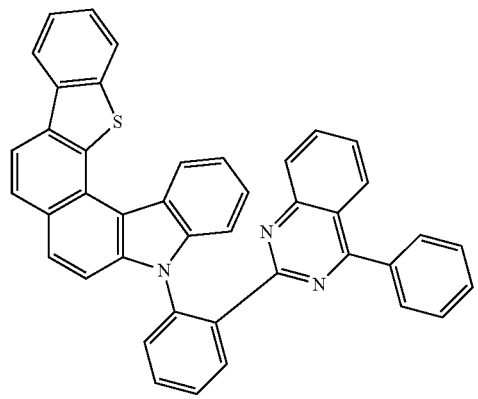
C-55
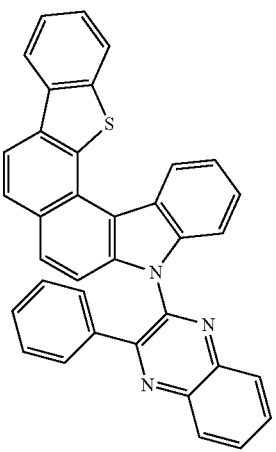
C-56
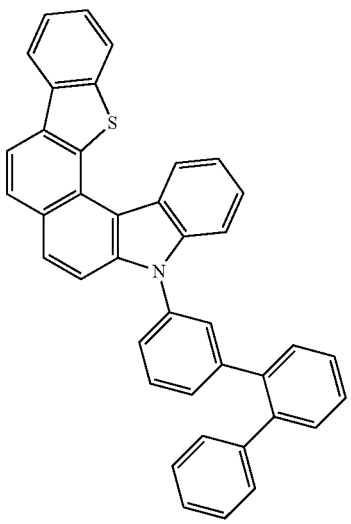

-continued
C-57
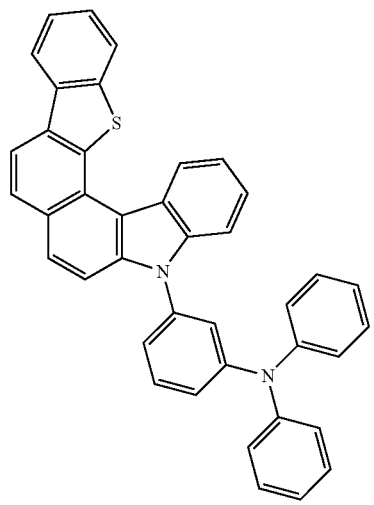
C-58
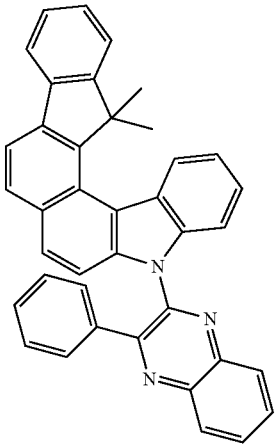
C-59
-continued
C-60
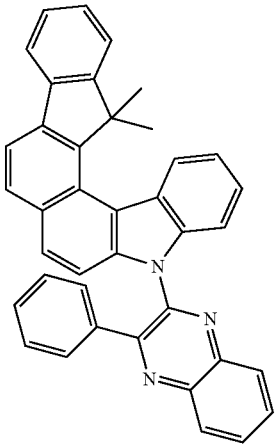
C-61
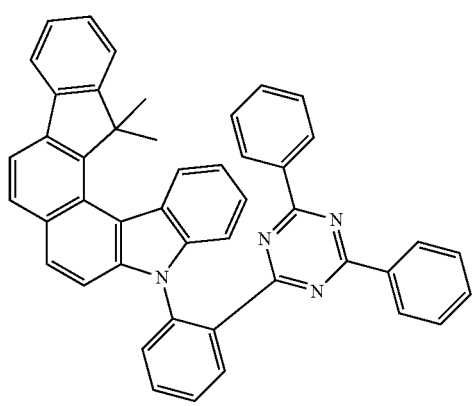
C-62
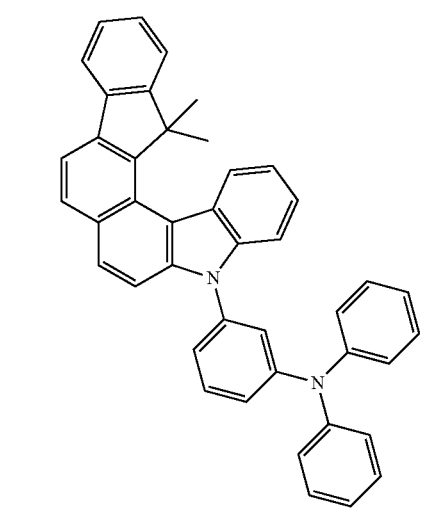

C-63
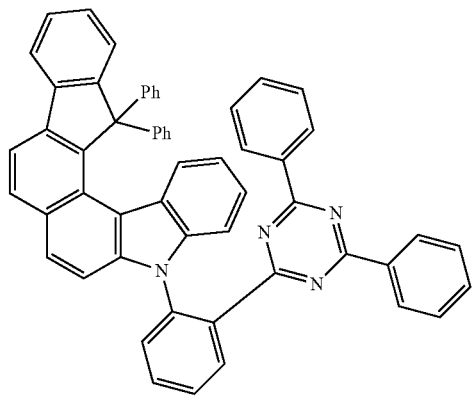
C-66
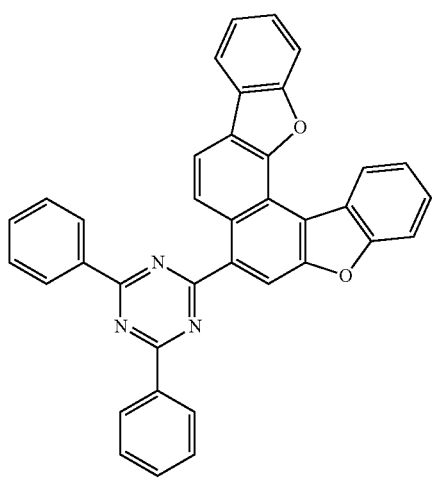
C-64
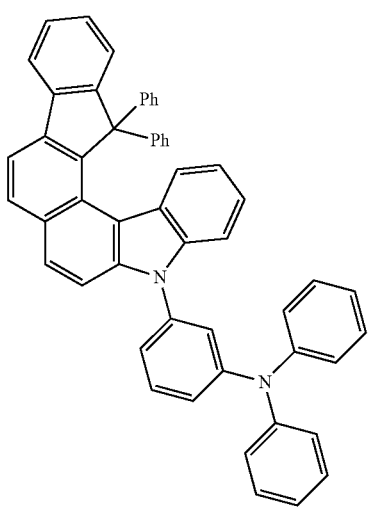
C-67
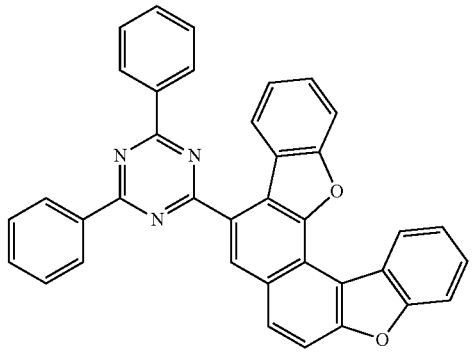
C-68
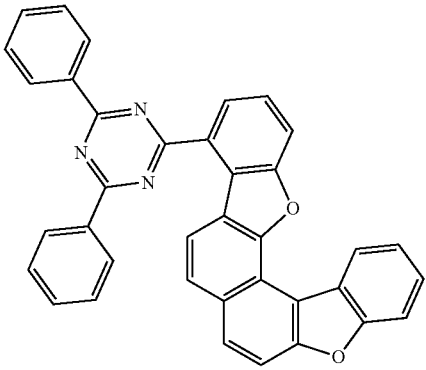
C-65
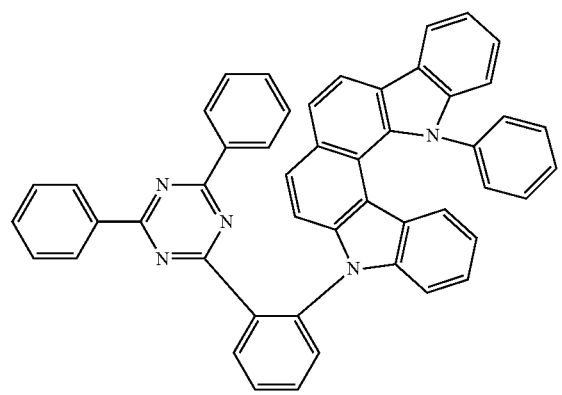
C-69

C-70
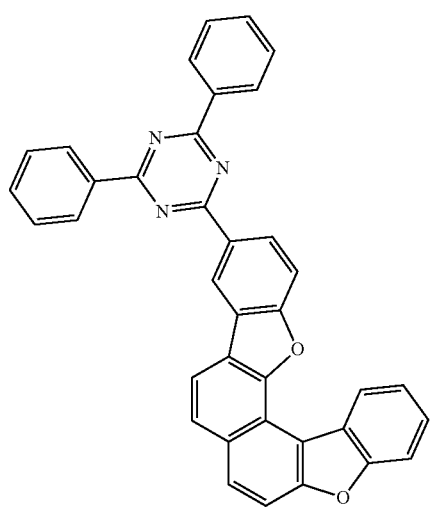
C-71
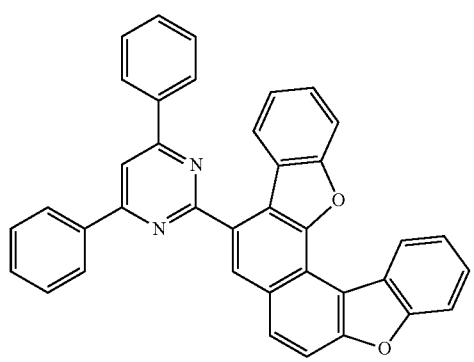
C-72
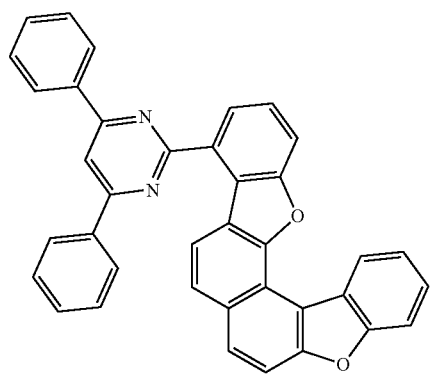
C-73
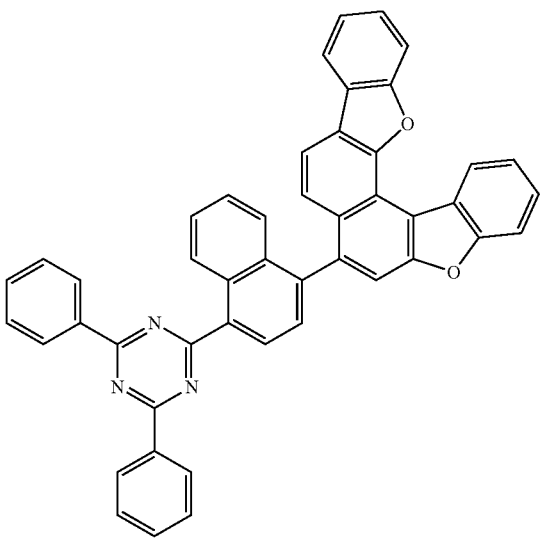
C-74
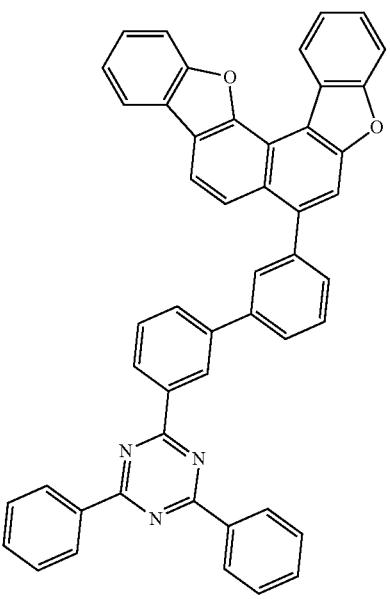

C-75
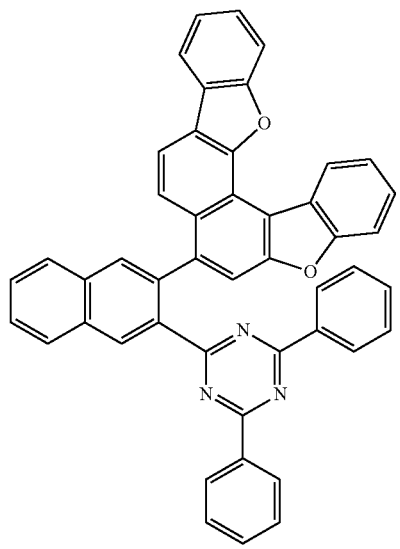
C-76
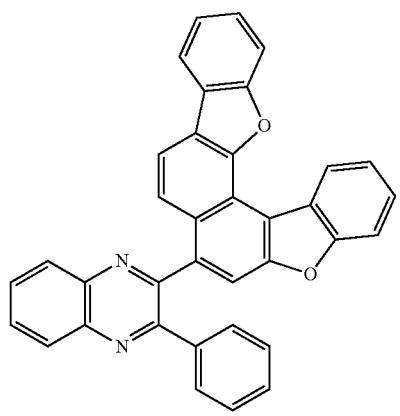
C-77
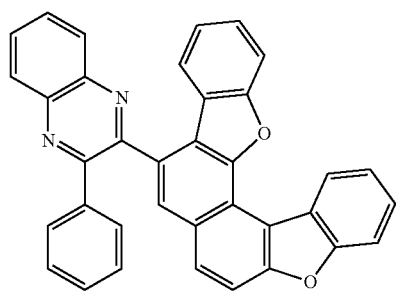
C-78
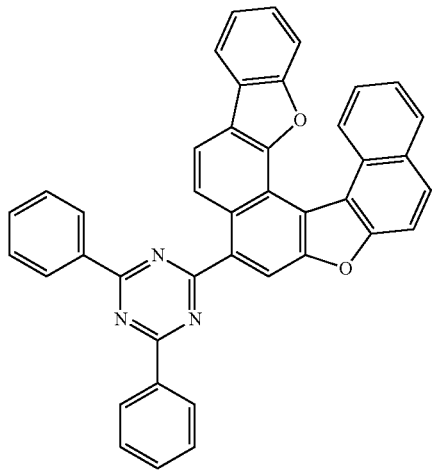
C-79
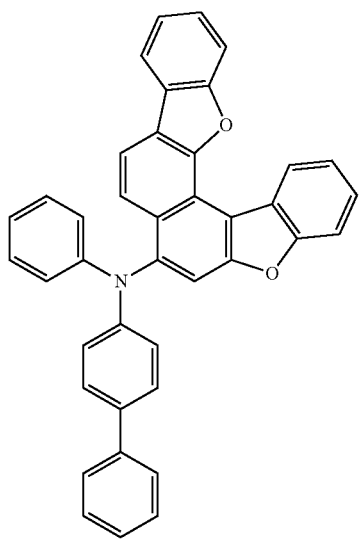
C-80
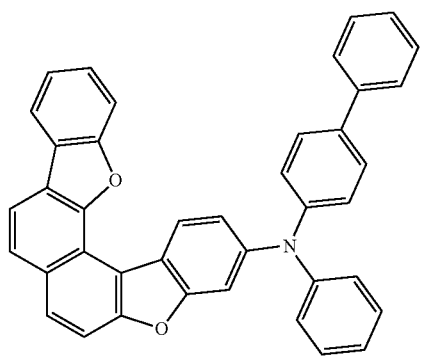

-continued
C-81
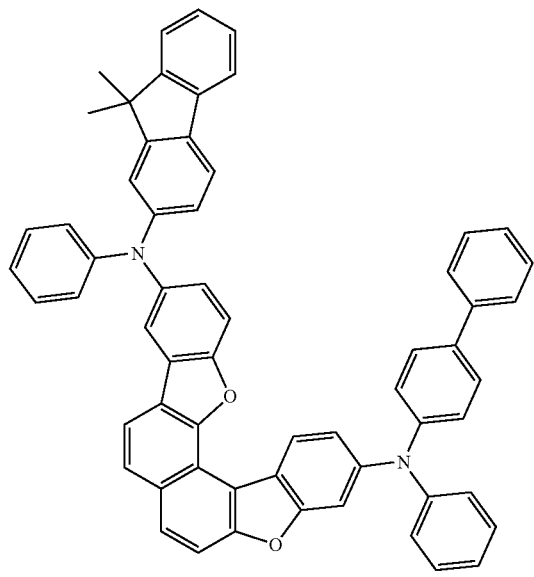
C-82
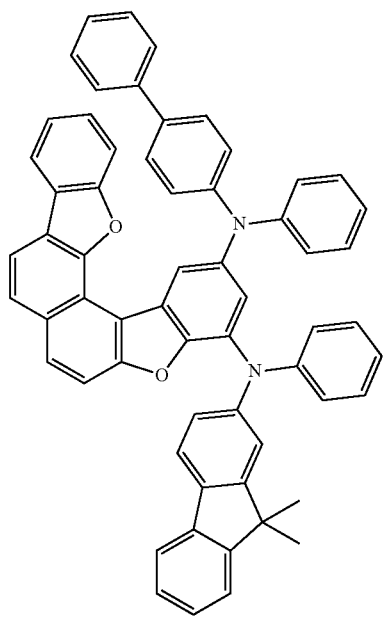
C-83
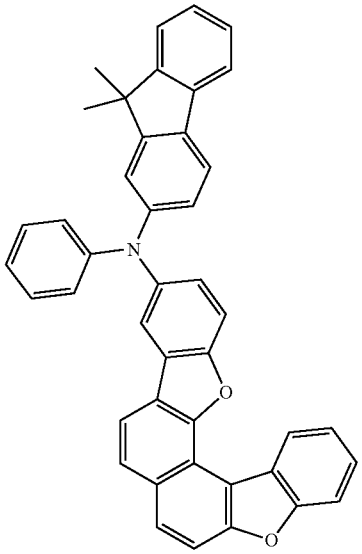
C-84
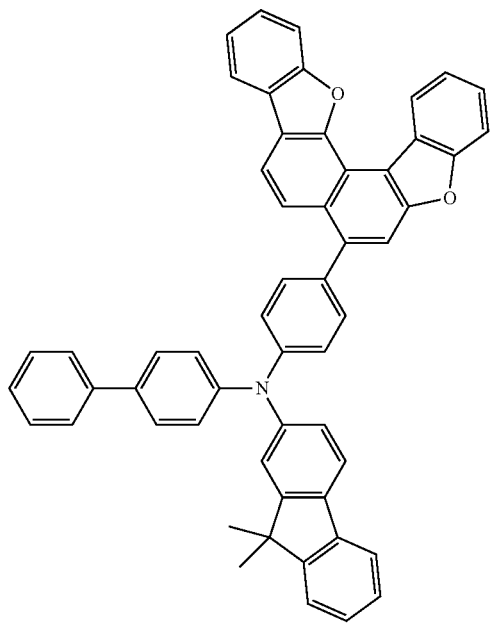
C-85
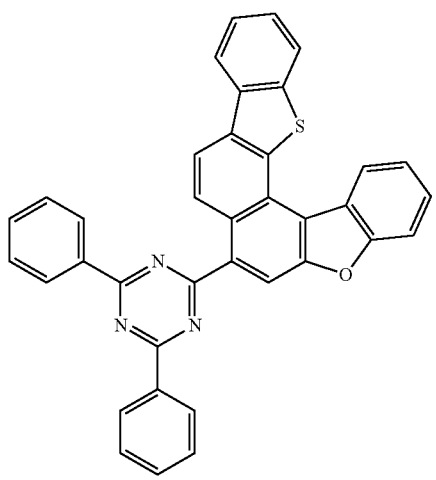

C-86
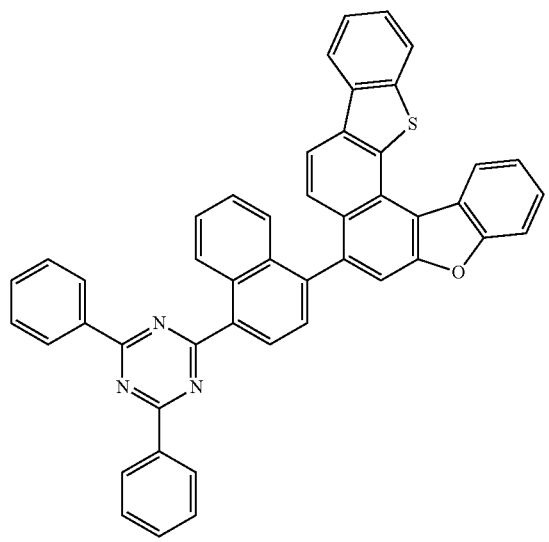
C-87
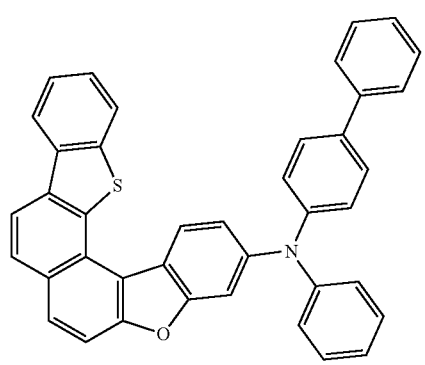
C-88
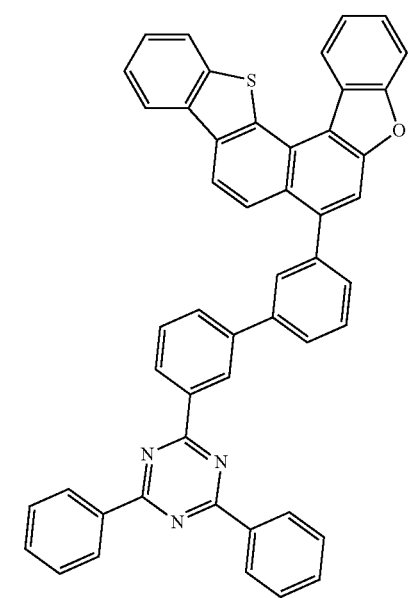
C-89
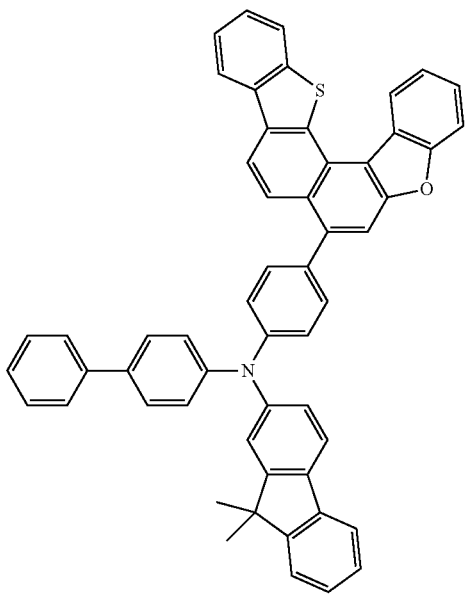
C-90
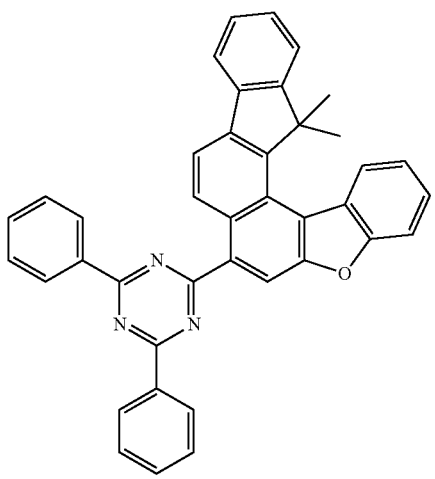
C-91
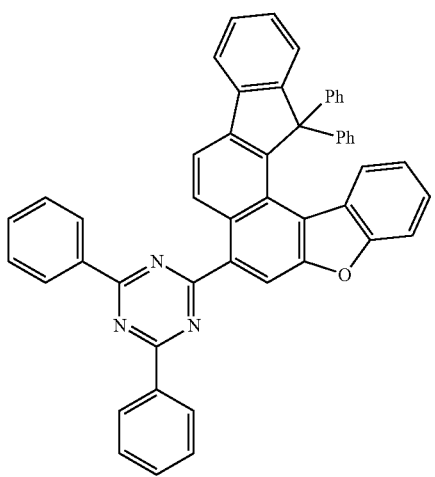

-continued
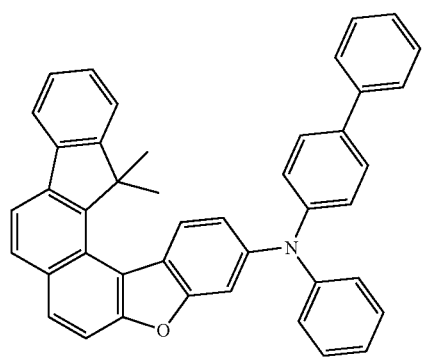
C-92
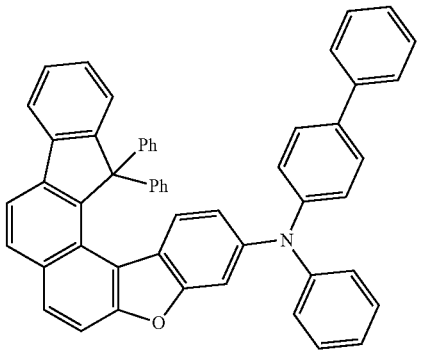
C-95
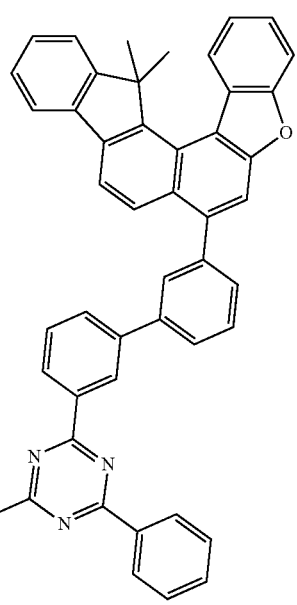
C-93
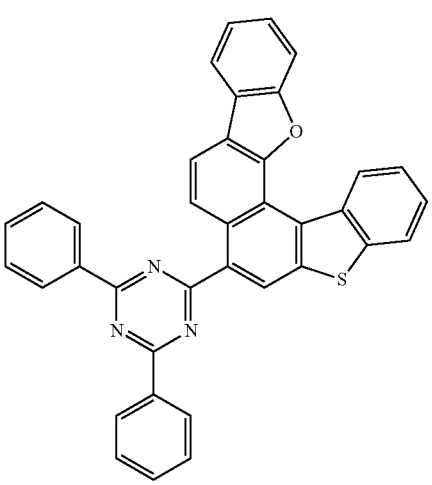
C-96
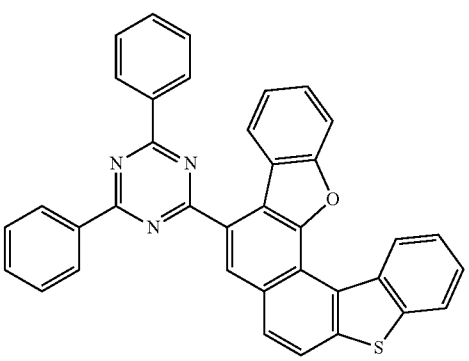
C-97
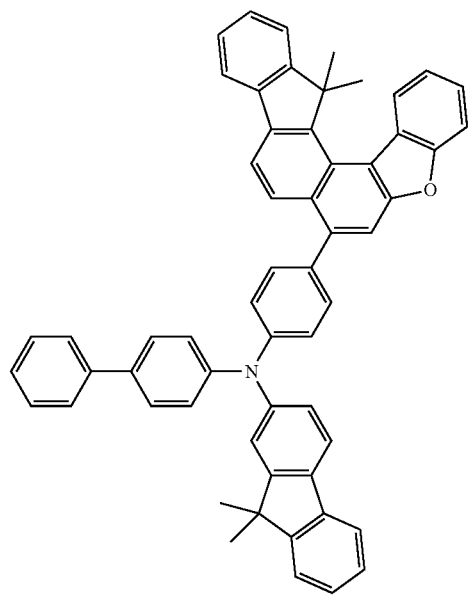
C-94
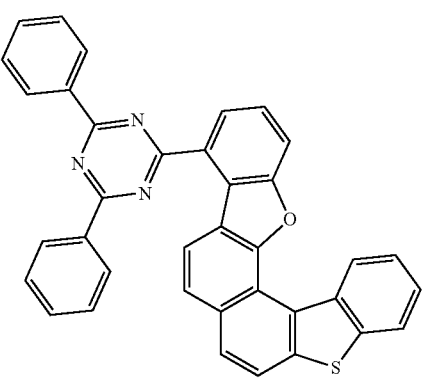
C-98

C-99
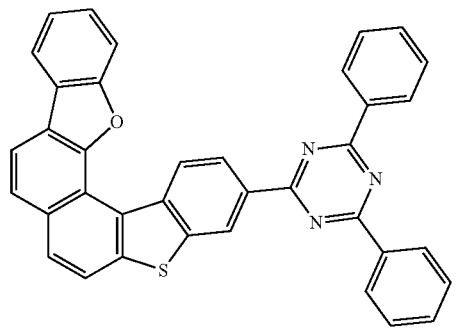
C-100
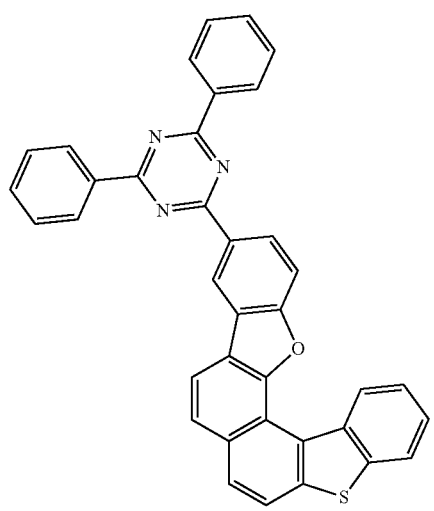
C-101
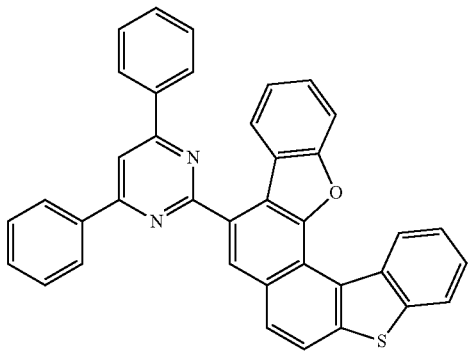
C-102
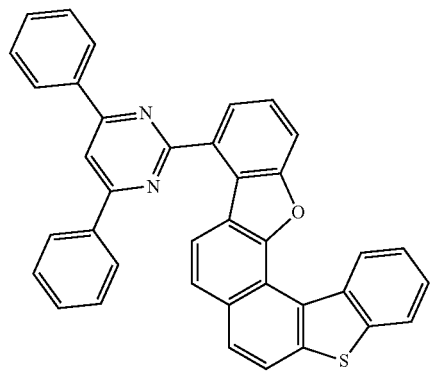
C-103
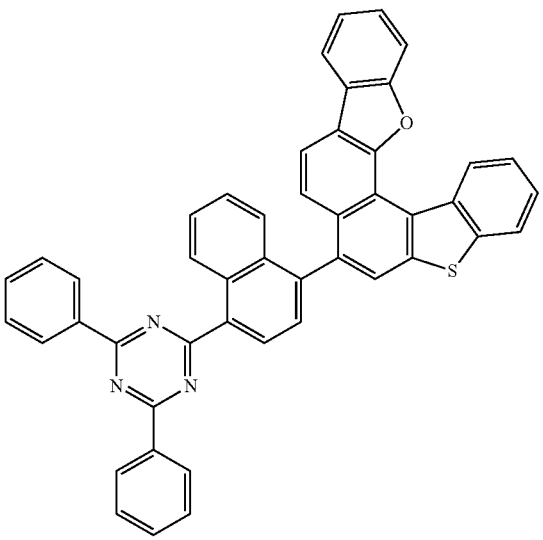
C-104
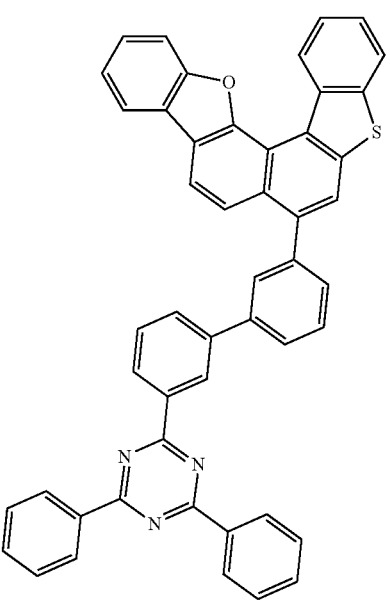

C-105
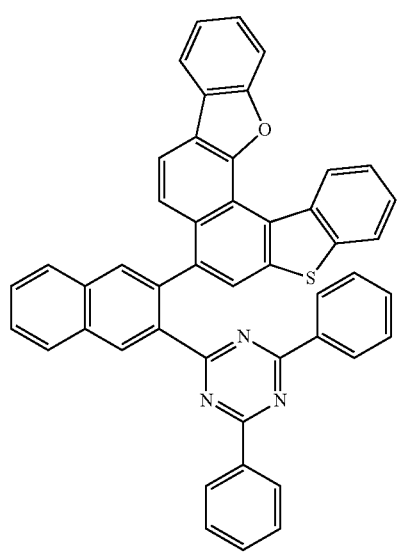
C-106
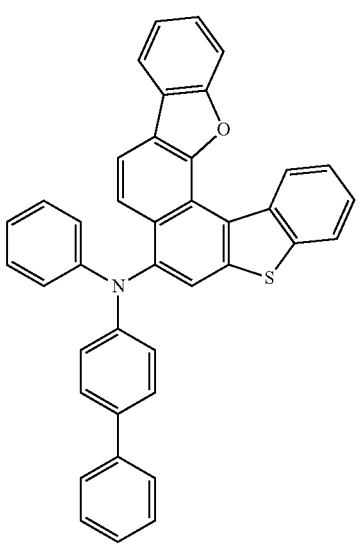
C-107
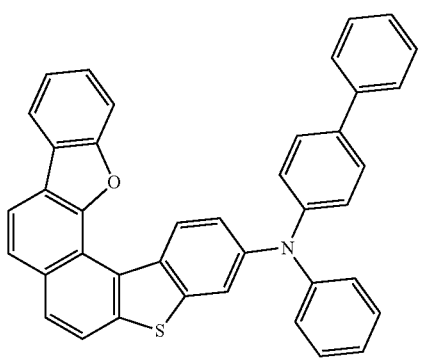
C-108
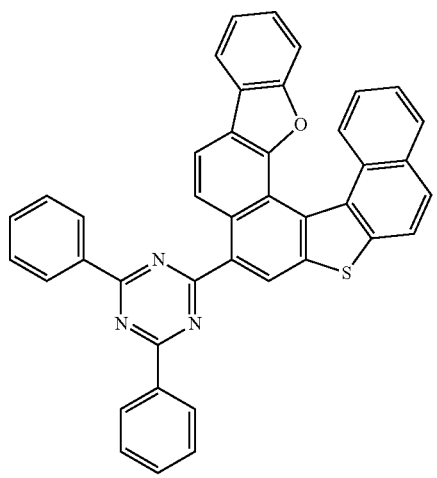
C-109
C-110

C-111
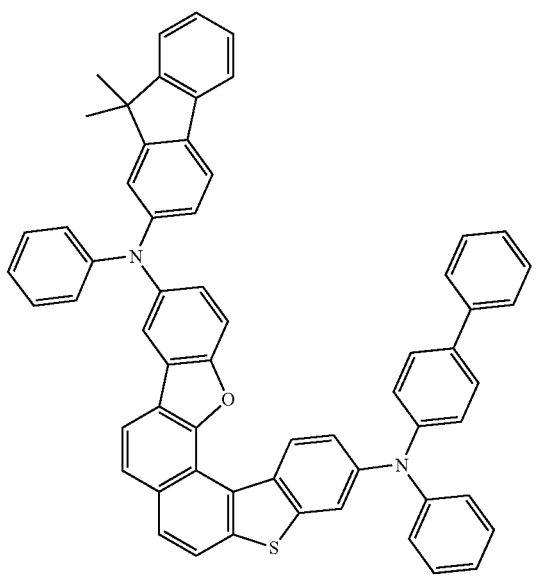
C-112
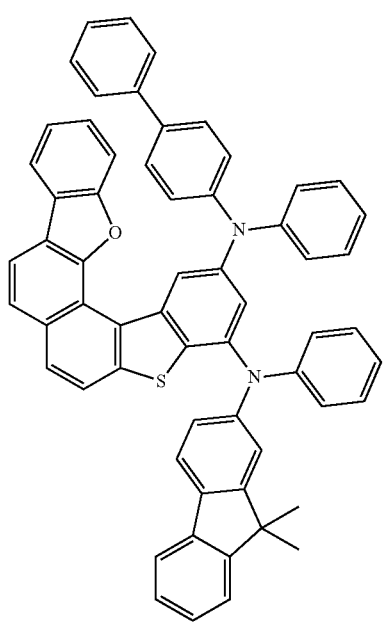
C-113
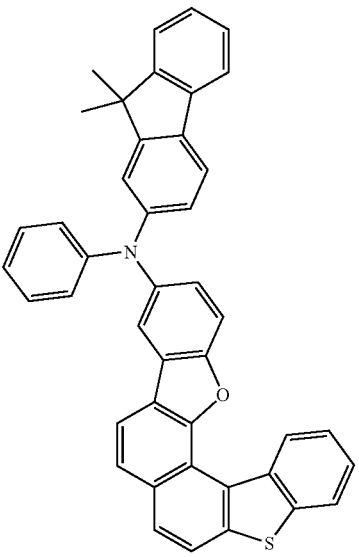
C-114
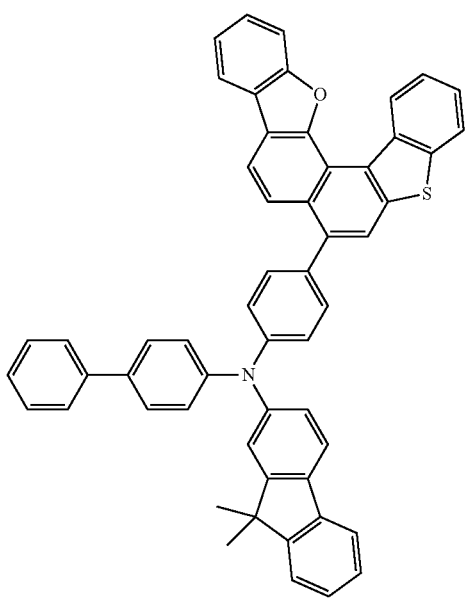
C-115
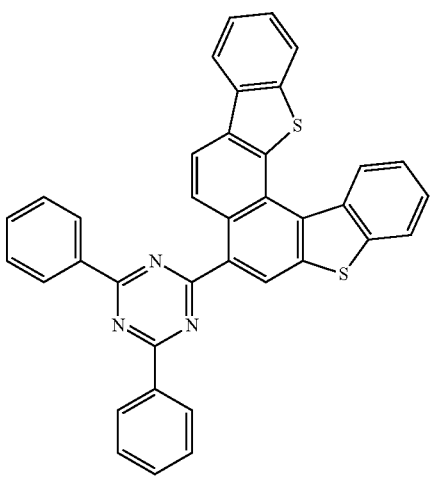

C-116
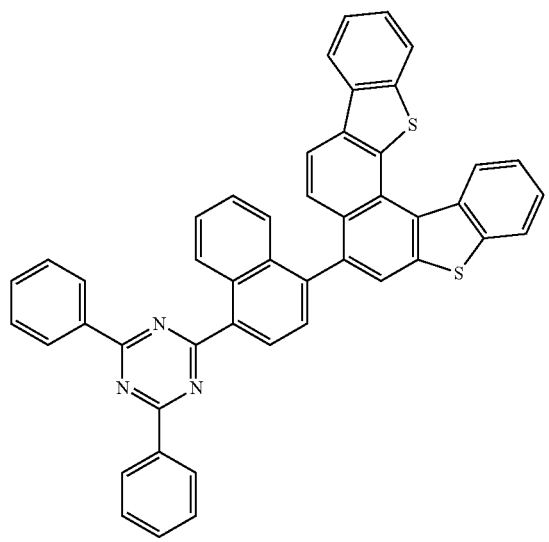
C-117
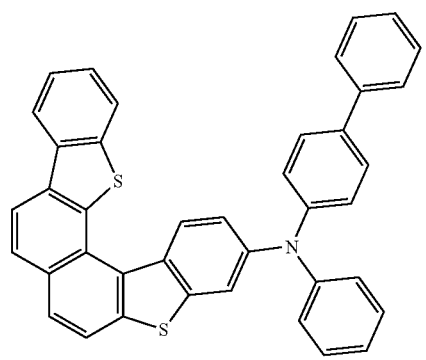
C-118
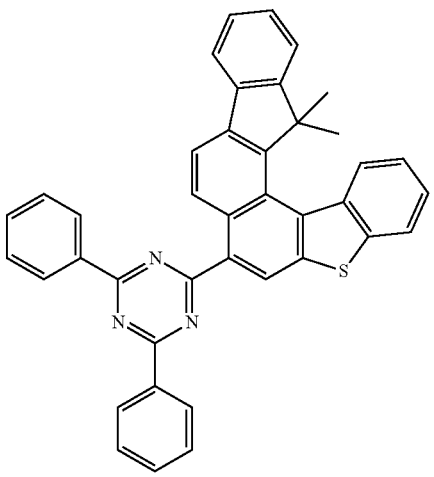
C-119
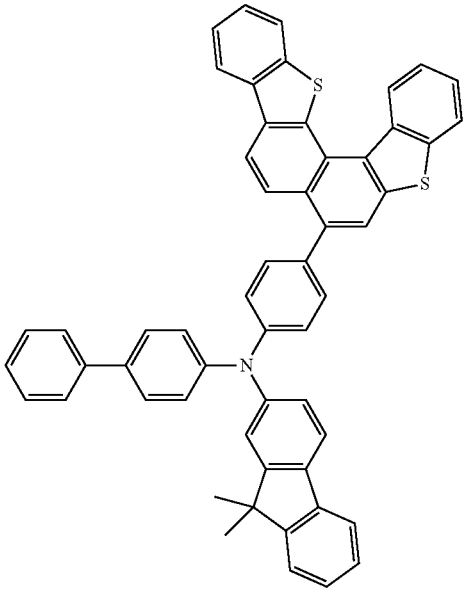
C-120
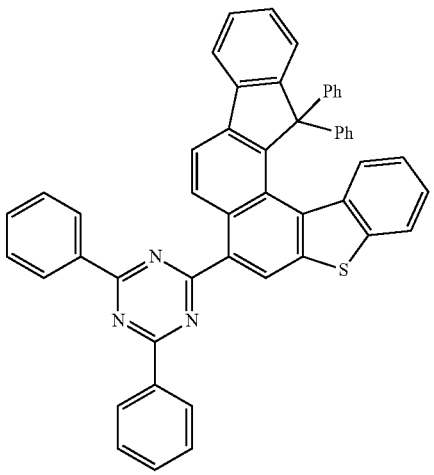
C-121

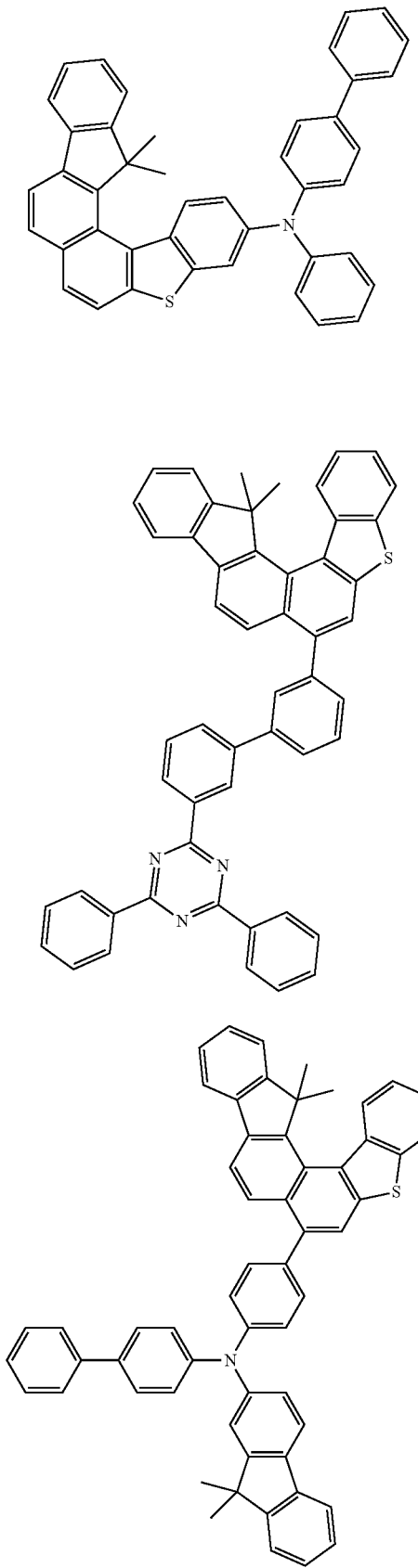
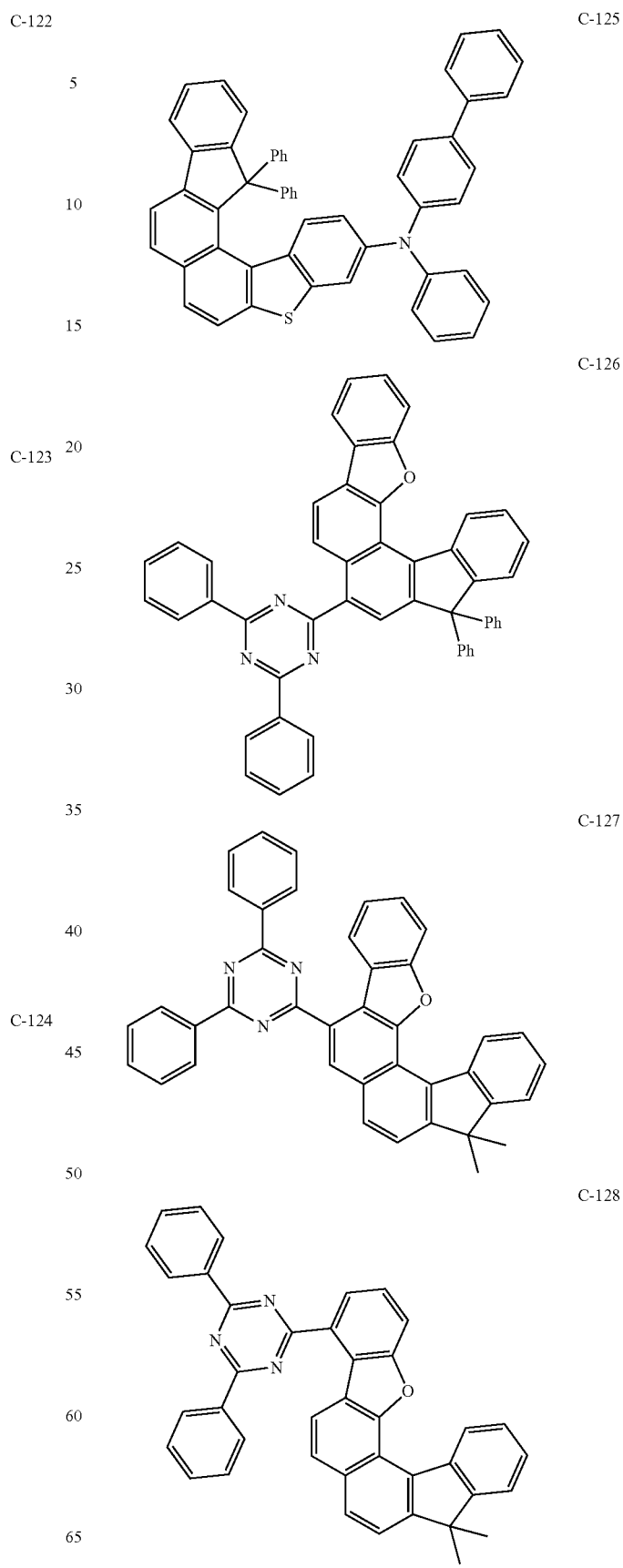

C-129
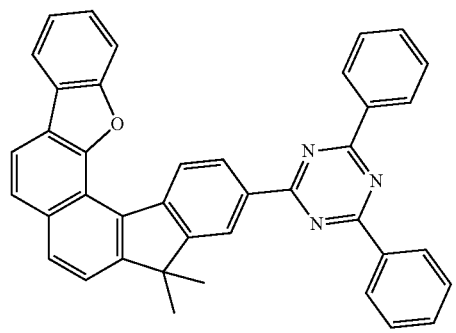
C-130
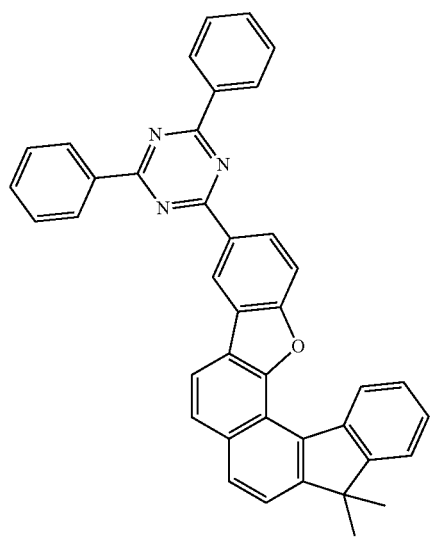
C-131
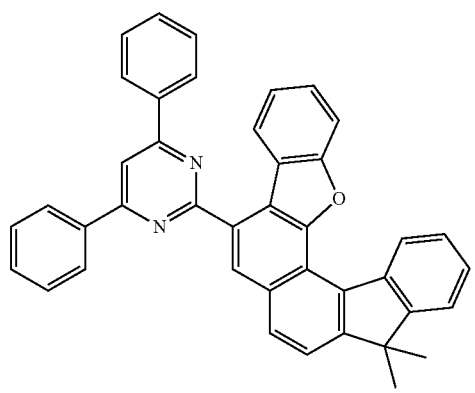
C-132
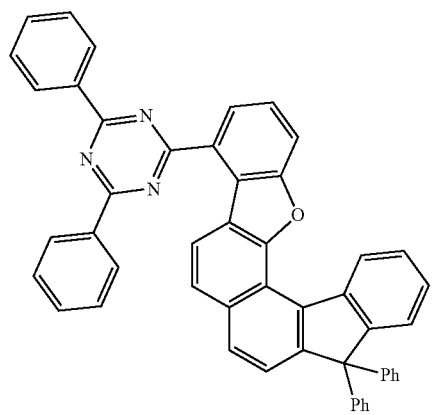
C-133
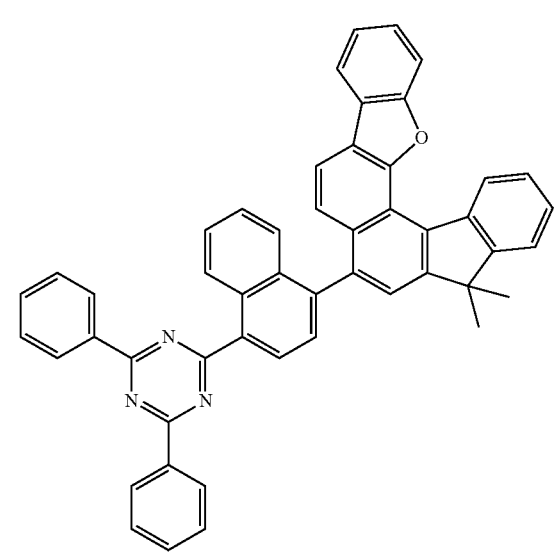
C-134
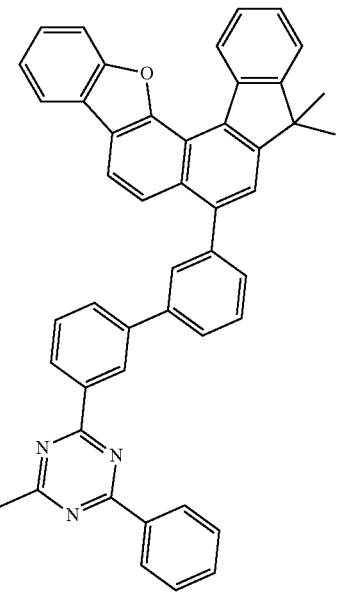

C-135
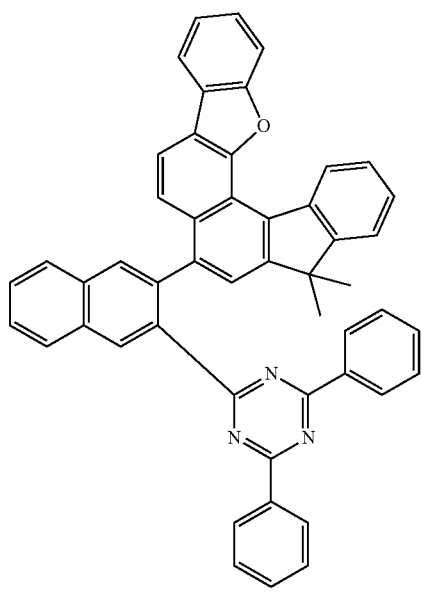
C-136
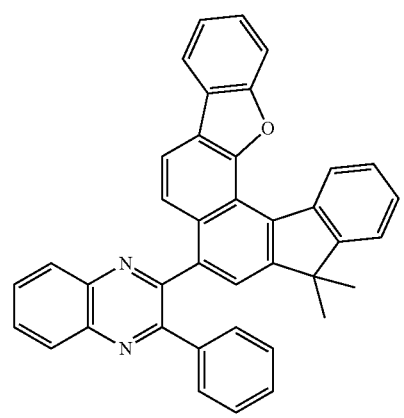
C-137
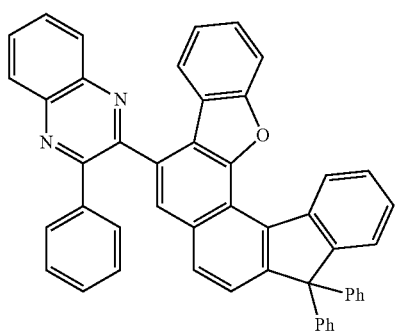
C-138
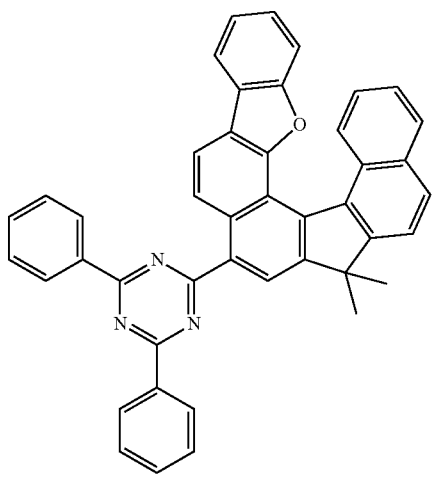
C-139
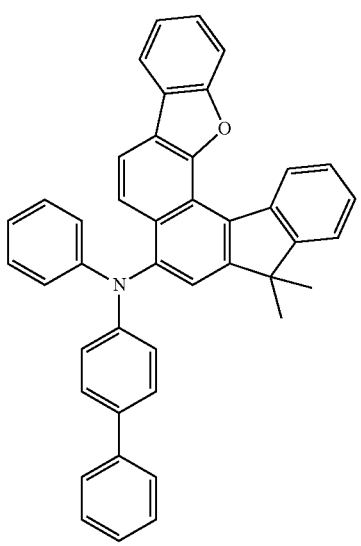
C-140
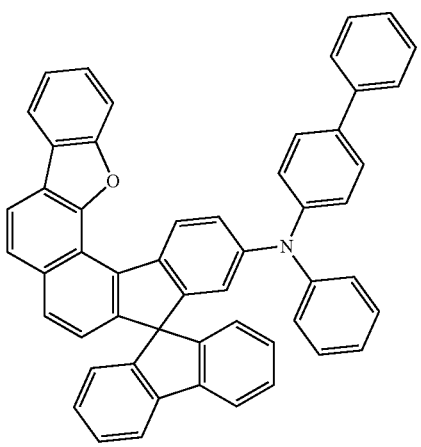

C-141
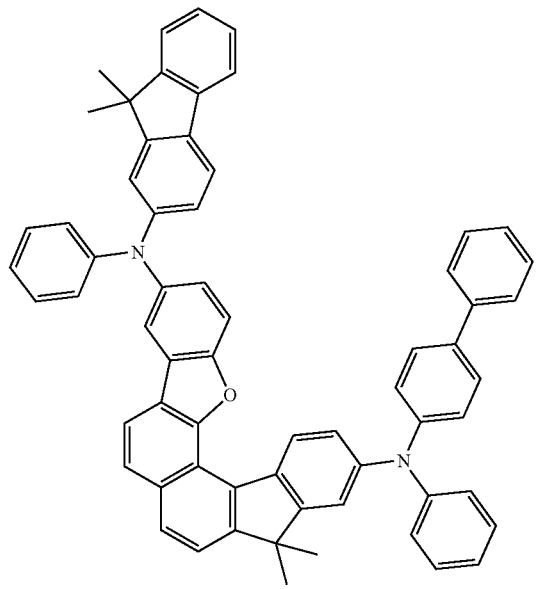
C-142
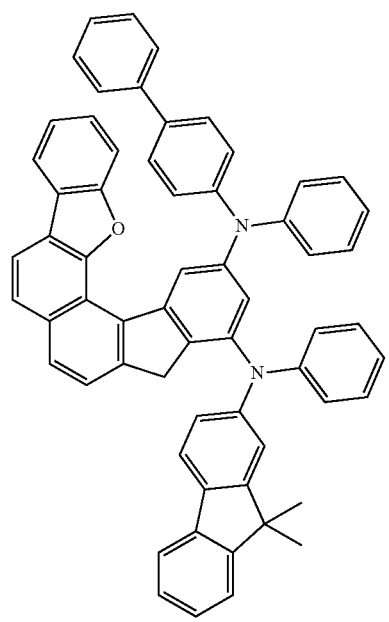
C-143
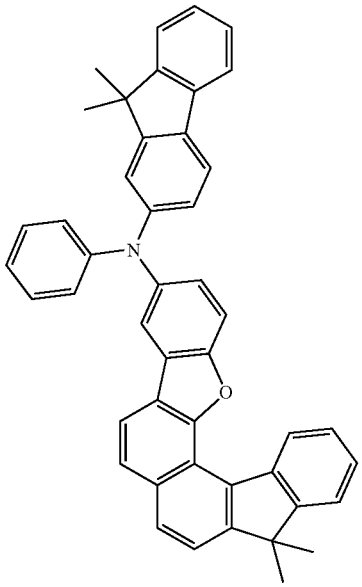
C-144
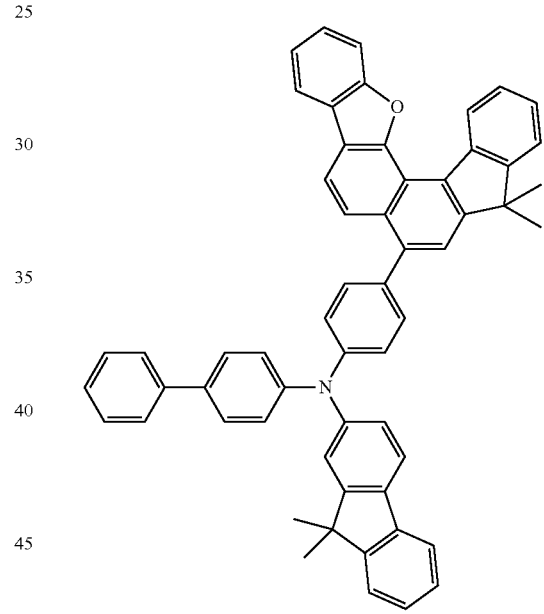
C-145
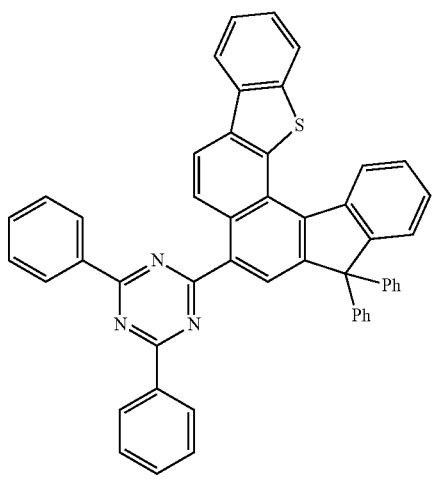

C-146
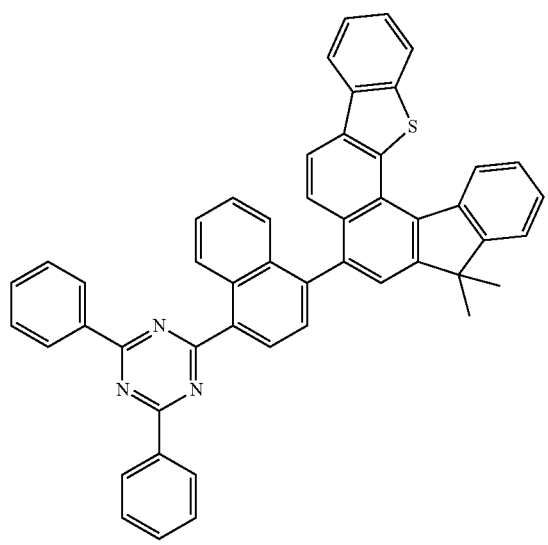
C-149
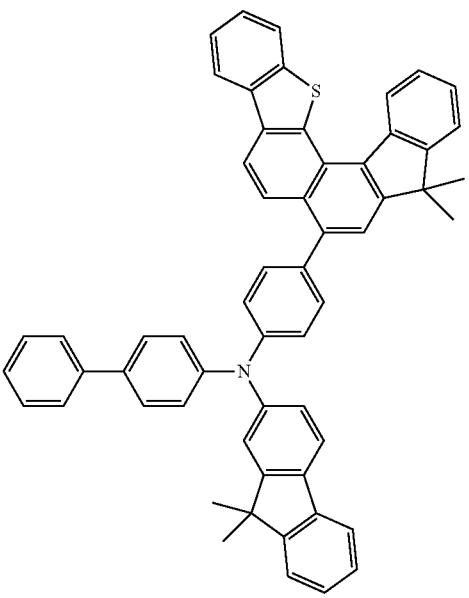
C-147
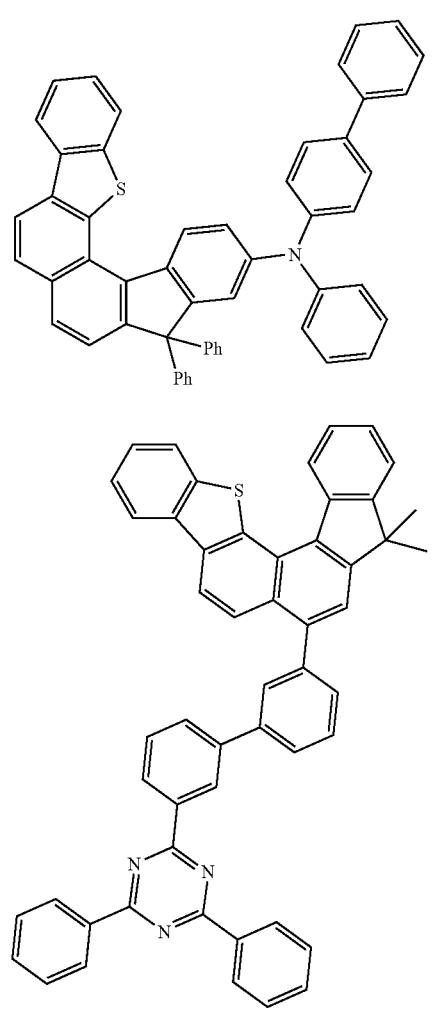
C-150
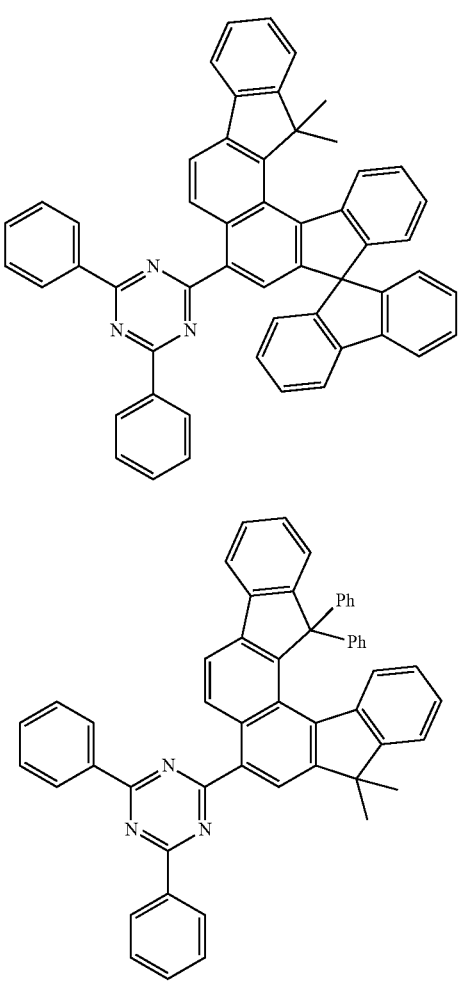
C-148
C-151

C-152
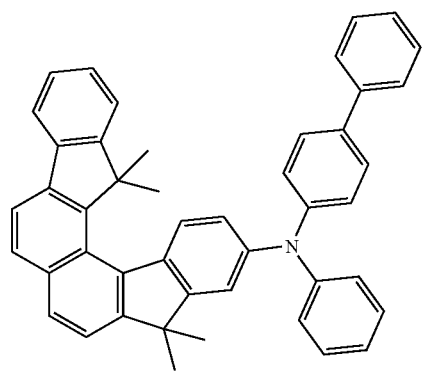
C-153
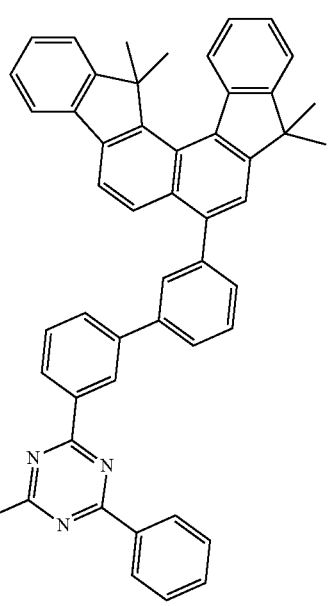
C-154
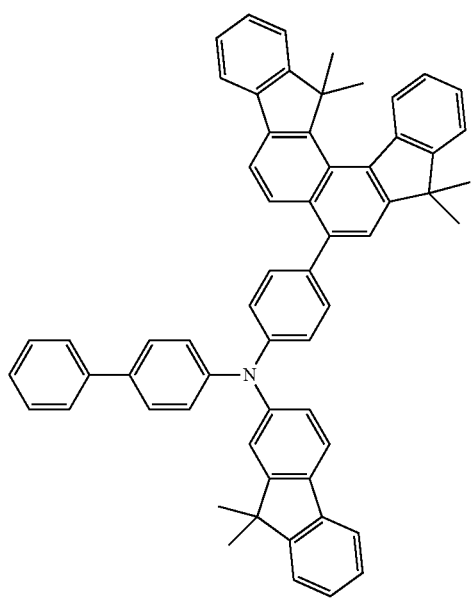
C-155
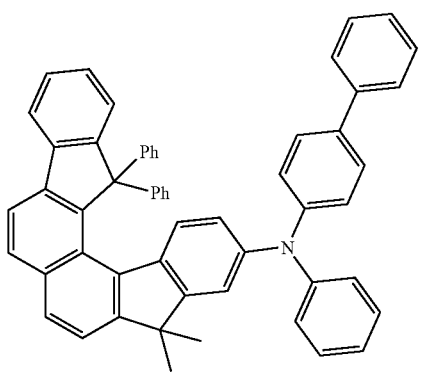
The compound represented by formula 1 according to the present disclosure may be prepared as represented by the following reaction schemes 1 to 4, but is not limited thereto; they may further be produced by a synthetic method known to a person skilled in the art.
[Reaction Scheme 1]
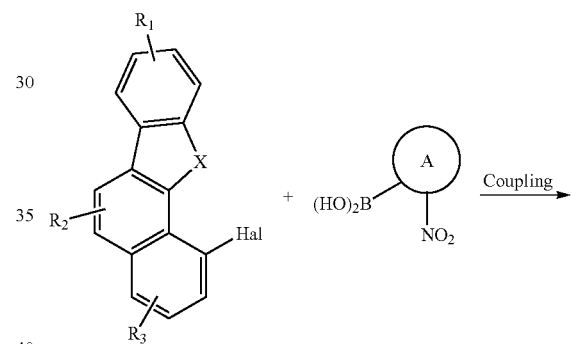
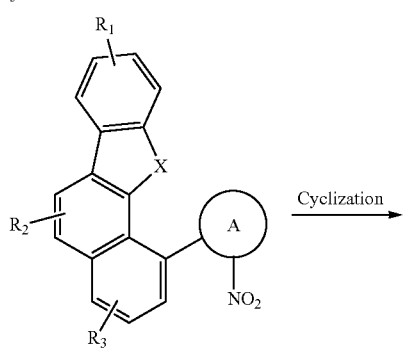
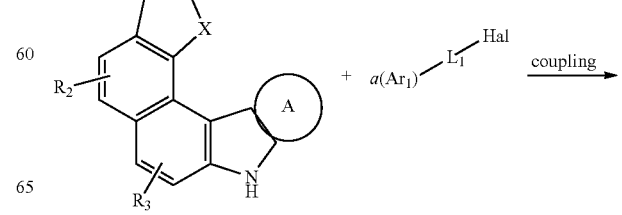

71
-continued
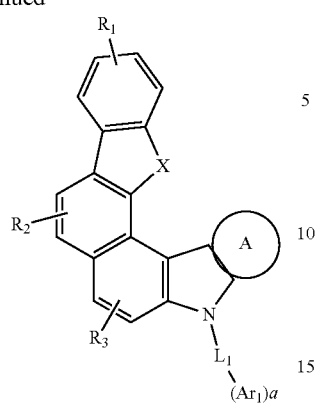
72
-continued
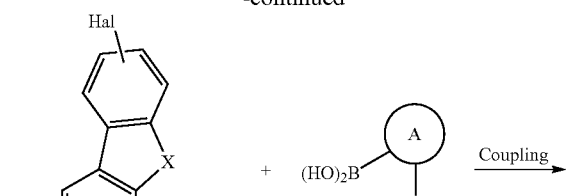
[Reaction Scheme 2]
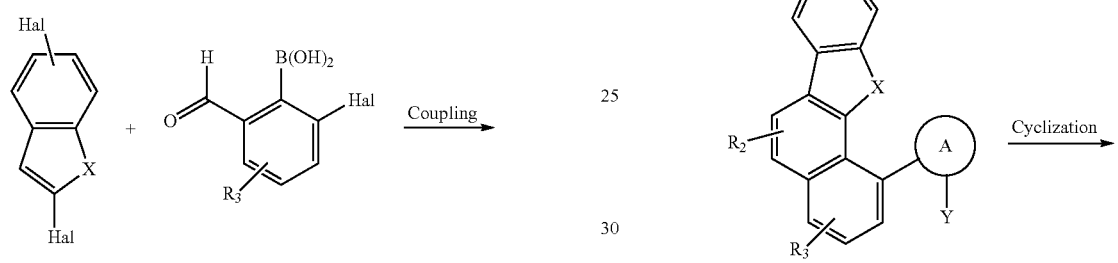
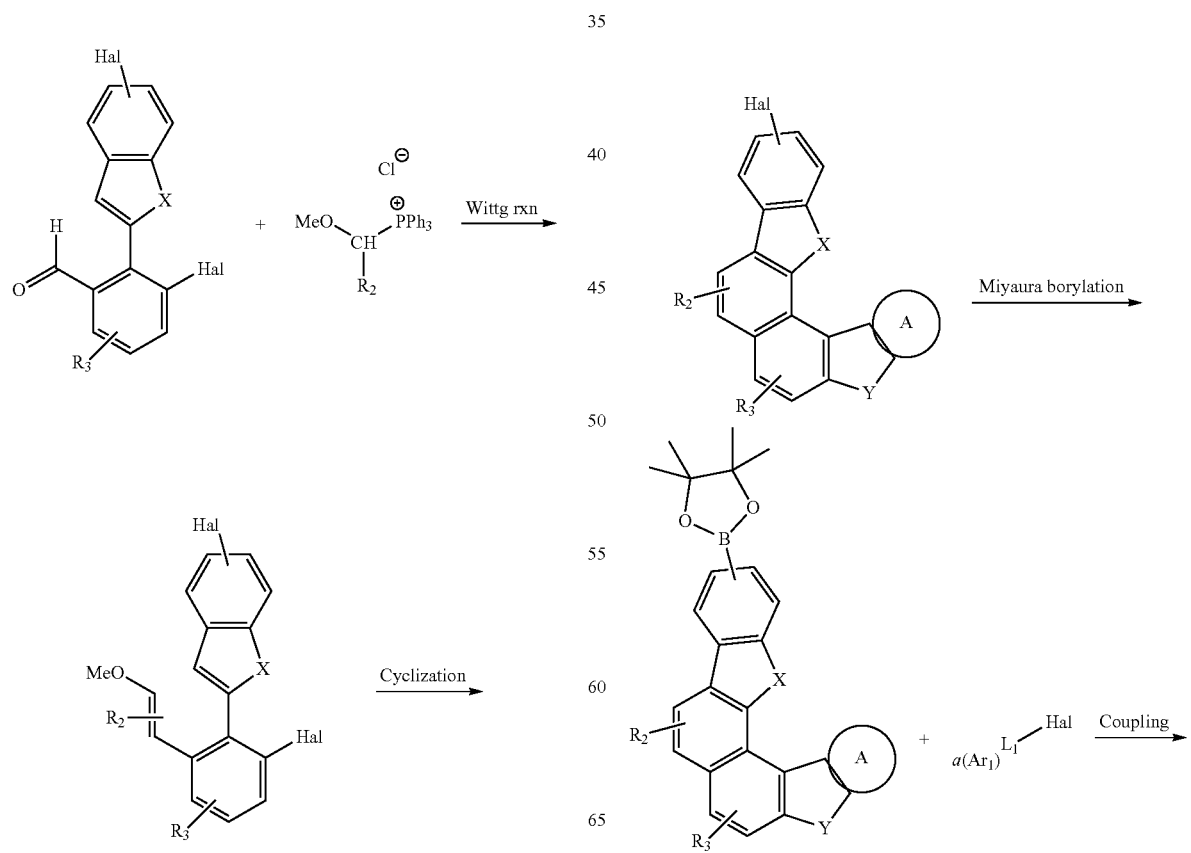

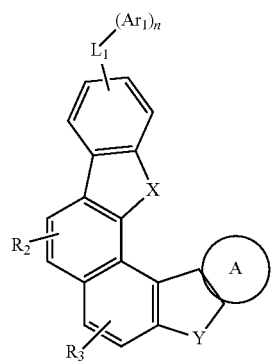
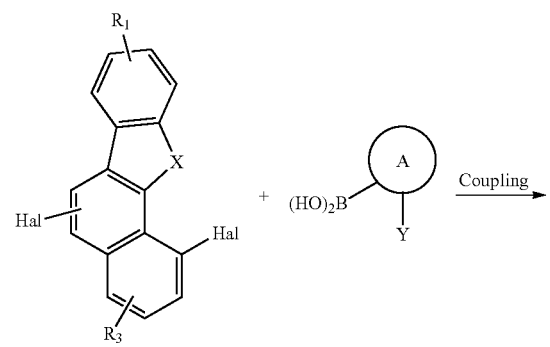
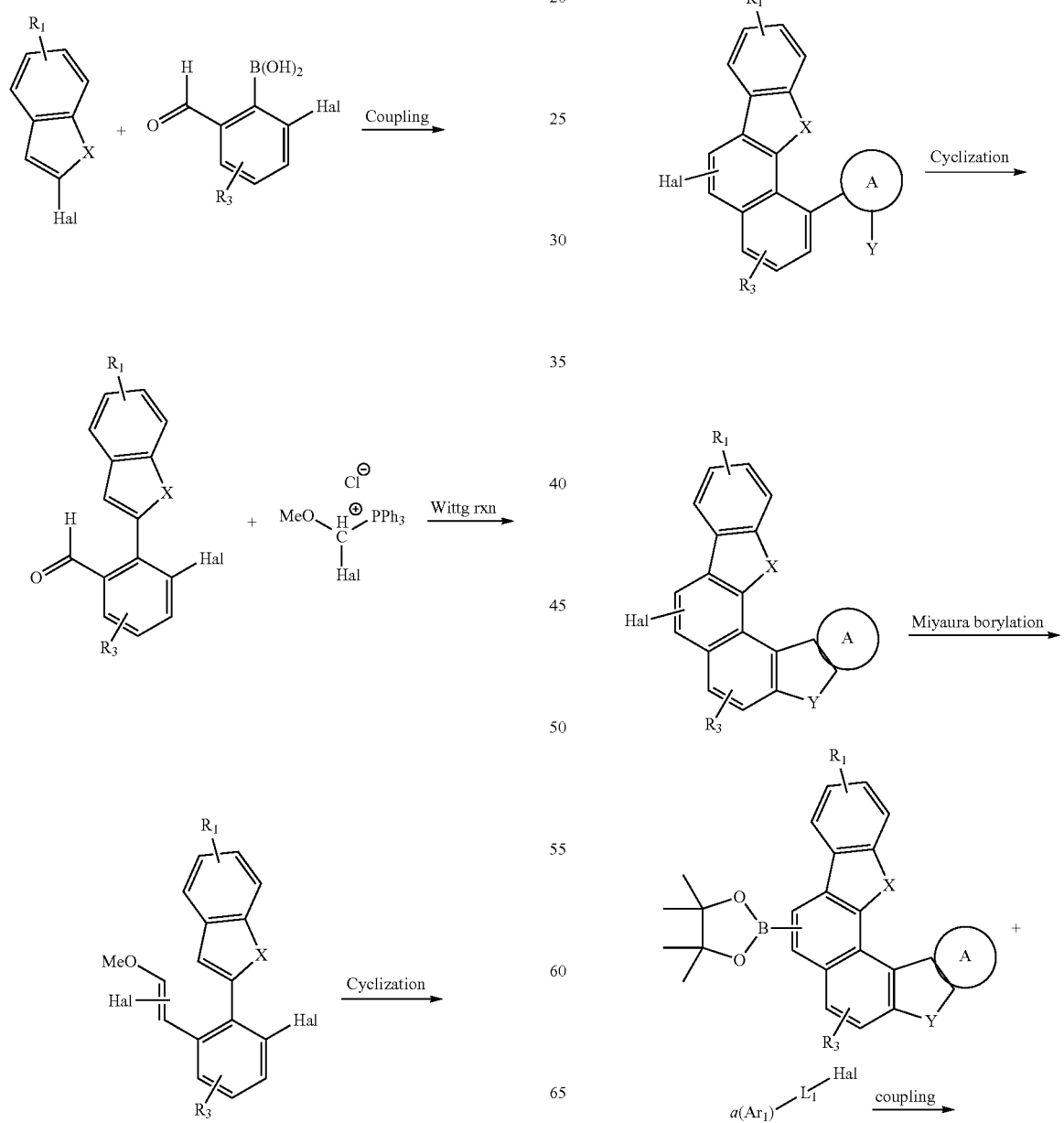
[Reaction Scheme 3]

-continued

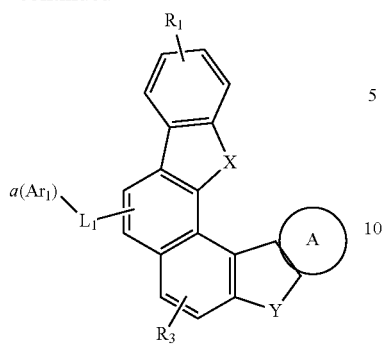

[Reaction Scheme 4]

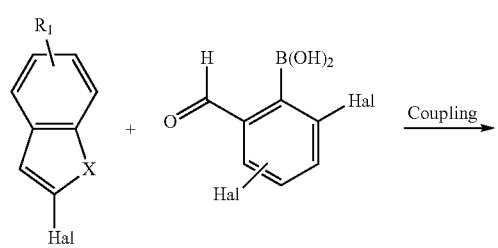

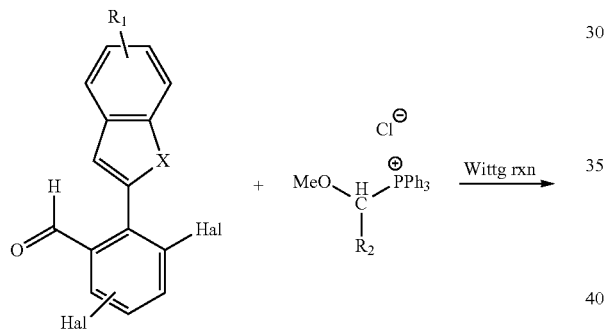

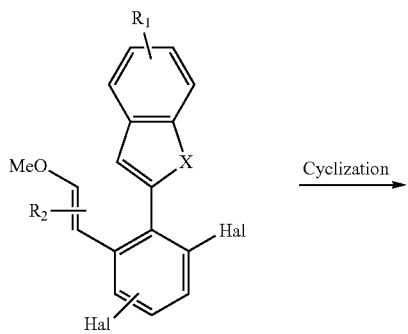

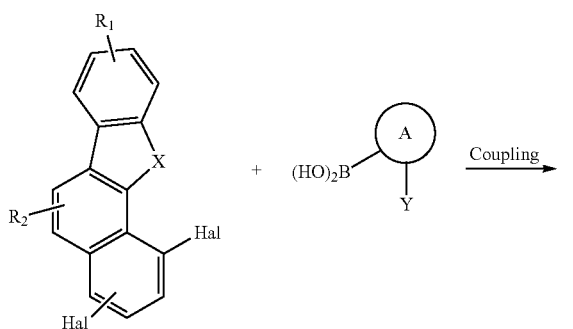

-continued

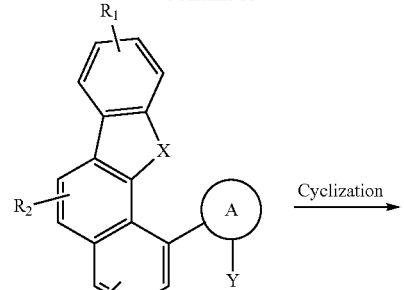

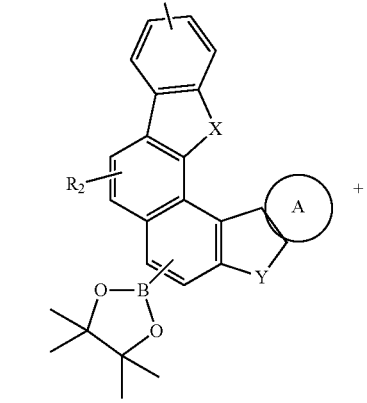

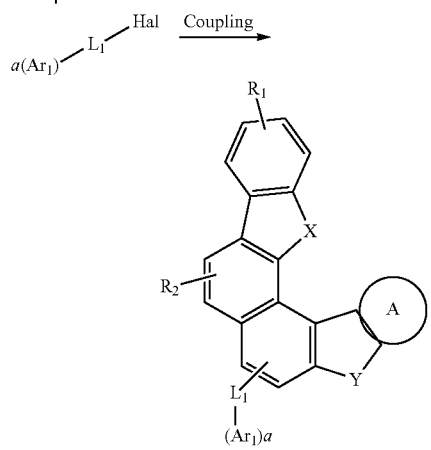

In reaction schemes 1 to 4 above, the definition of the substituents is as defined in formula 1, Hal represents a halogen atom.

As described above, exemplary synthesis examples of the compounds represented by formula 1 according to the present disclosure are described, but they are based on Wittig reaction, Miyaura boration reaction, Buchwald-Hartwig cross coupling reaction, N-arylation reaction, H-mont-mediated etherification reaction, Suzuki cross-coupling reaction, Intramolecular acid-induced cyclization reaction, Pd(II)-catalyzed oxidative cyclization reaction, Grignard reaction, Heck reaction, Cyclic Dehydration reaction, $SN_1$ substitution reaction, $SN_2$ substitution reaction, and Phosphine-mediated reductive cyclization reaction, etc. It will be understood by one skilled in the art that the above reaction proceeds even if other substituents defined in the formula 1 other than the substituents described in the specific synthesis examples are bonded.

The present disclosure may provide an organic electroluminescent material comprising an organic electroluminescent compound of formula 1, and an organic electroluminescent device comprising the organic electroluminescent material.

The organic electroluminescent material may be comprised solely of the organic electroluminescent compound of the present disclosure, or may further comprise conventional materials included in the organic electroluminescent material. When two or more species of materials are included in one layer, the at least two compounds may be a mixture-evaporation or a co-evaporation to form a layer. The organic electroluminescent material according to one embodiment may comprise at least one compound represented by formula 1 above. For example, the compound of formula 1 may be included in a light-emitting layer, if the compound of formula 1 is included in the light-emitting layer, the compound of formula 1 may be included as a host, more specifically as a phosphorescent host.

The organic electroluminescent material of the present disclosure may further include at least one host compound other than the organic electroluminescent compound of formula 1 above. Preferably, the organic electroluminescent material may further include at least one dopant.

The dopant comprised in the organic electroluminescent material of the present disclosure may be at least one phosphorescent or fluorescent dopant, preferably a phosphorescent dopant. The phosphorescent dopant material applied to the organic electroluminescent device of the present disclosure is not particularly limited, but may be preferably a metallated complex compound(s) of a metal atom(s) selected from iridium (Ir), osmium (Os), copper (Cu), and platinum (Pt), as necessary, more preferably an ortho-metallated complex compound(s) of a metal atom(s) selected from iridium (Ir), osmium (Os), copper (Cu), and platinum (Pt), as necessary, and even more preferably ortho-metallated iridium complex compound(s), as necessary.

The dopant comprised may use the compound represented by the following formula 101, but is not limited thereto:

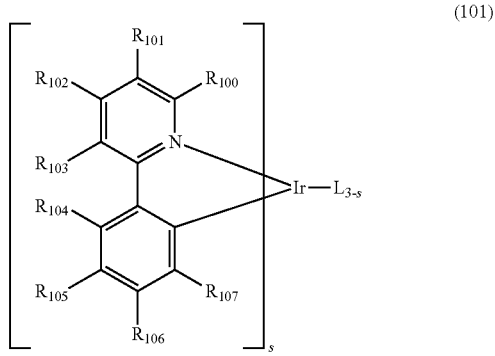

(101)

In formula 101,
L is selected from the following structure 1 or 2:

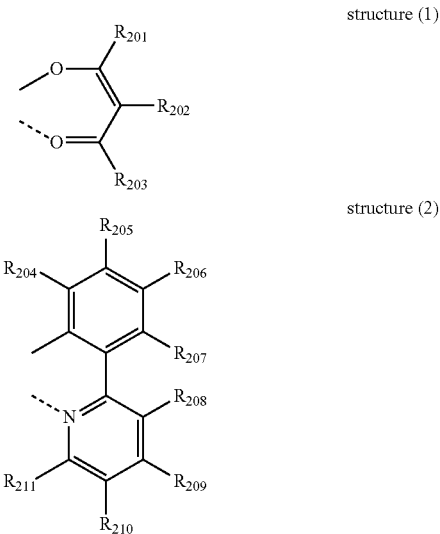

structure (1)

structure (2)

In structures 1 and 2,
$R_{100}$ to $R_{103}$ each independently represent hydrogen, deuterium, halogen, halogen-substituted or unsubstituted (C1-C30)alkyl, a substituted or unsubstituted (C3-C30) cycloalkyl, a substituted or unsubstituted (C6-C30)aryl, cyano, a substituted or unsubstituted (3- to 30-membered)heteroaryl, or a substituted or unsubstituted (C1-C30)alkoxy; or $R_{100}$ to $R_{103}$ may be linked to an adjacent substituent(s) to form a substituted or unsubstituted fused ring, e.g., a substituted or unsubstituted quinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline;

$R_{104}$ to $R_{107}$ each independently represent hydrogen, deuterium, halogen, halogen-substituted or unsubstituted (C1-C30)alkyl, a substituted or unsubstituted (C3-C30) cycloalkyl, a substituted or unsubstituted (C6-C30)aryl, a substituted or unsubstituted (3- to 30-membered) heteroaryl, cyano, or a substituted or unsubstituted (C1-C30)alkoxy; or $R_{104}$ to $R_{107}$ may be linked to an adjacent substituent(s) to form a substituted or unsubstituted fused ring, e.g., a substituted or unsubstituted naphthyl, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{211}$ each independently represent hydrogen, deuterium, halogen, halogen-substituted or unsubstituted (C1-C30)alkyl, a substituted or unsubstituted (C3-C30) cycloalkyl, or a substituted or unsubstituted (C6-C30) aryl; or $R_{201}$ to $R_{211}$ may be linked to an adjacent substituent(s) to form a substituted or unsubstituted fused ring; and s represents an integer of 1 to 3.

Specifically, the specific examples of the dopant compound include the following, but are not limited thereto:

D-1
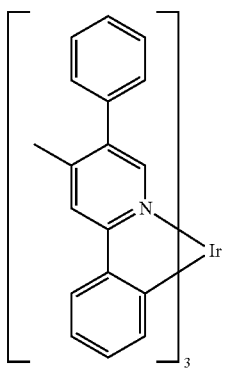
D-5
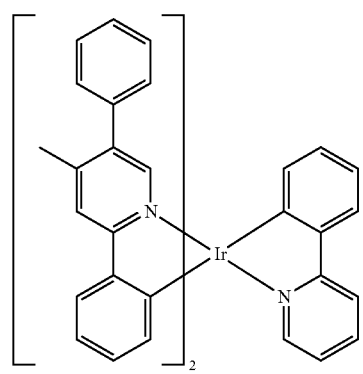
D-2
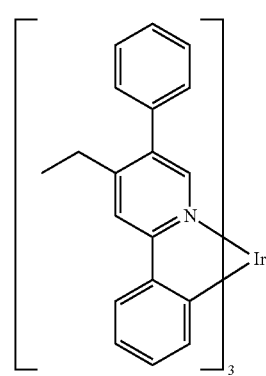
D-6
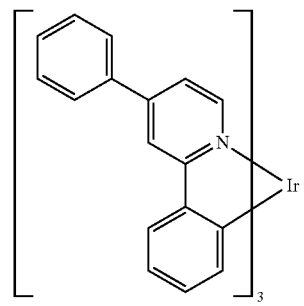
D-3
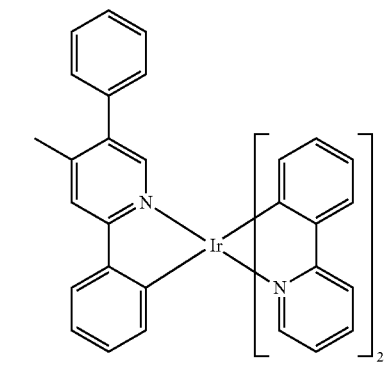
D-7
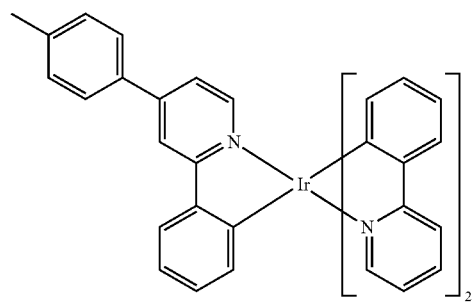
D-4
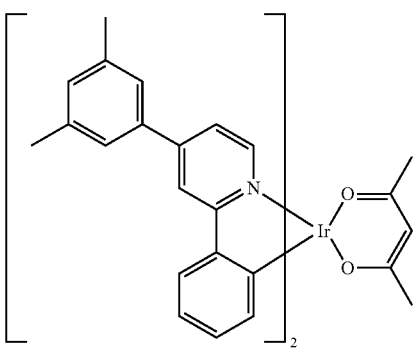
D-8
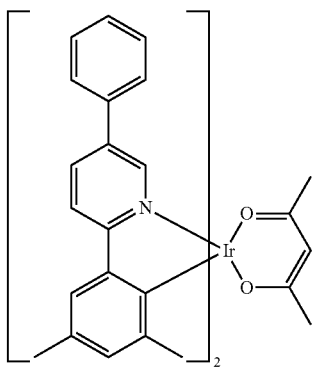

D-9
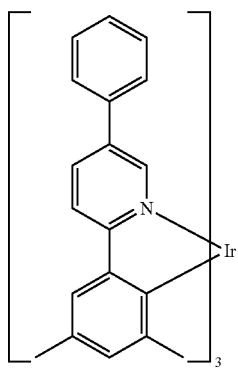
D-10
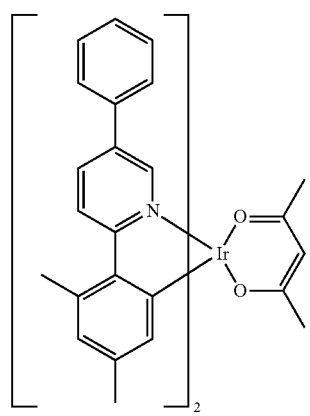
D-11
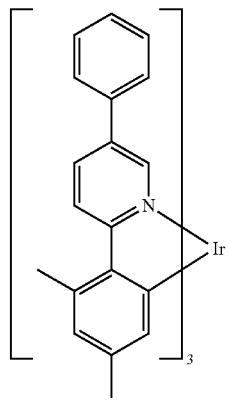
D-12
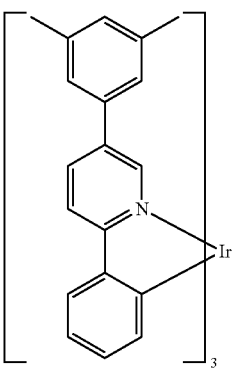
D-13
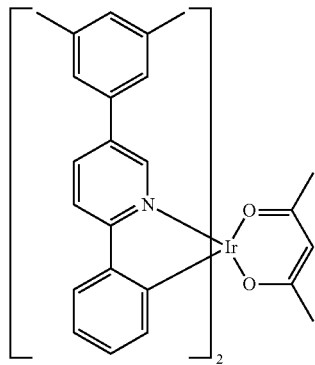
D-14
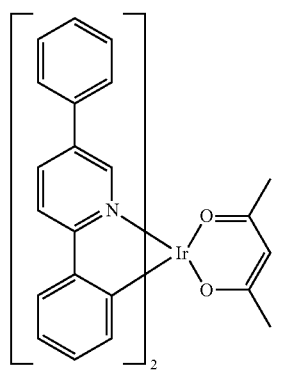
D-15
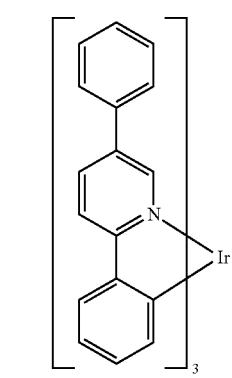
D-16

D-17 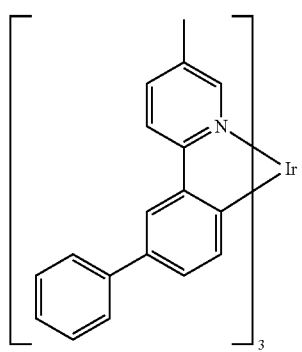
D-18 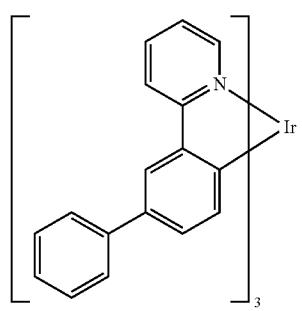
D-19 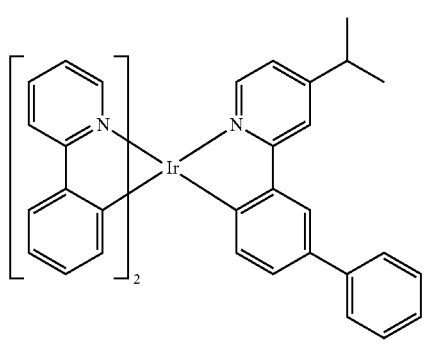
D-20 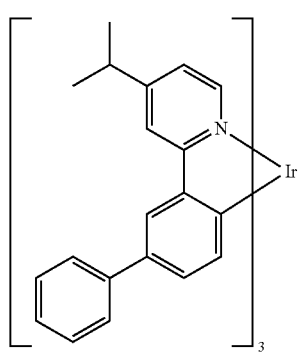
D-21 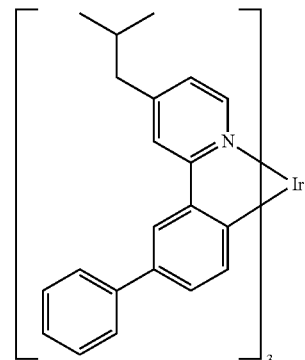
D-22 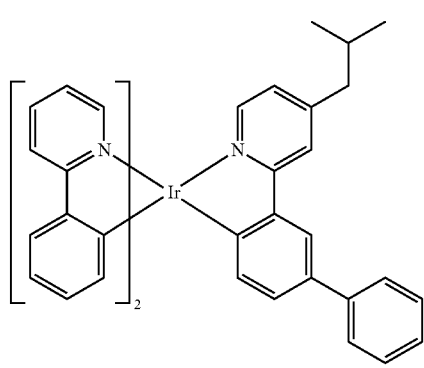
D-23 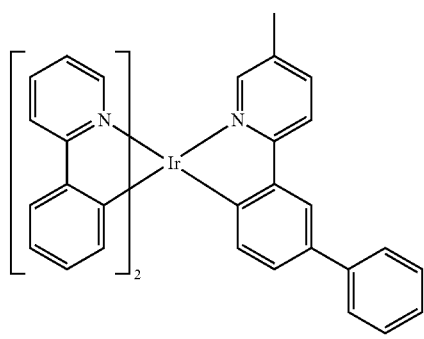
D-24 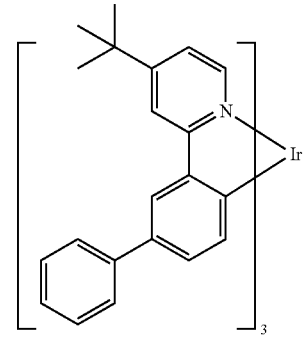

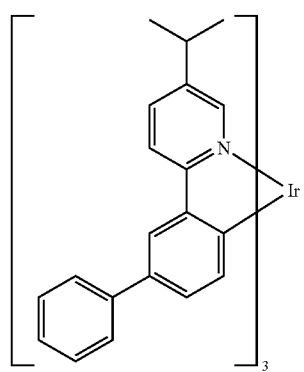
D-25
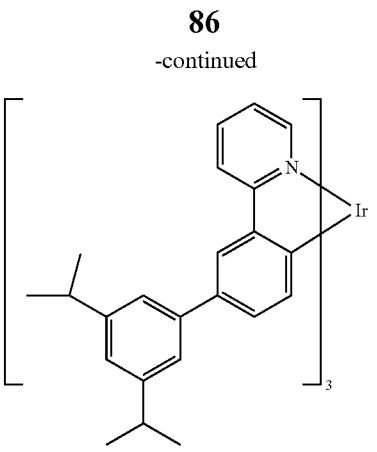
D-29
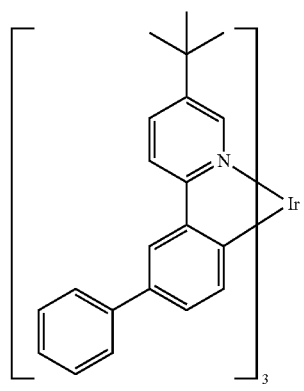
D-26
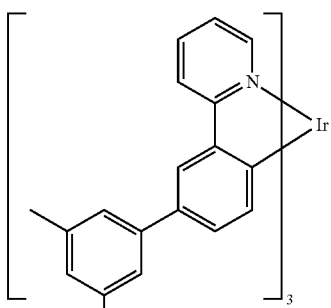
D-30
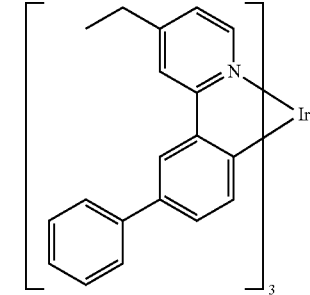
D-31
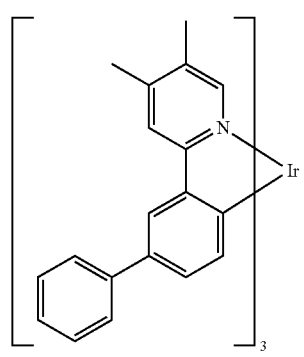
D-27
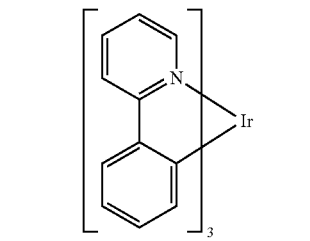
D-32
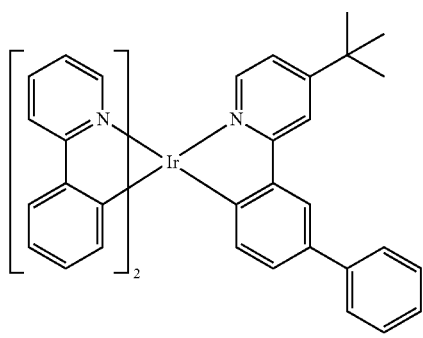
D-28
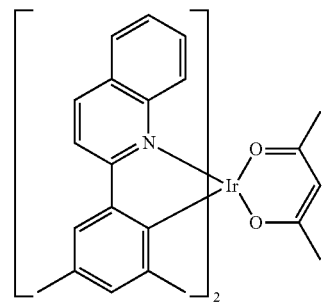
D-33

D-34 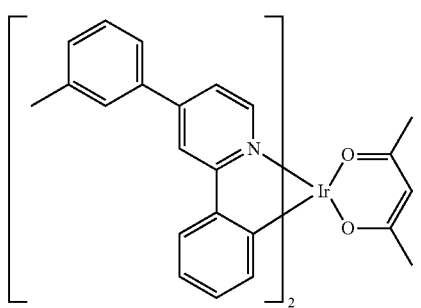
D-35 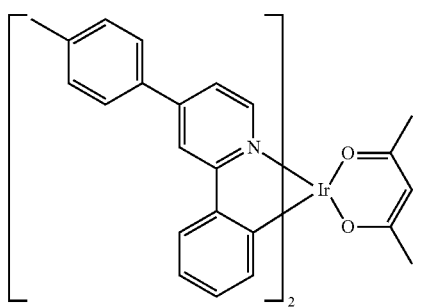
D-36 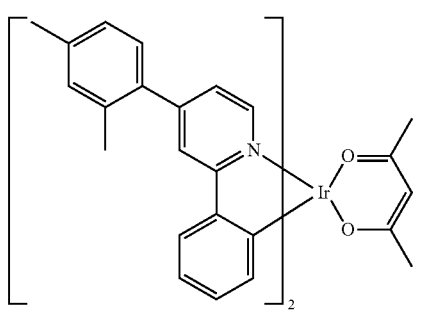
D-37 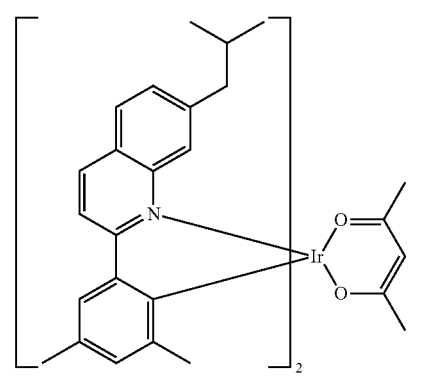
D-38 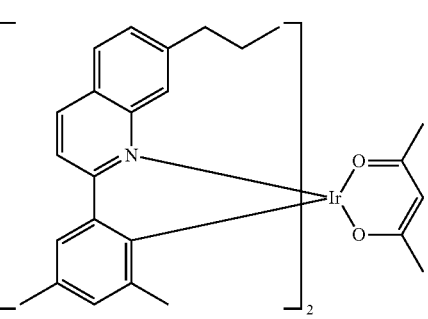
D-39 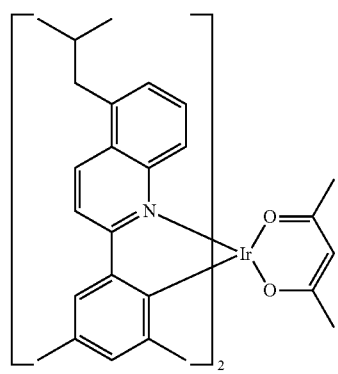
D-40 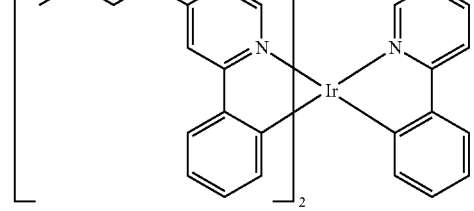
D-41 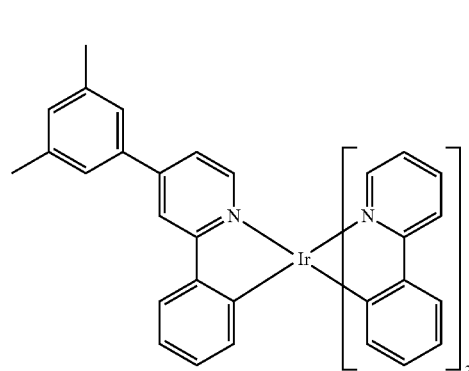
D-42 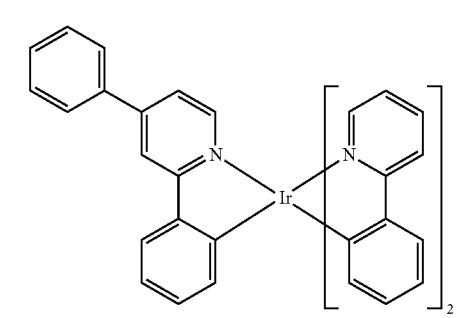

D-43
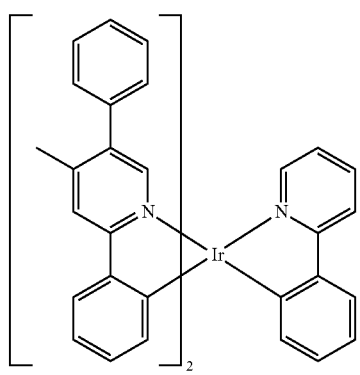
D-44
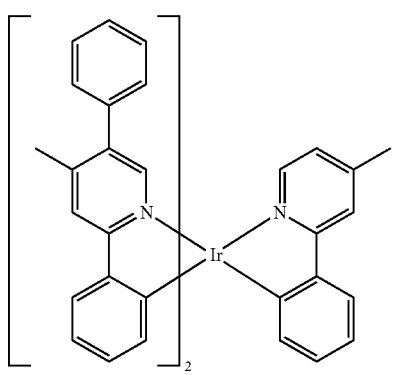
D-45
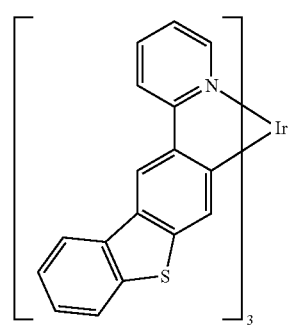
D-46
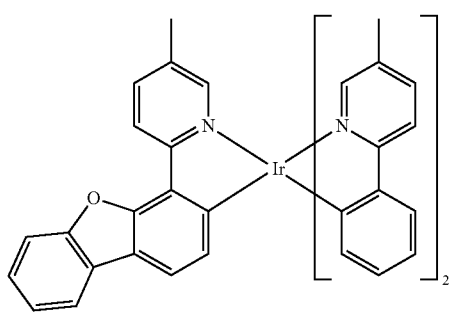
D-47
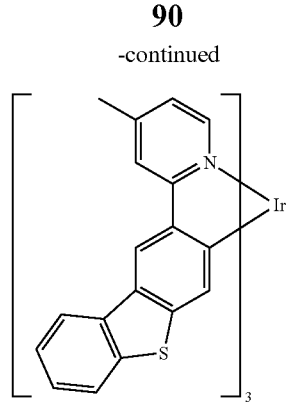
D-48
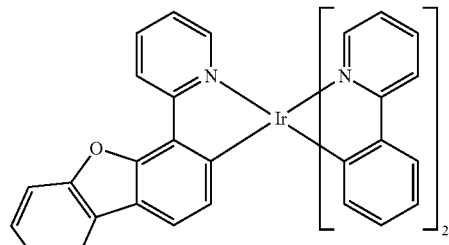
D-49
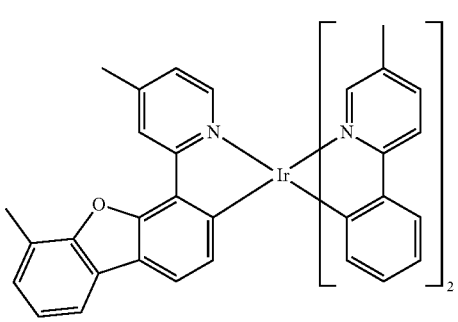
D-50
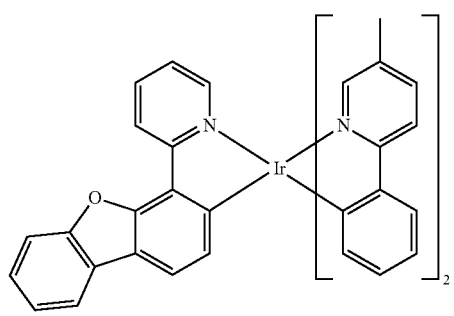
D-51
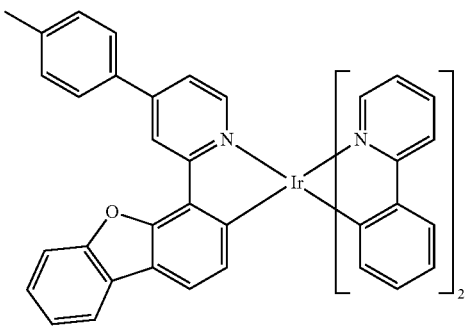

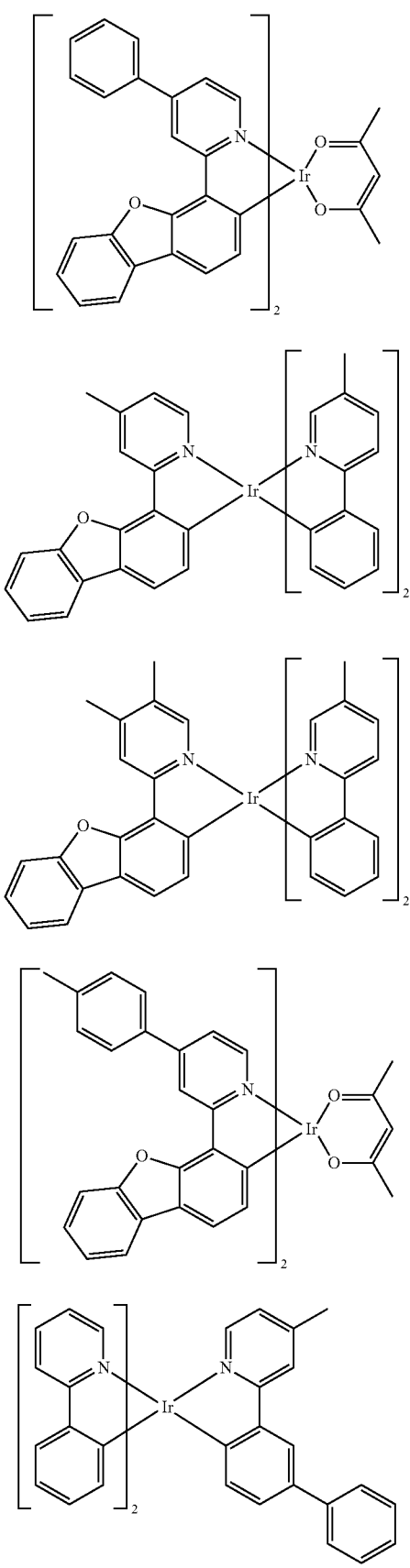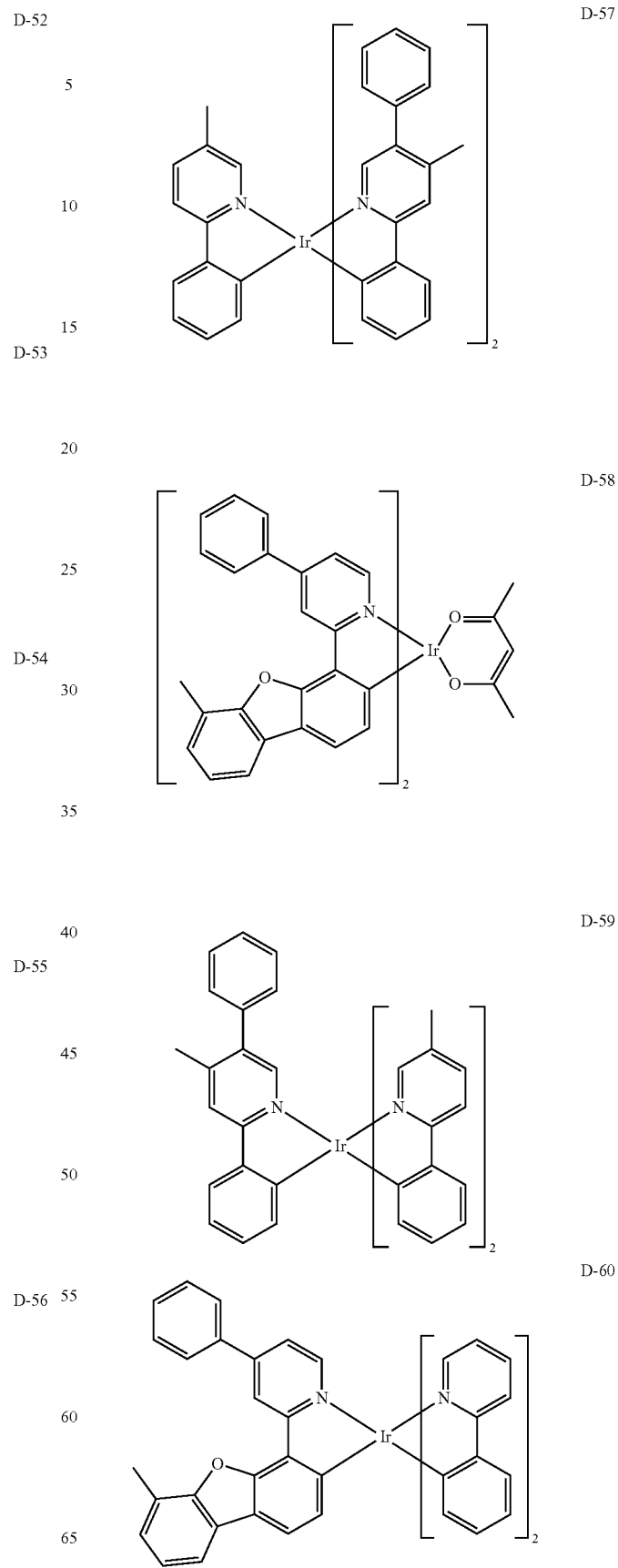

D-61
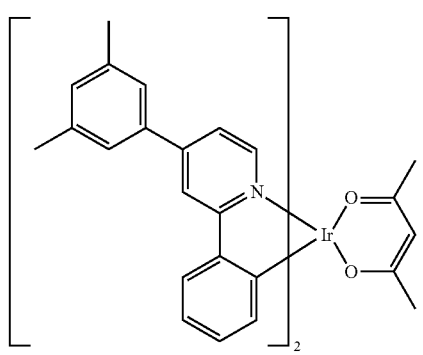
D-65
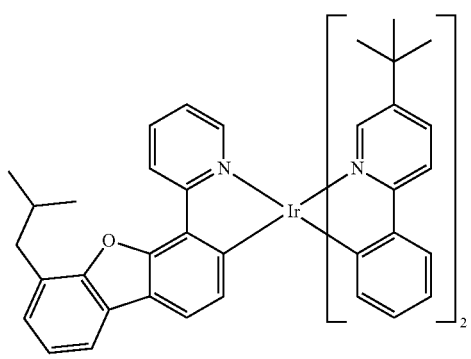
D-62
D-66
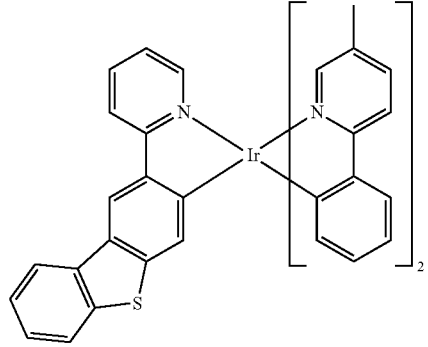
D-63
D-67
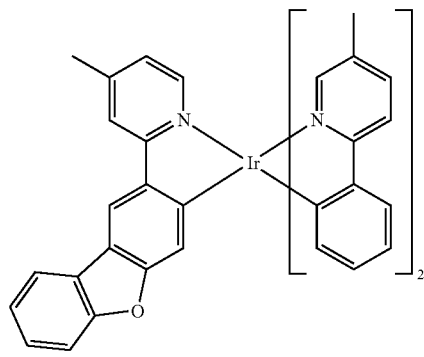
D-64
D-68
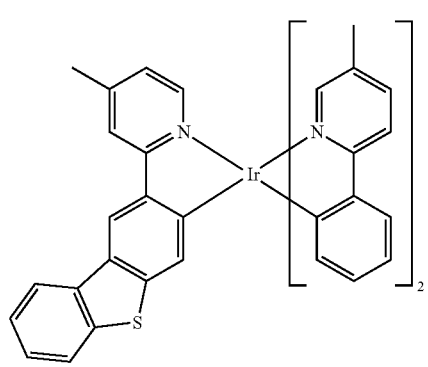

D-69
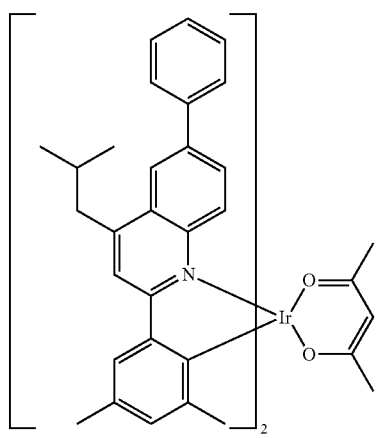
D-70
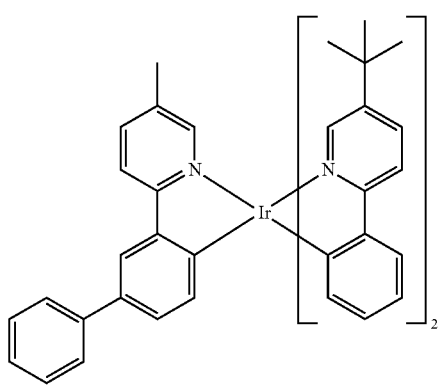
D-71
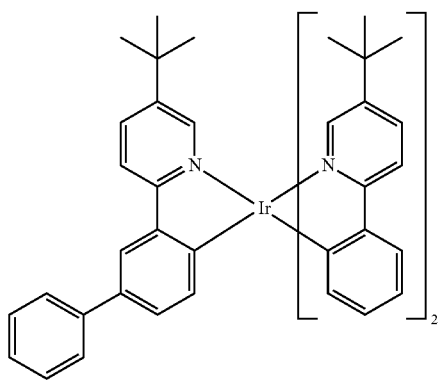
D-73
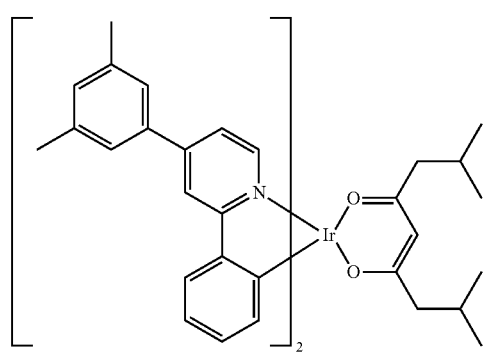
D-74
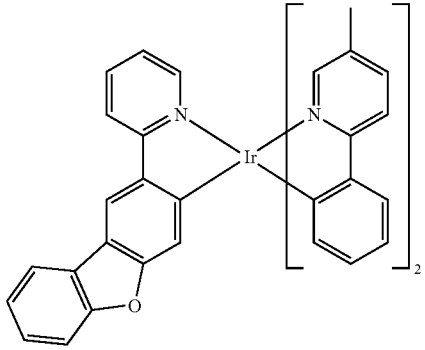
D-75
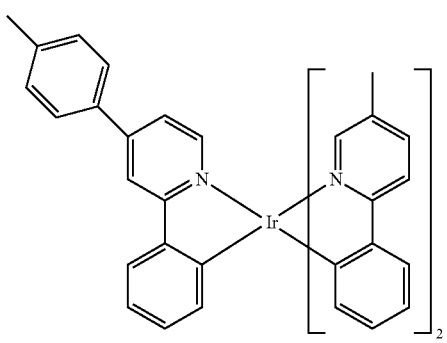
D-72
D-76
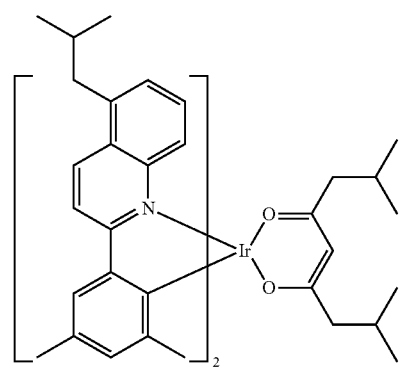

D-77
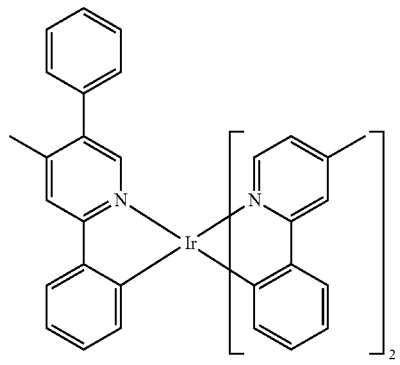
D-78
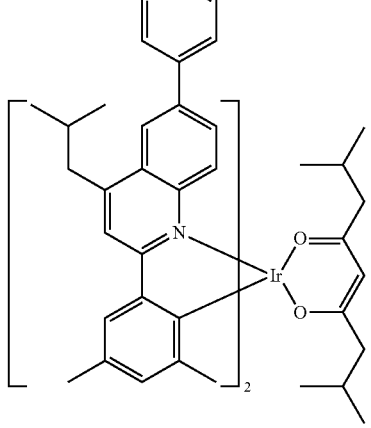
D-79
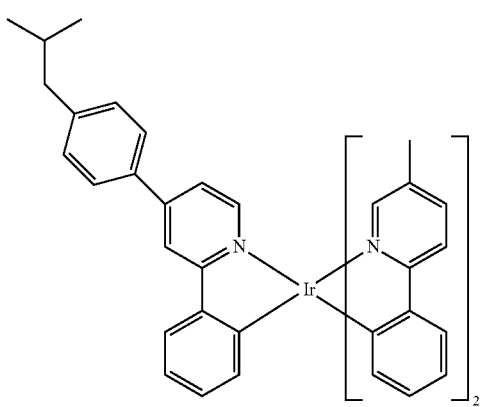
D-80
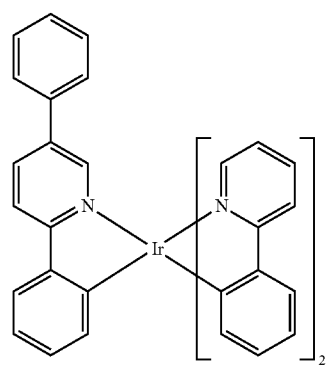
D-81
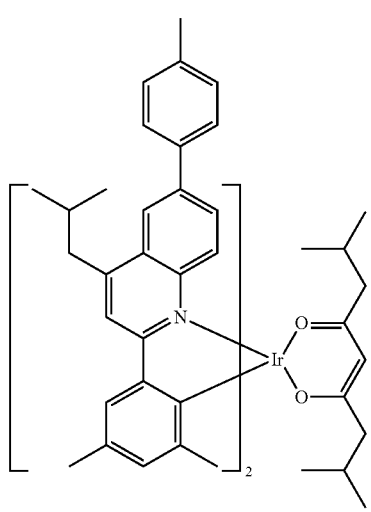
D-82
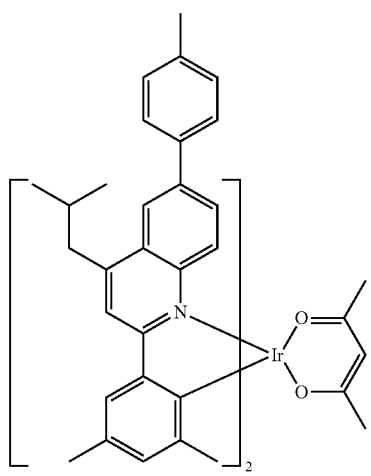
D-83
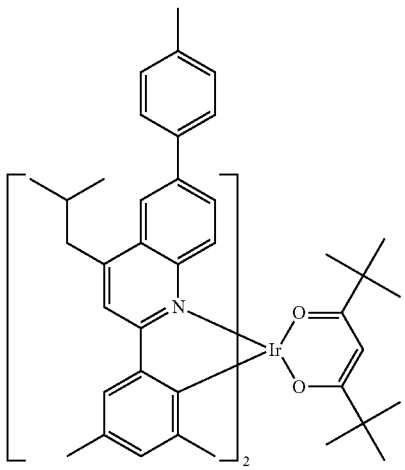

D-84
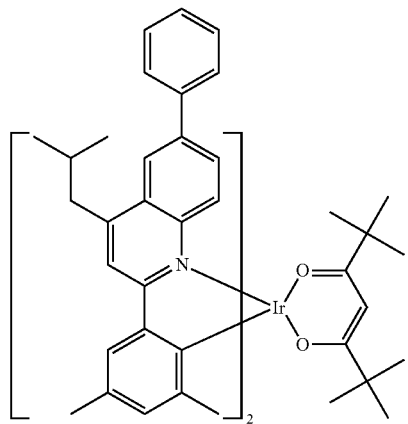
D-85
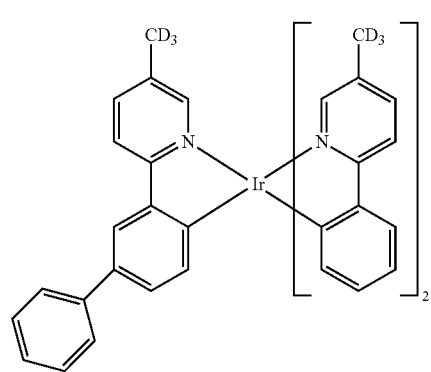
D-86
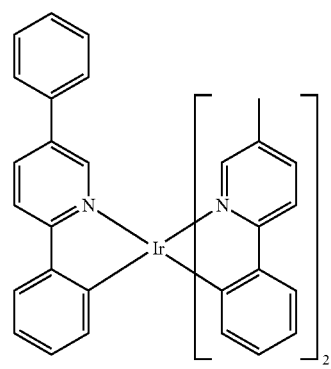
D-87
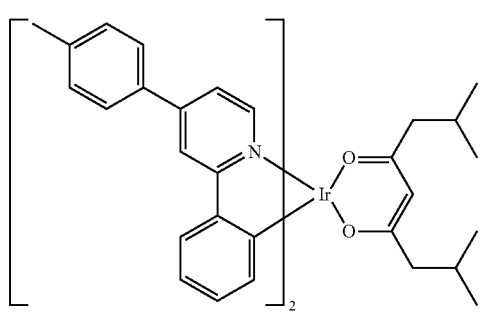
D-88
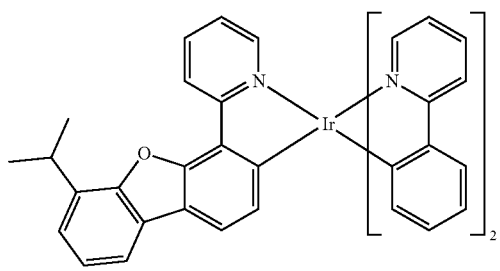
D-89
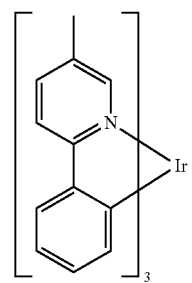
D-90
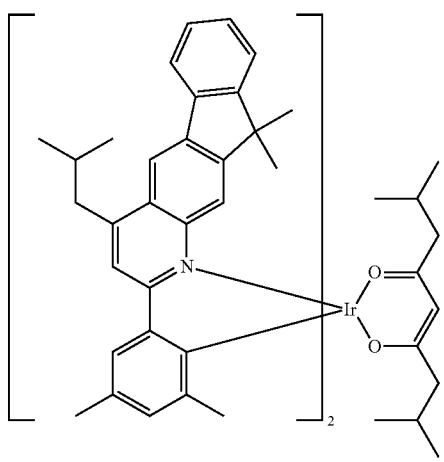
D-91
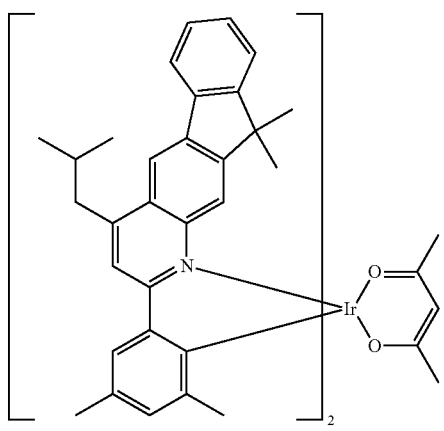

-continued
D-92
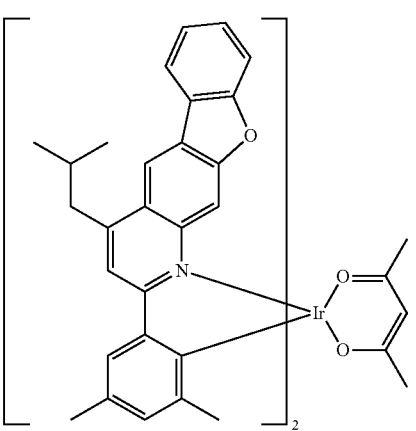
D-93
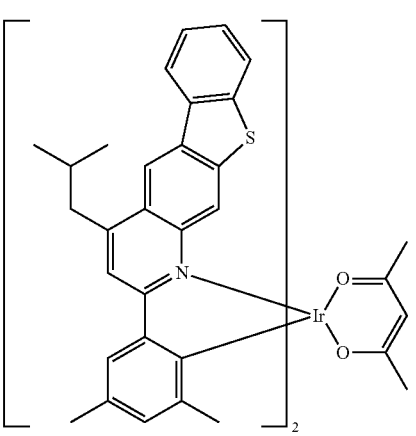
D-94
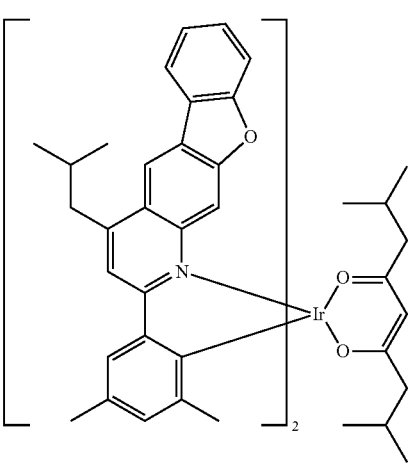
-continued
D-95
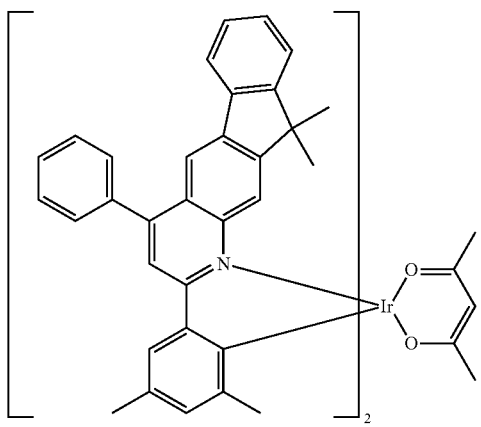
D-96
D-97
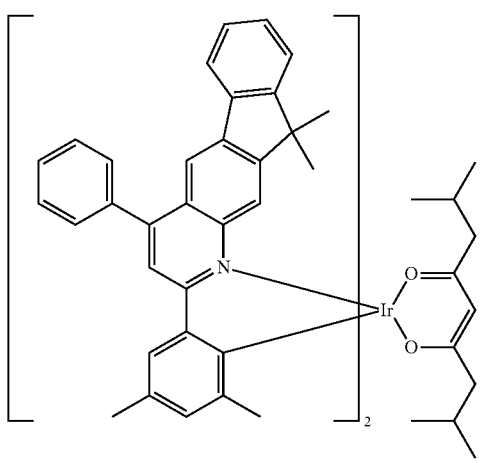
D-98
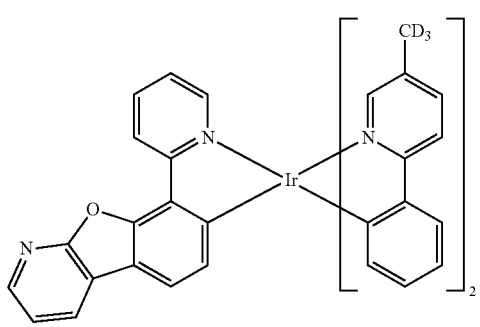

D-99
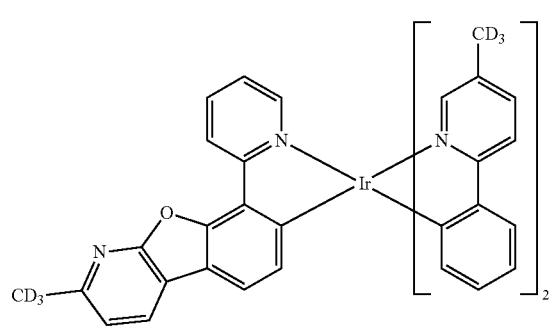
D-100
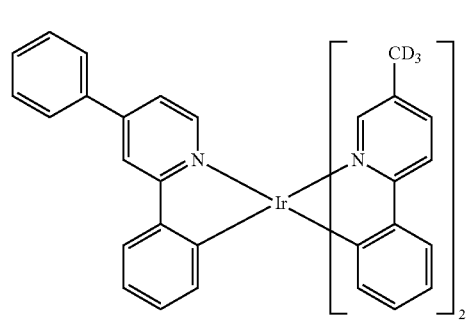
D-101
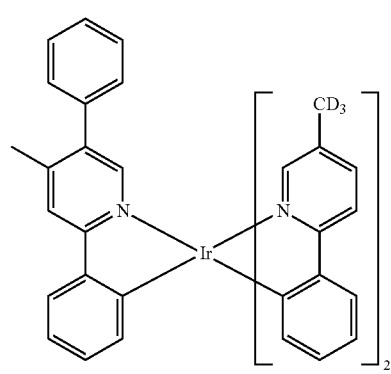
D-102
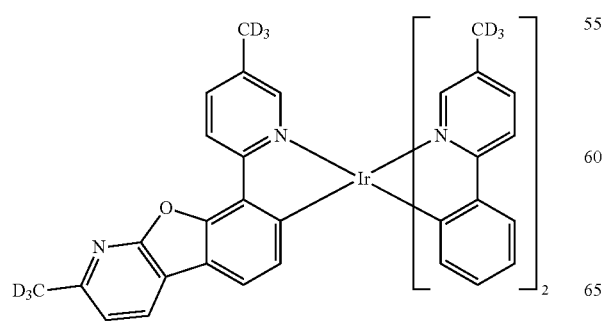
D-103
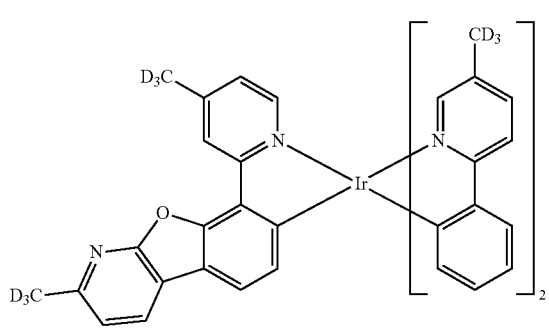
D-104
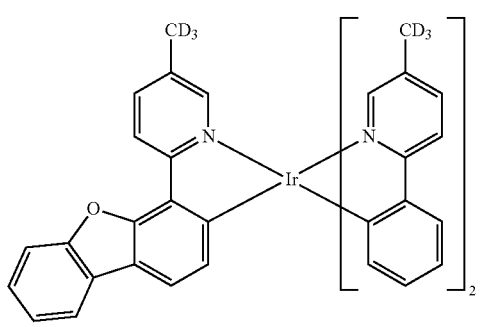
D-105
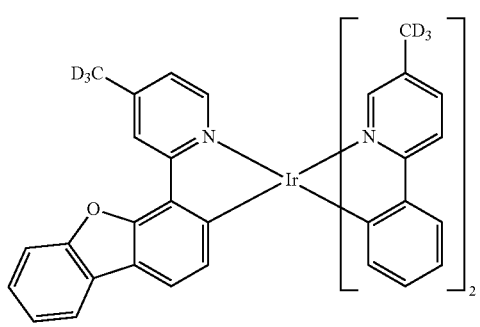
D-106
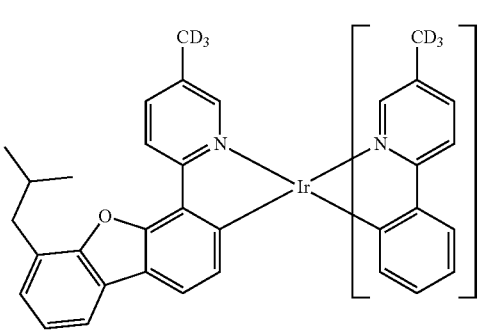

-continued
D-107
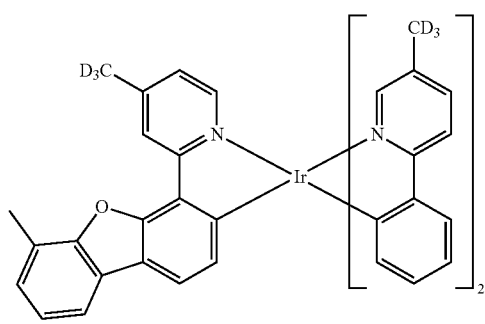
D-108
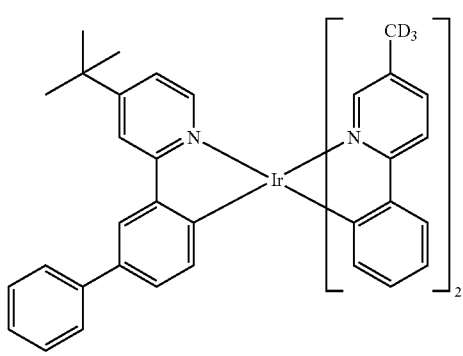
D-109
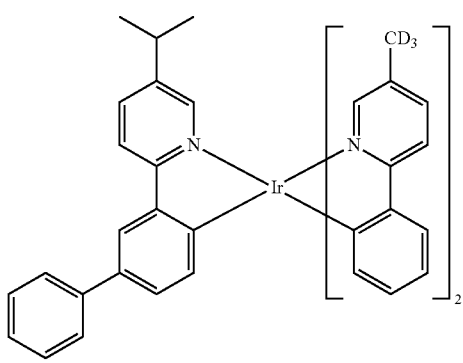
D-110
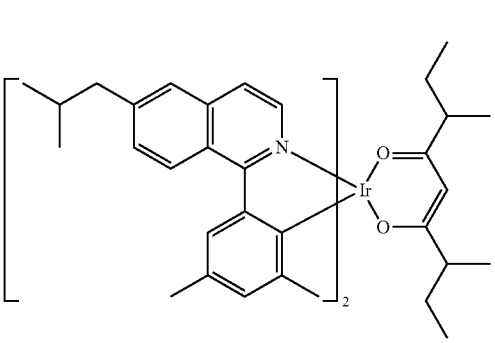
-continued
D-111
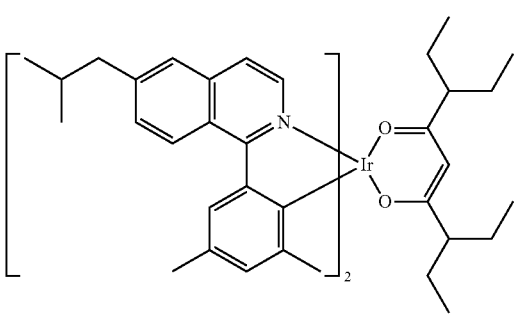
D-112
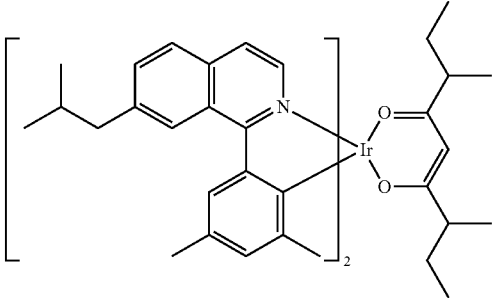
D-113
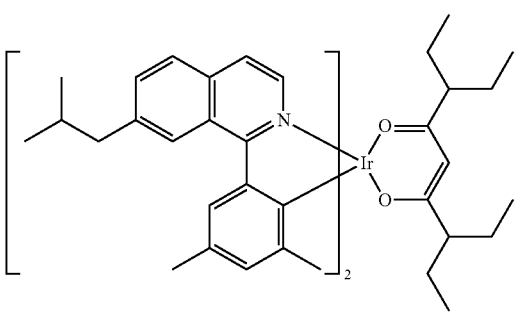
D-114
D-115
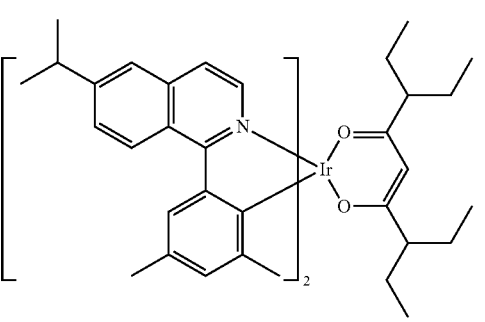

-continued
D-116
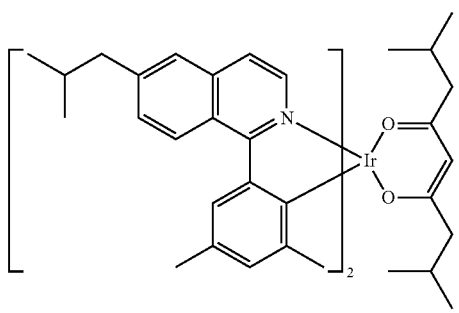
D-117
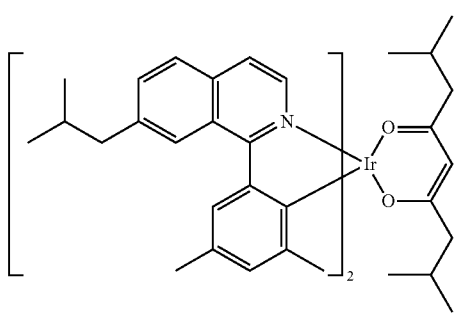
D-118
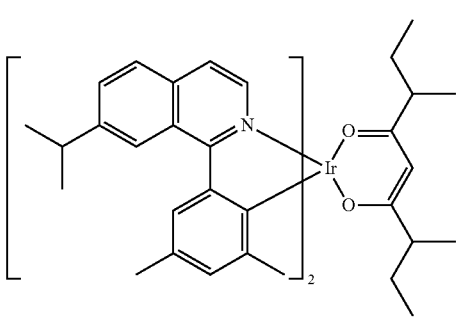
D-119
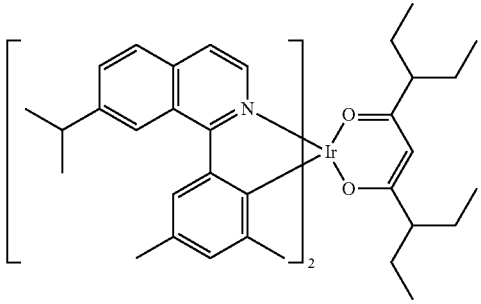
-continued
D-120
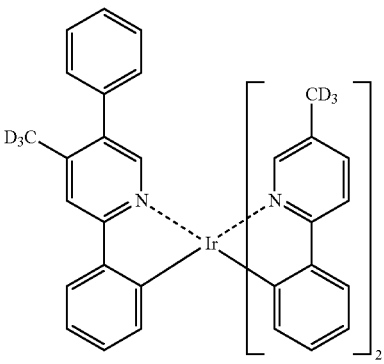
D-121
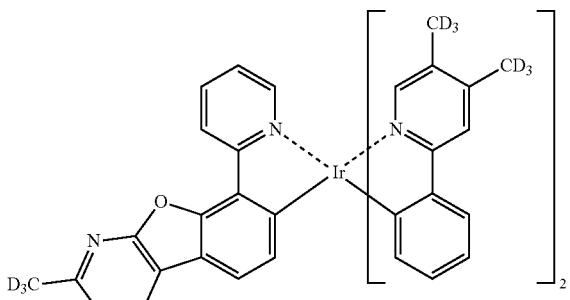
D-122
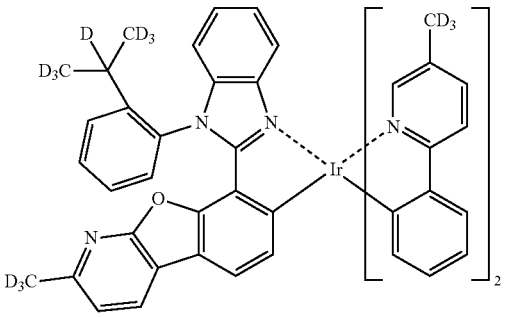
D-123
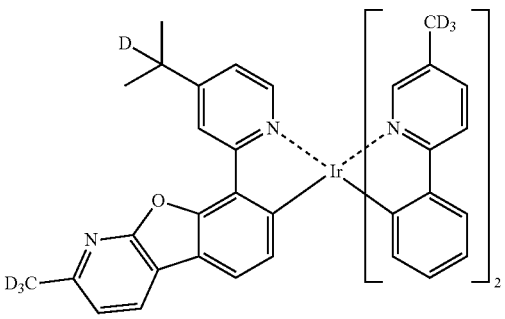

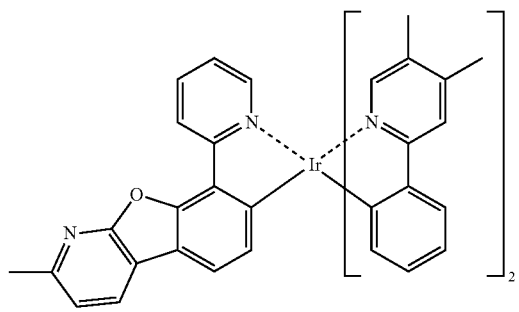
D-124

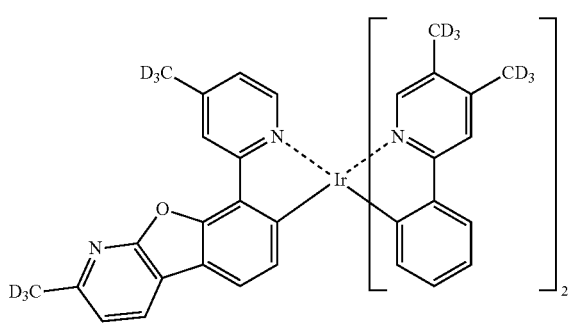
D-125

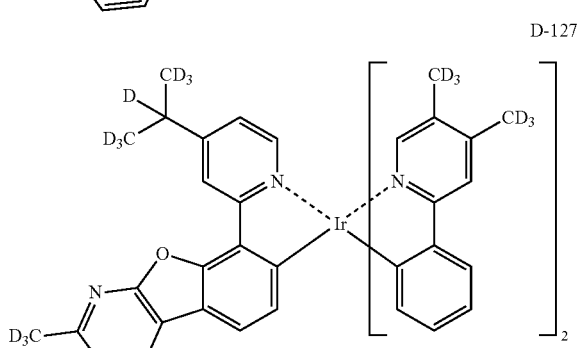
D-126

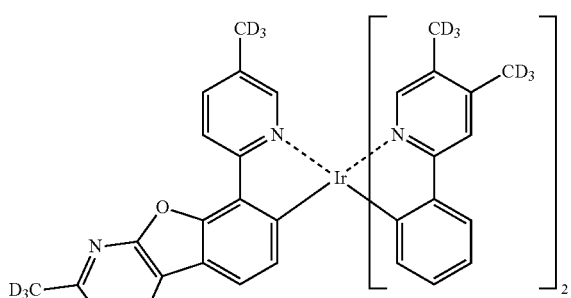
D-127

D-128

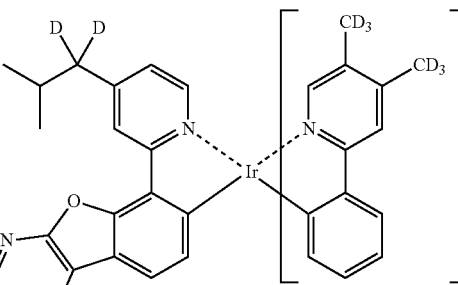
D-129

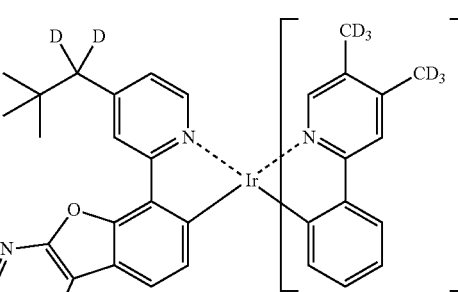
D-130

Hereinafter, the organic electroluminescent device to which the aforementioned organic electroluminescent compound or the organic electroluminescent material is applied will be described.

The organic electroluminescent device according to one embodiment may comprise a first electrode; a second electrode; and at least one organic layer between the first and second electrodes.

The compound represented by formula 1 of the present disclosure may be included in one or more layers constituting the organic electroluminescent device. According to one embodiment, the organic layer includes a light-emitting layer containing an organic electroluminescent compound according to the present disclosure. For example, the light-emitting layer may include solely of the organic electroluminescent compound of the present disclosure or at least two species of the organic electroluminescent compound of the present disclosure, and may further comprise conventional materials included in the organic electroluminescent material.

In addition, the organic layer may further comprise at least one layer selected from a hole injection layer, a hole transport layer, a hole auxiliary layer, a light-emitting auxiliary layer, an electron transport layer, an electron injection layer, an interlayer, a hole blocking layer, an electron blocking layer, and an electron buffer layer in addition to a light-emitting layer. Each layer may further consist of several layers. Also, the organic layer may further comprise at least one compound selected from the group consisting of an arylamine-based compound and a styrylarylamine-based compound, and further comprise at least one metal selected from the group consisting of metals of Group 1, metals of Group 2, transition metals of the 4$^{th}$ period, transition metals of the 5$^{th}$ period, lanthanides, and organic metals of the d-transition elements of the Periodic Table, or at least one complex compound comprising such a metal.

An organic electroluminescent material according to one embodiment may be used as light-emitting materials for a white organic light-emitting device. The white organic light-emitting device has suggested various structures such as a parallel side-by-side arrangement method, a stacking arrangement method, or color conversion material (CCM) method, etc., according to the arrangement of R (Red), G (Green), YG (yellowish green), or B (blue) light-emitting units. In addition, the organic electroluminescent material according to one embodiment may also be applied to the organic electroluminescent device comprising a QD (quantum dot).

One of the first electrode and the second electrode may be an anode and the other may be a cathode, Wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode.

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. The hole injection layer may be doped as a p-dopant. Also, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole transport layer or the electron blocking layer may be multi-layers, and wherein each layer may use a plurality of compounds.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both electrode(s). Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer, Preferably, the chalcogenide includes $SiO_X(1 \leq X \leq 2)$, $AlO_X(1 \leq X \leq 1.5)$, SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

Further, in the organic electroluminescent device of the present disclosure, preferably, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium, Preferably, the oxidative dopant includes various Lewis acids and acceptor compounds, and the reductive dopant includes alkali metals, alkali metal compounds, alkaline earth metals, rare-earth metals, and mixtures thereof. A reductive dopant layer may be employed as a charge generating layer to prepare an organic electroluminescent device having two or more light-emitting layers and emitting white light.

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used.

When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

When forming a layer by the host compound and the dopant compound according to one embodiment, co-evaporation or mixture-evaporation may be used, but are not limited thereto. The co-deposition is a mixed deposition method in which two or more isomer materials are put into respective individual crucible sources and a current is applied to both cells simultaneously to evaporate the materials and to perform mixed deposition; and the mixed deposition is a mixed deposition method in which two or more isomer materials are mixed in one crucible source before deposition, and then a current is applied to one cell to evaporate the materials.

According to one embodiment, the organic electroluminescent device of the present disclosure can be used for the manufacture of display devices such as smartphones, tablets, notebooks, PCs, TVs, or display devices for vehicles, or lighting devices such as outdoor or indoor lighting.

Hereinafter, the preparation method of compounds according to the present disclosure will be explained with reference to the synthesis method of a representative compound or the intermediate compound of the present disclosure in order to understand the present disclosure in detail.

[Example 1] Preparation of Compound C-24

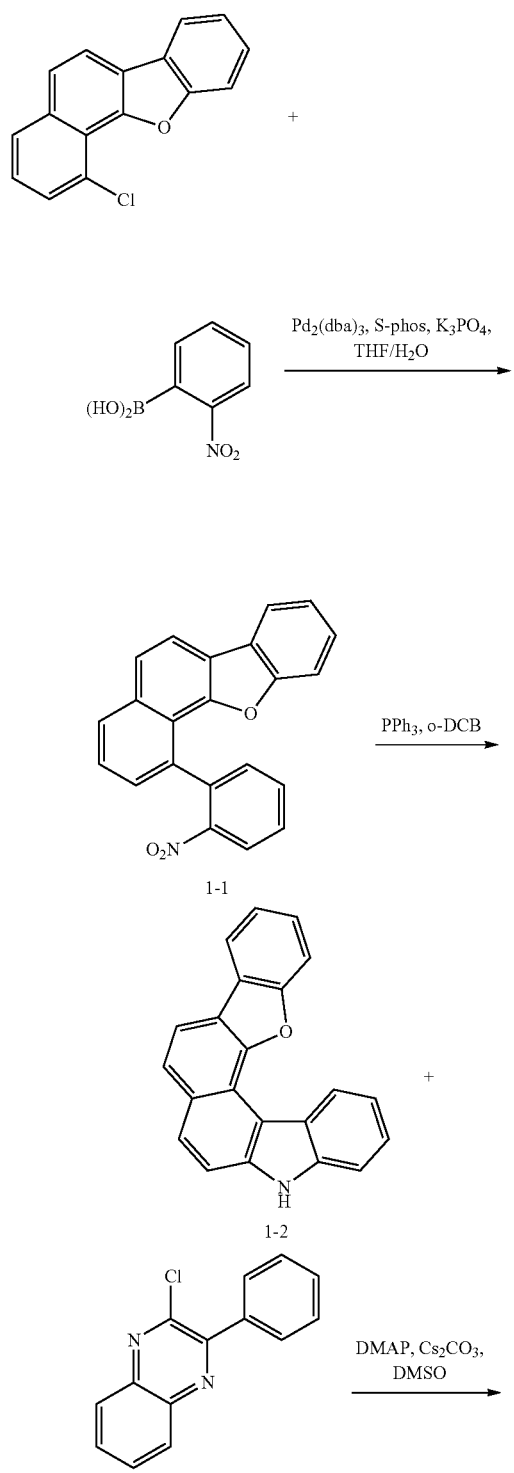

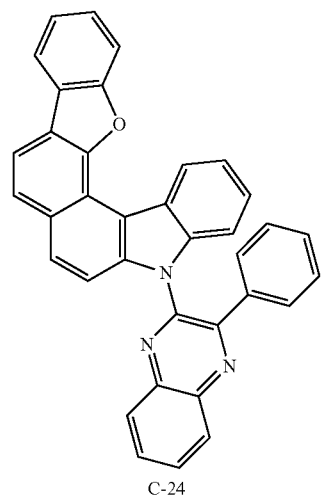

1) Synthesis of Compound 1-1

1-chloronaphtho[1,2-b]benzofuran (40.0 g, 158.3 mmol), (2-nitrophenyl)boronic acid (160.0 g, 949.7 mmol), Pd$_2$(dba)$_3$ (14.5 g, 15.8 mmol), S-phos (13.0 g, 31.7 mmol), and K$_3$PO$_4$ (84.0 g, 395.5 mmol) were introduced into a flask and dissolved in 800 mL of THF and 200 mL of H$_2$O, and then stirred under reflux for 24 hours. After completion of the reaction by adding the distilled water thereto, the reaction mixture was extracted with ethylene acetate/distilled water (EA/H$_2$O), and then purified by column chromatography to obtain the compound 1-1 (39.4 g, yield: 59%).

2) Synthesis of Compound 1-2

Compound 1-1 (39.4 g, 116.1 mmol) and PPh$_3$ (76.0 g, 290.3 mmol) were introduced into a flask and dissolved in 580 mL of o-DCB, and then stirred under reflux for 22 hours. After completion of the reaction, the reaction mixture was distilled and then purified by column chromatography to obtain the compound 1-2 (30.2 g, yield: 85%).

3) Synthesis of Compound C-24

Compound 1-2 (5.0 g, 16.3 mmol), 2-chloro-3-phenylquinoxaline (5.9 g, 24.4 mmol), DMAP (1.0 g, 8.1 mmol), and Cs$_2$CO$_3$ (8.0 g, 20.0 mmol) were introduced into a flask and dissolved in 80 mL of DMSO, and then stirred under reflux for 5 hours. After completion of the reaction, the reaction mixture was extracted with EA/H$_2$O, and then purified by column chromatography to obtain the compound C-24 (4.2 g, yield: 51%).

|  | MW | M.P |
|---|---|---|
| C-24 | 511.57 | 281.1° C. |

[Example 2] Preparation of Compound C-1

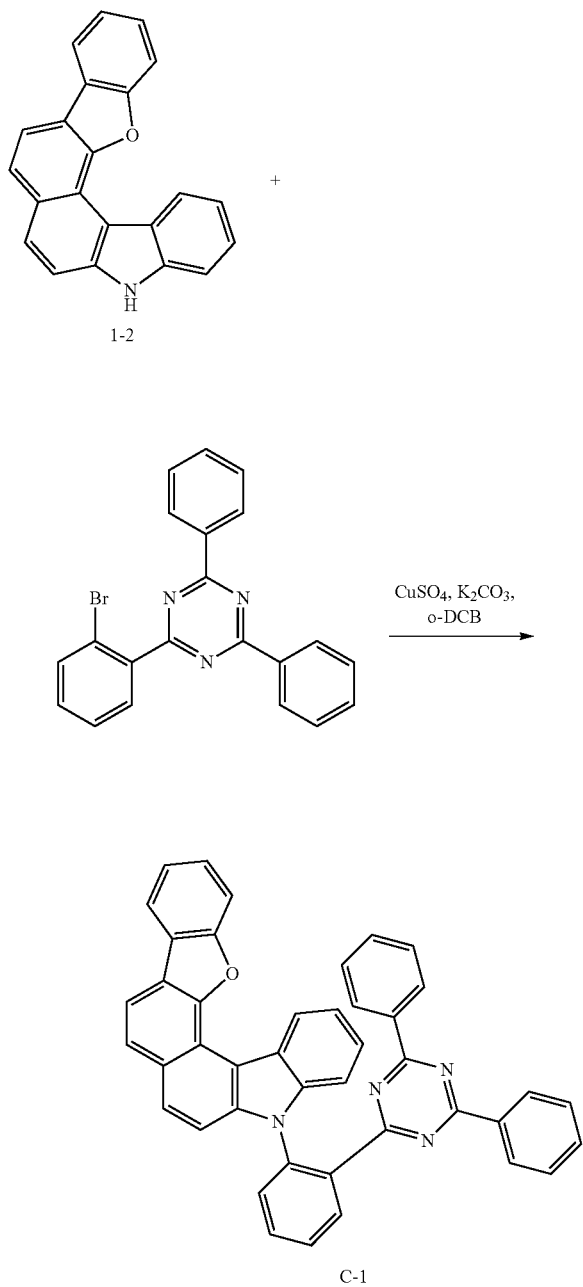

Compound 1-2 (7.0 g, 22.8 mmol), 2-(2-bromophenyl)-4,6-diphenyl-1,3,5-triazine (8.8 g, 22.8 mmol), CuSO₄ (1.8 g, 11.4 mmol), and K₂CO₃ (6.3 g, 45.6 mmol) were introduced into a flask and dissolved in 120 mL of o-DCB, and then stirred under reflux for 3 hours. After completion of the reaction, the reaction mixture was distilled, and then purified by column chromatography to obtain the compound C-1 (4.2 g, yield: 51%).

|  | MW | M.P |
|---|---|---|
| C-1 | 614.69 | 305.6° C. |

[Example 3] Preparation of Compound C-38

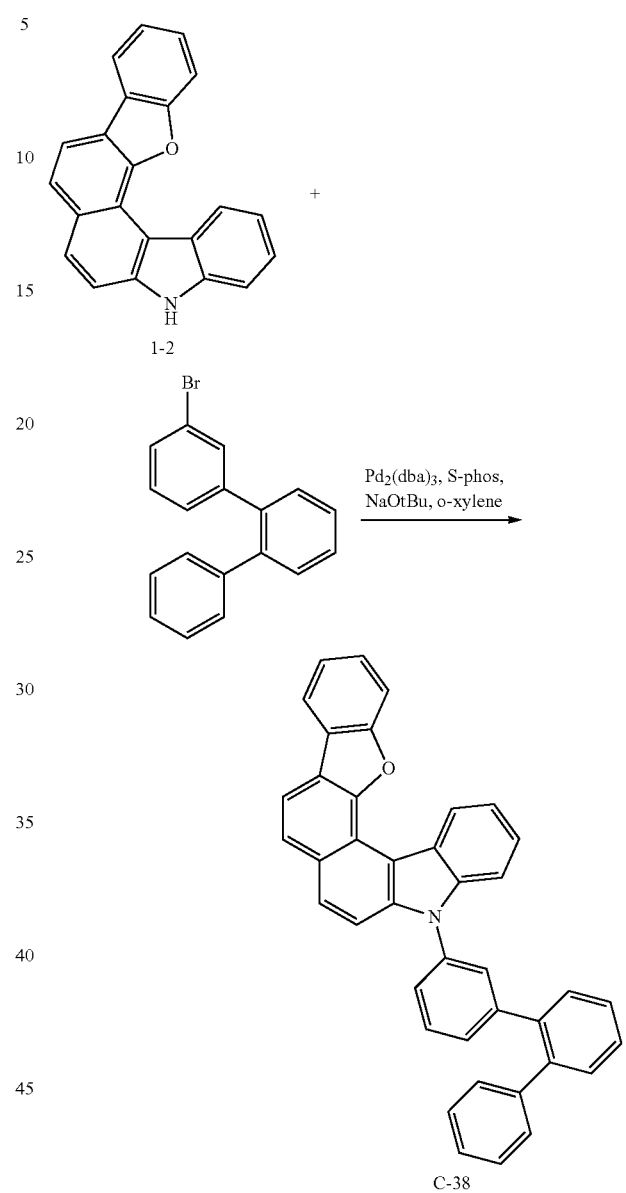

Compound 1-2 (4.0 g, 13.0 mmol), 3-bromo-1,1':2',1''-terphenyl (4.0 g, 13.0 mmol), Pd₂(dba)₃ (0.6 g, 0.6 mmol), S-phos (0.5 g, 1.3 mmol), and NaOtBu (3.7 g, 39.0 mmol) were introduced into a flask and dissolved in 65 mL of o-xylene, and then stirred under reflux for 12 hours. After completion of the reaction, the reaction mixture was extracted with EA/H₂O, and then purified by column chromatography to obtain the compound C-38 (3.3 g, yield: 47%).

|  | MW | M.P |
|---|---|---|
| C-38 | 535.6 | 193.0° C. |

[Example 4] Preparation of Compound C-41

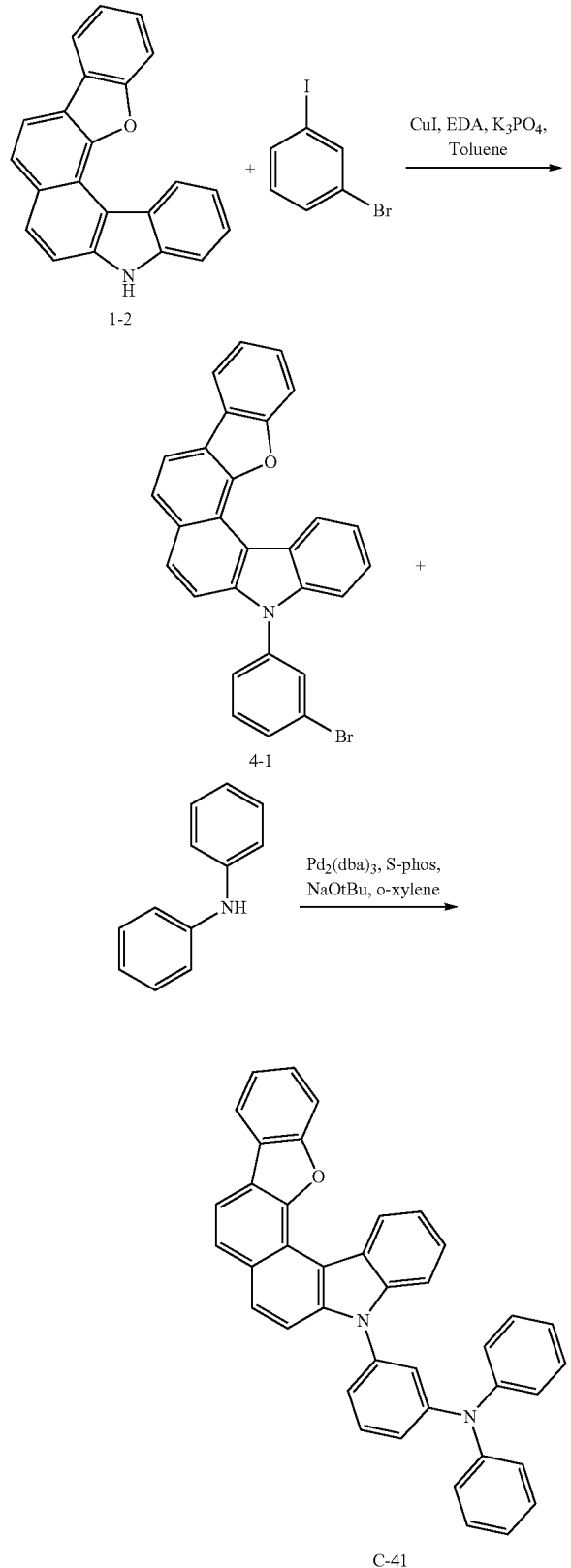

1) Synthesis of Compound 4-1

Compound 1-2 (6.0 g, 19.5 mmol), 1-bromo-3-iodobenzene (11.0 g, 39.0 mmol), CuI (1.9 g, 9.8 mmol), ethylenediamine (EDA) (1.3 mL, 19.5 mmol), and $K_3PO_4$ (10.3 g, 48.8 mmol) were introduced into a flask and dissolved in 100 mL of toluene, and then stirred under reflux for 4 hours. After completion of the reaction, the reaction mixture was extracted with $EA/H_2O$, and then purified by column chromatography to obtain the compound 4-1 (4.8 g, yield: 53%).

2) Synthesis of Compound C-41

Compound 4-1 (4.8 g, 10.4 mmol), diphenylamine (1.8 g, 10.4 mmol), $Pd_2(dba)_3$ (0.5 g, 0.52 mmol), S-phos (0.4 g, 1.0 mmol), and NaOtBu (3.0 g, 31.1 mmol) were introduced into a flask and dissolved in 52 mL of o-xylene, and then stirred under reflux for 3 hours. After completion of the reaction, the reaction mixture was extracted with $EA/H_2O$, and then purified by column chromatography to obtain the compound C-41 (2.2 g, yield: 39%).

|      | MW    | M.P       |
|------|-------|-----------|
| C-41 | 550.6 | 260.6° C. |

Hereinafter, the luminescent properties of an organic electroluminescent device comprising an organic electroluminescent compound of the present disclosure will be explained in order to understand the present disclosure in detail.

[Device Examples 1 and 2] Preparation of OLEDs Comprising the Host Compound According to the Present Disclosure OLEDs were produced by using the organic electroluminescent compound according to the present disclosure, First, a transparent electrode indium tin oxide (ITO) thin film (10 Ω/sq) on a glass substrate for an OLED (GEOMATEC CO., LTD., Japan) was subjected to an ultrasonic washing with acetone, ethanol, and distilled water, sequentially, and thereafter was stored in isopropanol and then used. Next, the ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr, Thereafter, an electric current was applied to the cell to evaporate the introduced material, thereby forming a first hole injection layer having a thickness of 80 nm on the ITO substrate. Compound HI-2 was then introduced into another cell of the vacuum vapor deposition apparatus, and an electric current was applied to the cell to evaporate the introduced material, thereby forming a second hole injection layer having a thickness of 5 nm on the first hole injection layer. Next, compound HT-1 was introduced into another cell of the vacuum vapor deposition apparatus, Thereafter, an electric current was applied to the cell to evaporate the introduced material, thereby forming a first hole transport layer having a thickness of 10 nm on the second hole injection layer. Compound HI-2 was then introduced into another cell of the vacuum vapor deposition apparatus, and an electric current was applied to the cell to evaporate the introduced material, thereby forming a second hole transport layer having a thickness of 60 nm on the first hole transport layer. After forming the hole injection layers and the hole transport layers, a light-emitting layer was then deposited thereon as follows: the compound listed in the following Table 1 as a host was introduced into one cell of the vacuum vapor deposition apparatus and compound D-39 was introduced into another cell as a dopant, and the two materials were evaporated at different rate. The dopant was doped in a doping amount of 3 wt %, respectively, to form a light-emitting layer having a thickness of 40 nm on the second hole transport layer. Next, Compounds ET-1 and EI-1 were introduced into another cell, were evaporated at a rate of 1:1, and were deposited to form an electron transport layer having a thickness of 35 nm on the light-emitting layer. After depositing Compound EI-1 as an electron injection layer having a thickness of 2 nm on the electron transport layer, an Al cathode having a thickness of 80 nm was deposited on the electron injection layer by another vacuum vapor deposition apparatus. Thus, OLEDs were produced.

[Device Comparative Example 1] Preparation of OLED Comprising the Conventional Host Compound as a Host An OLED was produced in the same manner as in Device Example 1, except that Compound A was used as the host of the light-emitting layer.

The driving voltage, the luminous efficiency, and the CIE color coordinates at a luminance of 1,000 nits, of the organic electroluminescent device according to Device Examples 1 and 2 and Device Comparative Example 1 produced as described above, were measured, and the results thereof are shown in the following Table 1.

TABLE 1

| | Host Material | Driving Voltage (V) | Luminous Efficiency (cd/A) | Color Coordinates CIE | |
|---|---|---|---|---|---|
| | | | | x | y |
| Device Comparative Example 1 | Compound A | 4.9 | 29.1 | 0.654 | 0.345 |
| Device Example 1 | C-24 | 4.9 | 31.5 | 0.655 | 0.345 |
| Device Example 2 | C-1 | 4.8 | 32.5 | 0.653 | 0.344 |

[Device Examples 3 and 4] Preparation of OLEDs Comprising the Host Compound According to the Present Disclosure OLEDs were produced in the same manner as in Device Example 1, except that the compounds shown in the following Table 2 as the first host and the second host were introduced into two cells in the vacuum vapor deposition apparatus, compound D-71 as a dopant was introduced into another cell, the two host materials were evaporated at a rate of 1:1 and simultaneously, the dopant material was evaporated at a different rate, and the dopant was doped in a doping amount of 3 wt % with respect to the total amount of the host and dopant to form a light-emitting layer having a thickness of 40 nm on the hole transport layer.

The driving voltage, the luminous efficiency, and the CIE color coordinates at a luminance of 1,000 nits, of the organic electroluminescent device according to Device Examples 3 and 4 produced as described above, were measured, and the results thereof are shown in the following Table 2.

TABLE 2

| | First Host | Second Host | Driving Voltage (V) | Luminous Efficiency (cd/A) | Color Coordinates CIE | |
|---|---|---|---|---|---|---|
| | | | | | x | y |
| Device Example 3 | C-38 | H-1 | 3.6 | 28.1 | 0.653 | 0.344 |
| Device Example 4 | C-41 | C-1 | 3.6 | 29.4 | 0.654 | 0.344 |

[Device Example 5] Preparation of OLED Comprising the Host Compound According to the Present Disclosure OLED was produced by using the organic electroluminescent compound according to the present disclosure. First, a transparent electrode indium tin oxide (ITO) thin film (10 Ω/sq) on a glass substrate for an OLED (GEOMATEC CO., LTD., Japan) was subjected to an ultrasonic washing with acetone, ethanol, and distilled water, sequentially, and thereafter was stored in isopropanol and then used. Next, the ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr, Thereafter, an electric current was applied to the cell to evaporate the introduced material, thereby forming a first hole injection layer having a thickness of 80 nm on the ITO substrate. Compound HI-2 was then introduced into another cell of the vacuum vapor deposition apparatus, and an electric current was applied to the cell to evaporate the introduced material, thereby forming a second hole injection layer having a thickness of 5 nm on the first hole injection layer. Next, compound HT-1 was introduced into another cell of the vacuum vapor deposition apparatus. Thereafter, an electric current was applied to the cell to evaporate the introduced material, thereby forming a first hole transport layer having a thickness of 10 nm on the second hole injection layer. Compound HT-3 was introduced into another cell of the vacuum vapor deposition apparatus. Thereafter, an electric current was applied to the cell to evaporate the introduced material, thereby forming a second hole transport layer having a thickness of 30 nm on the first hole transport layer. After forming the hole injection layers and the hole transport layers, a light-emitting layer was then deposited thereon as follows: the respective compounds listed in the following Table 3 as a first host and a second host were introduced into the two cells of the vacuum vapor deposition apparatus and the compound D-50 was introduced into another cell as a dopant. The two host materials were evaporated at a different rate of 2:1 and simultaneously, the dopant was evaporated at a different rate. The dopant was doped in a doping amount of 10 wt % with respect to the total amount of the host and dopant, to form a light-emitting layer having a thickness of 40 nm on the second hole transport layer. Next, Compounds ET-1 and EI-1 were introduced into another two cells, were evaporated at a rate of 4:6, respectively, and were deposited to form an electron transport layer having a thickness of 35 nm on the light-emitting layer. Thereafter, compound EI-1 having a thickness of 2 nm was deposited as an electron injection layer, and an Al cathode having a thickness of 80 nm was deposited by another vacuum vapor deposition apparatus. Thus, OLED was produced. Each compound was purified by vacuum sublimation under $10^{-6}$ torr and then used.

[Device Comparative Example 2] Preparation of OLED Comprising the Conventional Host Compound as a Host An OLED was produced in the same manner as in Device Example 5, except that compound B, instead of compound C-24, was used as the second host of the light-emitting layer.

The results of the driving voltage, the luminous efficiency, and the color coordinates at a luminance of 1,000 nits, and the time taken to reduce from 100% to 90% at a luminance of 20,000 nits (lifespan; T90) of the organic electroluminescent device according to Device Example 5 and Device Comparative Example 2 produced as described above, are shown in the following Table 3.

TABLE 3

| | First Host | Second Host | Driving Voltage (V) | Luminous Efficiency (cd/A) | Color Coordinates CIE x | Color Coordinates CIE y | lifespan (T90) (hr) |
|---|---|---|---|---|---|---|---|
| Device Example 5 | H-2 | C-24 | 3.1 | 83.7 | 0.351 | 0.616 | 137.0 |
| Device Comparative Example 2 | H-2 | Compound B | 3.2 | 70.9 | 0.349 | 0.617 | 11.6 |

Referring to Tables 1 to 3 above, it can be confirmed that the organic electroluminescent device comprising at least one of the organic electroluminescent compounds according to the present disclosure has a superior luminous property. In addition, the organic electroluminescent device comprising the organic electroluminescent compound according to the present disclosure as a second host material together with another first host material has improved lifespan characteristics, compared to the organic electroluminescent device comprising a conventional organic electroluminescent compound as a host.

The compounds used in Device Examples and Device Comparative Examples above are shown in the following Table 4.

TABLE 4

Hole Injection Layer/
Hole Transport Layer

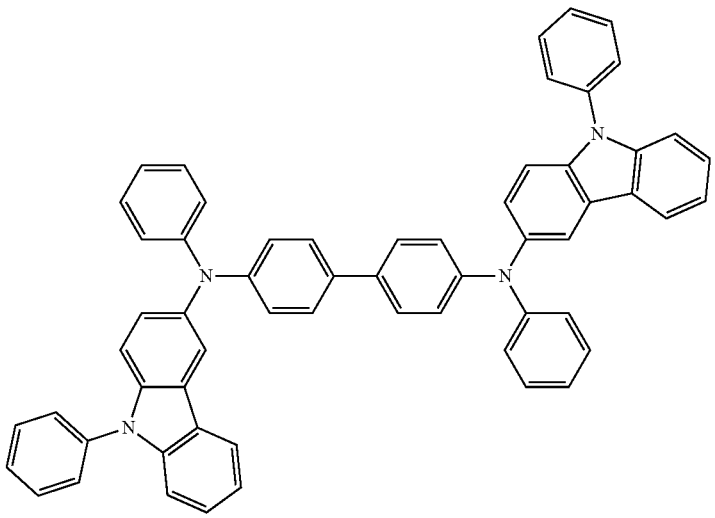

HI-1

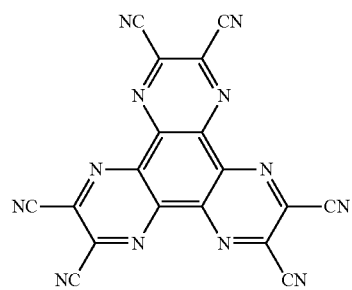

HI-2

TABLE 4-continued
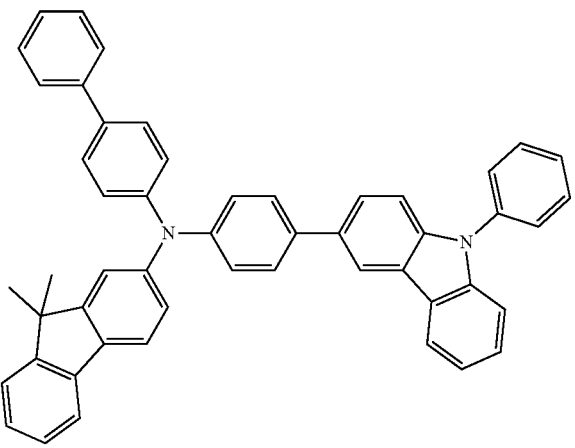
HT-1
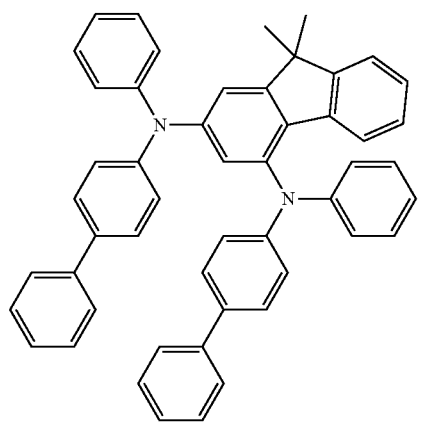
HT-2
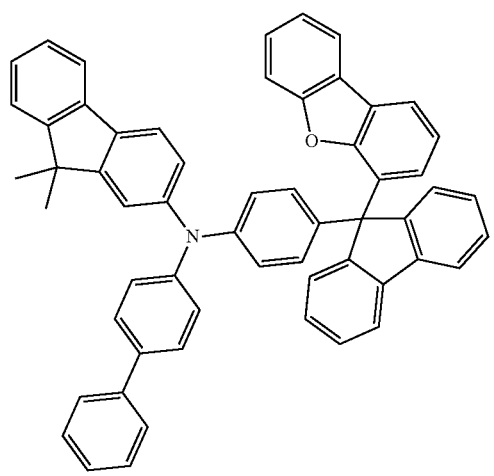
HT-3

TABLE 4-continued
Light-Emitting Layer
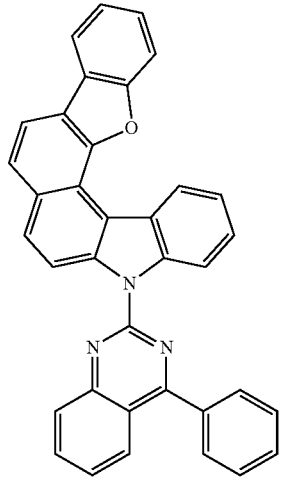
Compound A
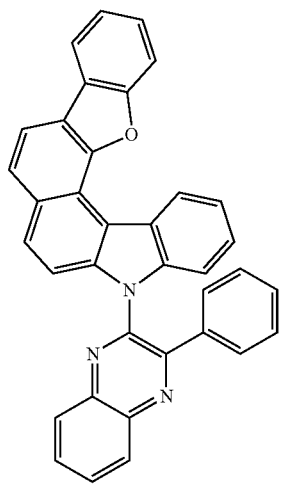
C-24
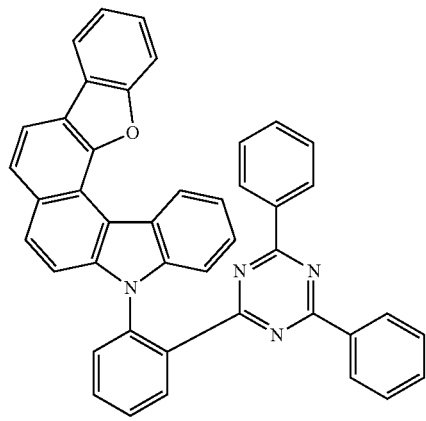
C-1

TABLE 4-continued
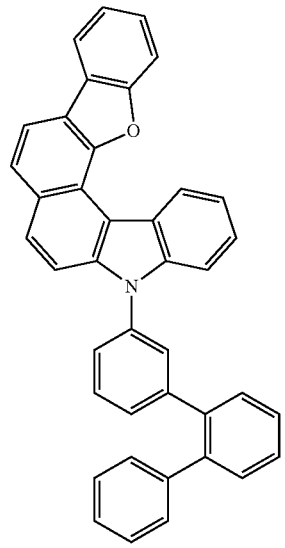
C-38
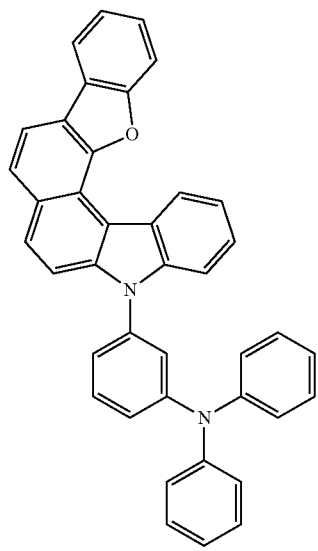
C-41
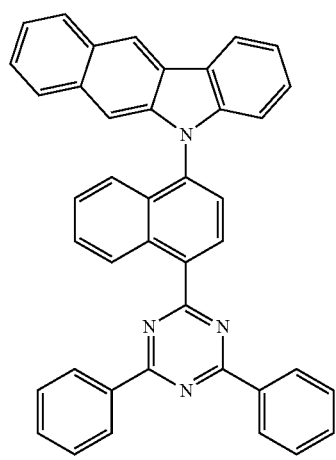
H-1

TABLE 4-continued
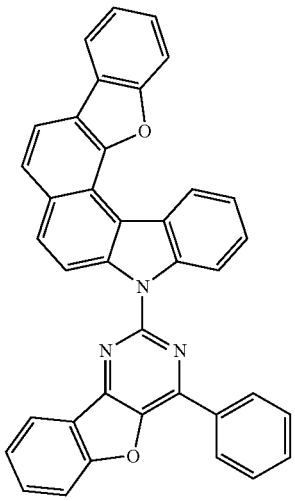
Compound B
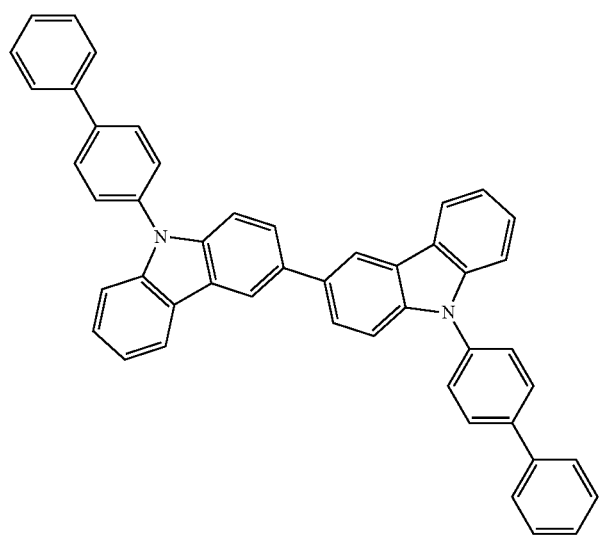
H-2
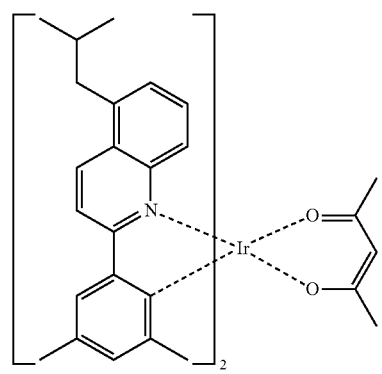
D-39

TABLE 4-continued
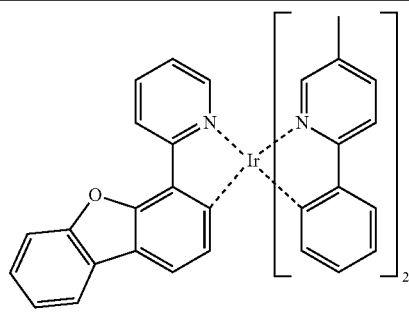
D-50
Electron Transport Layer/
Electron Injection Layer
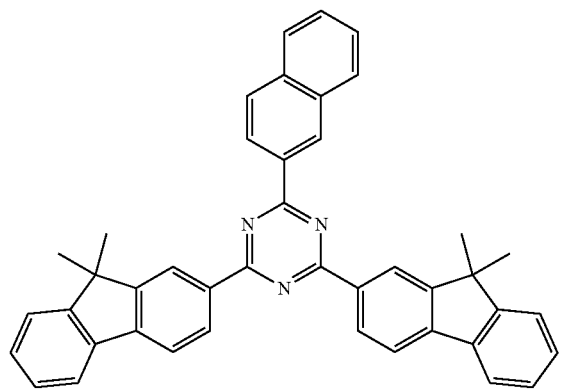
ET-1
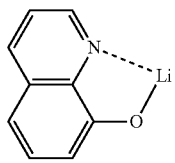
EI-1
The invention claimed is:
1. An organic electroluminescent compound selected from the following compounds:
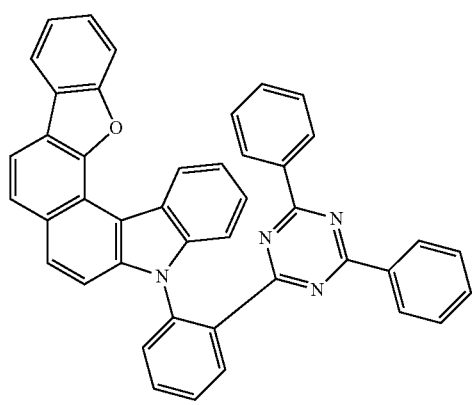
C-1
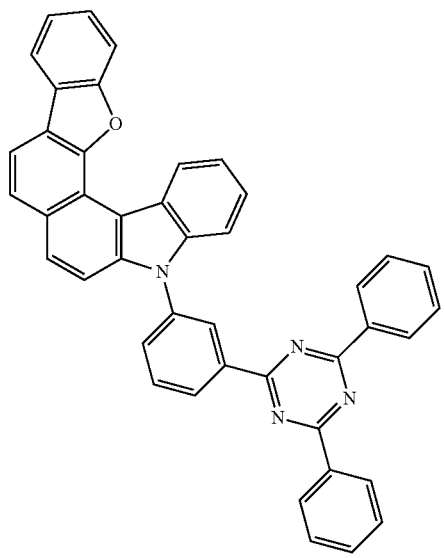
C-2

C-3
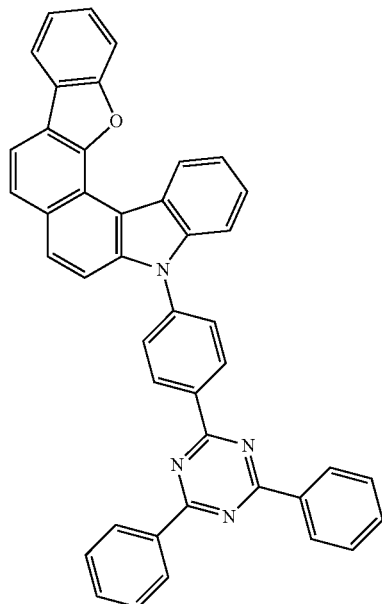
C-4
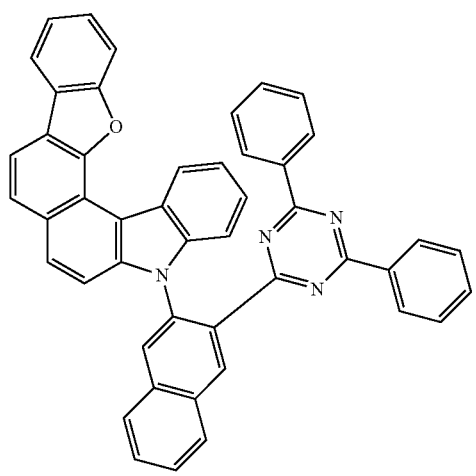
C-5
C-6
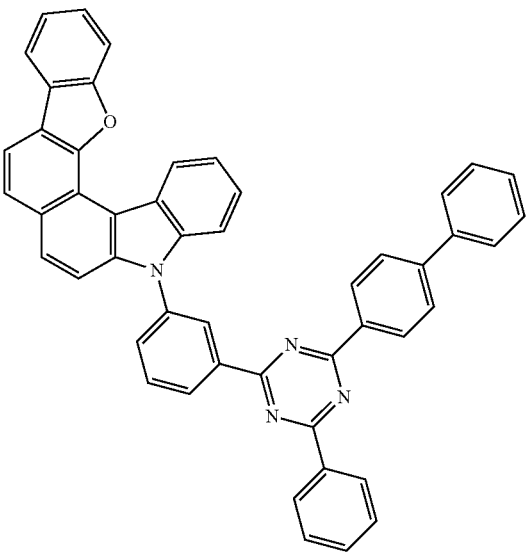
C-7
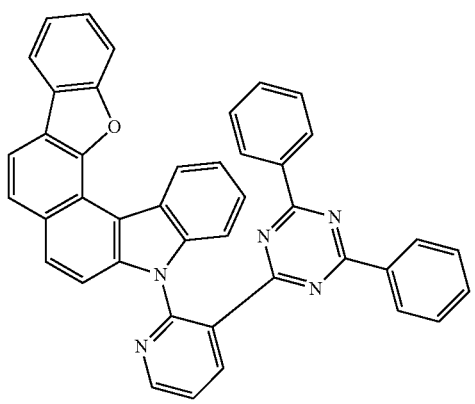
C-8
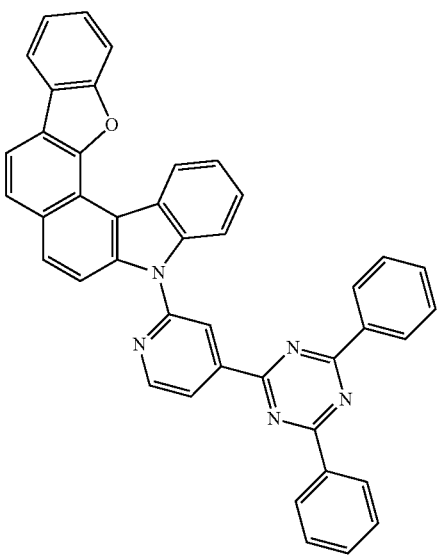

C-9
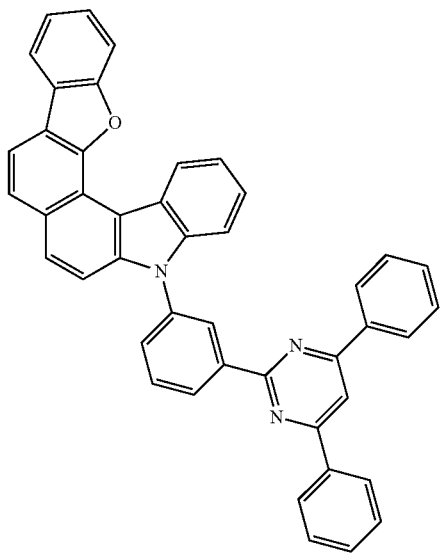
C-10
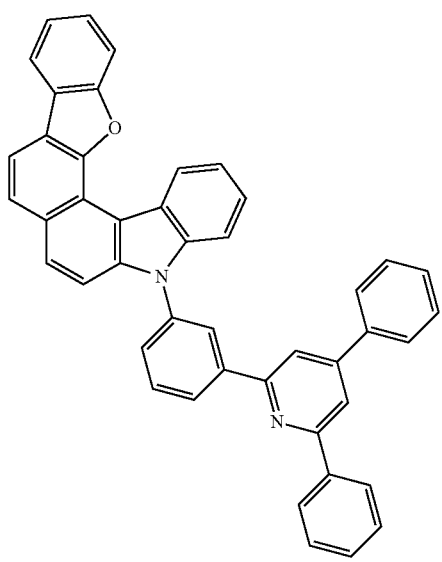
C-11
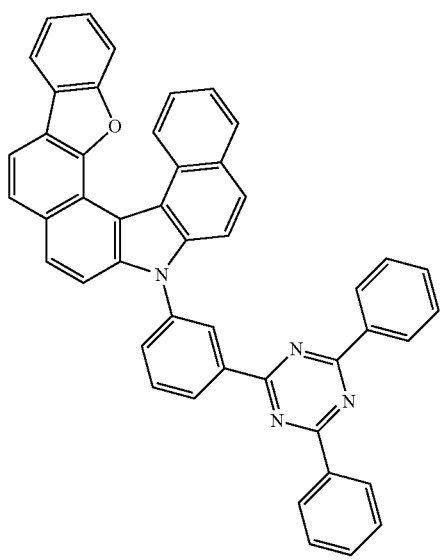
C-12
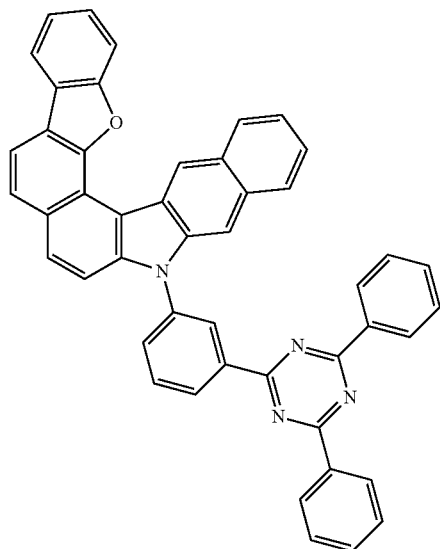
C-13
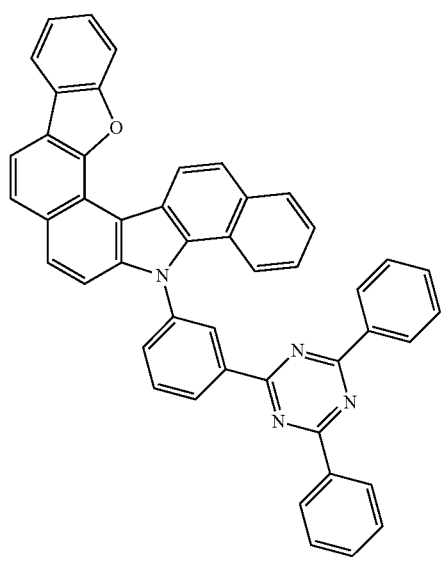
C-14
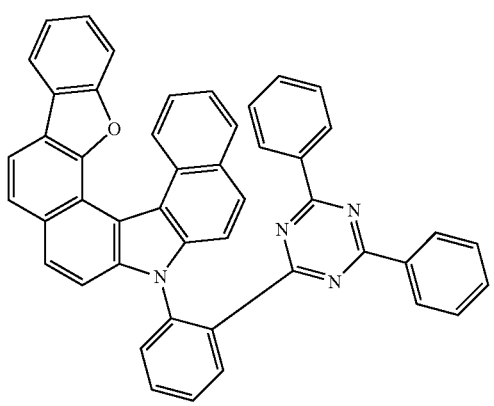

C-15
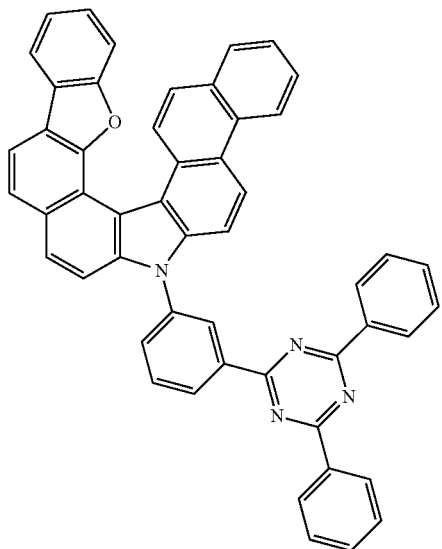
C-16
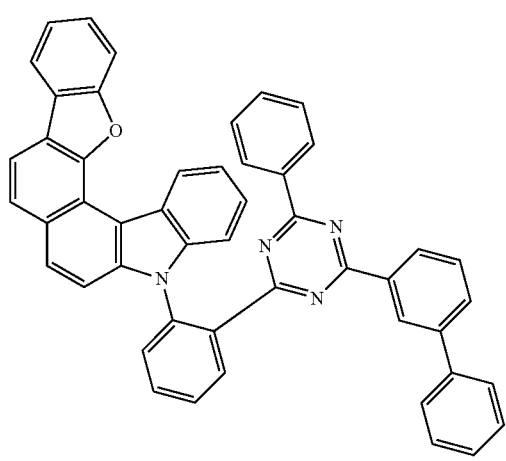
C-17
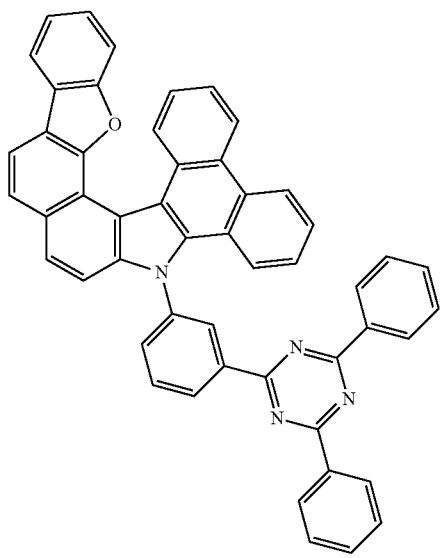
C-18
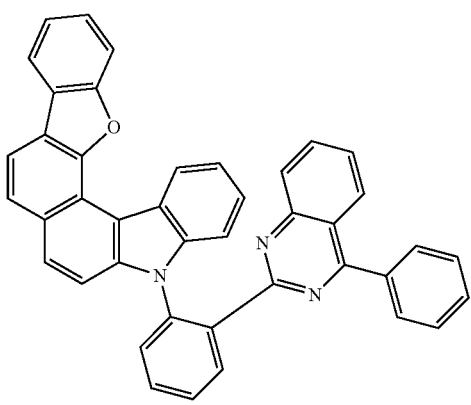
C-19
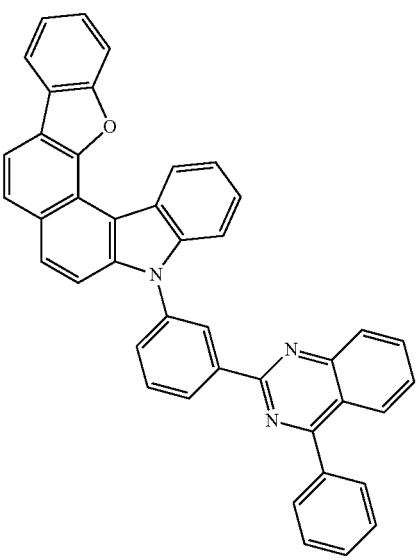
C-20
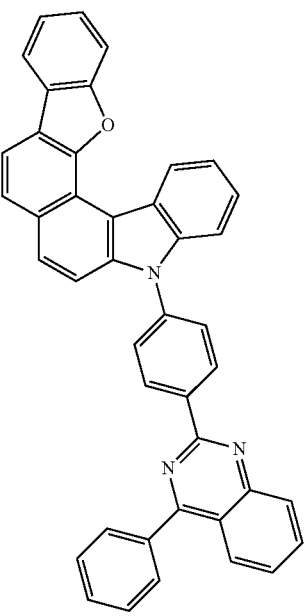

C-21
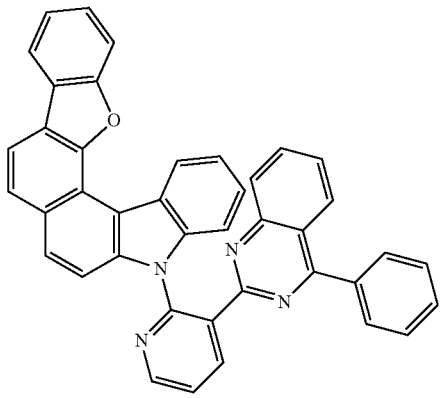
C-22
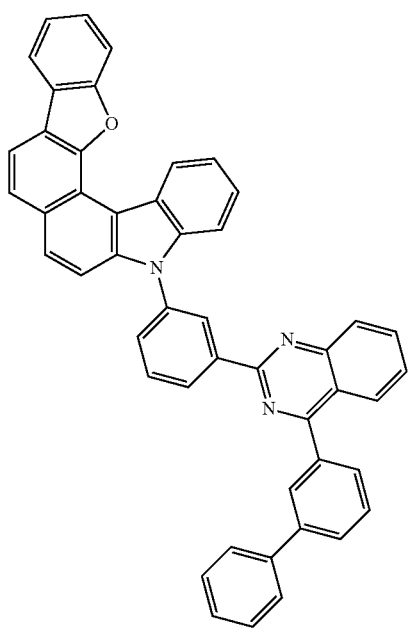
C-23
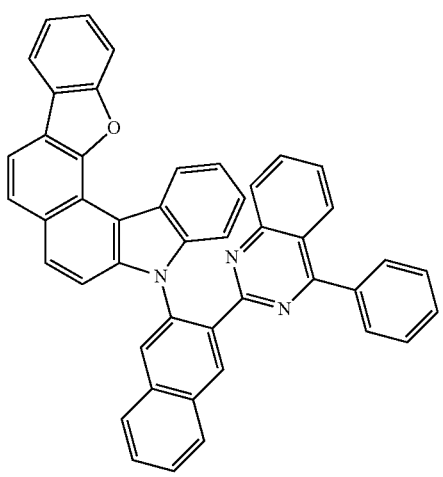
C-24
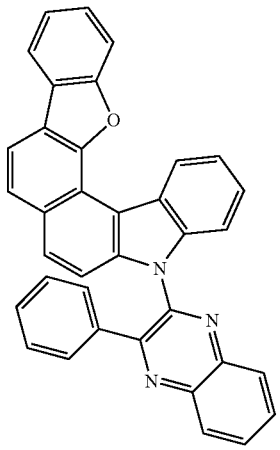
C-25
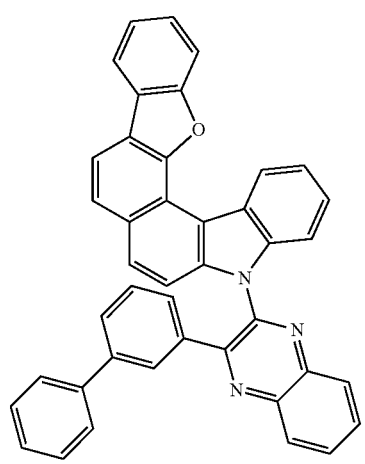
C-26
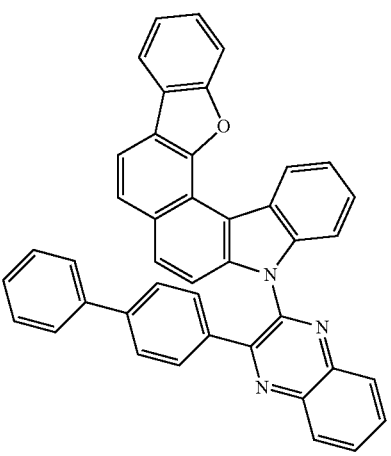

-continued
C-27
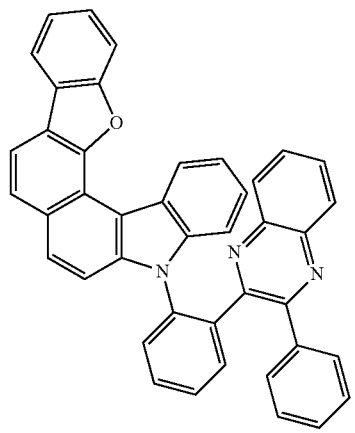
C-28
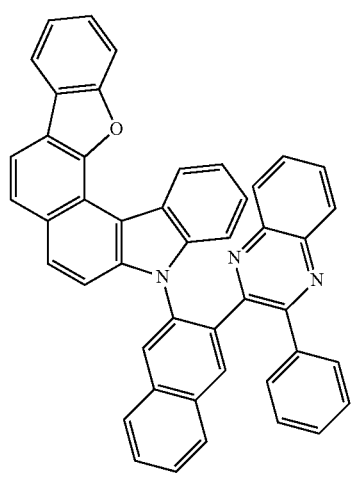
C-29
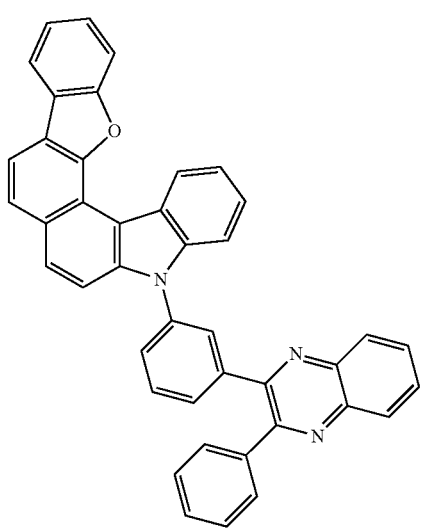
-continued
C-30
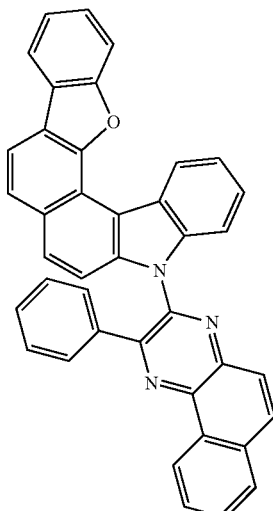
C-31
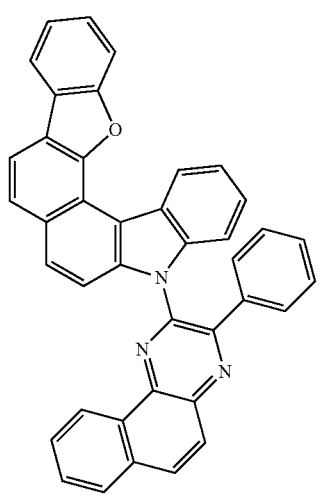
C-32
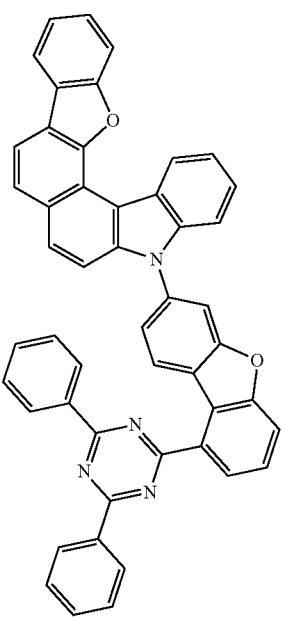

C-33
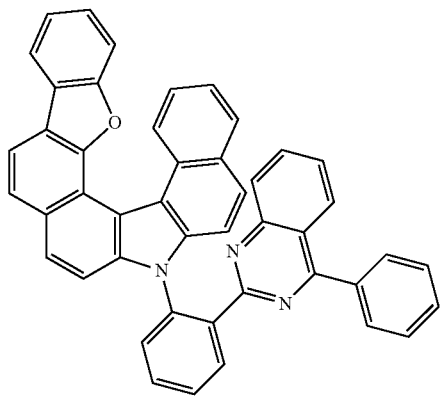
C-34
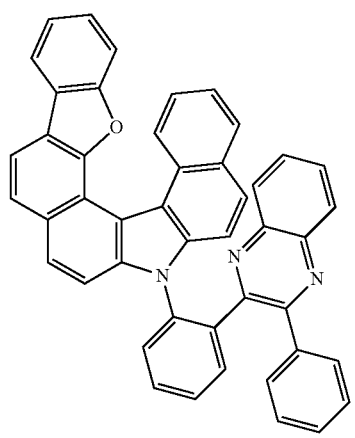
C-35
C-36
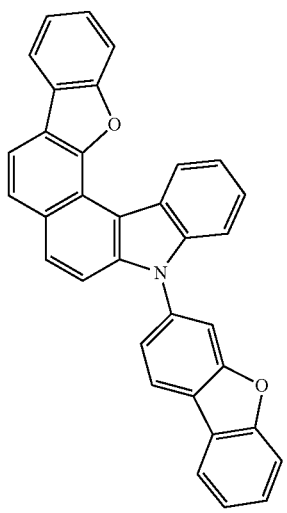
C-37
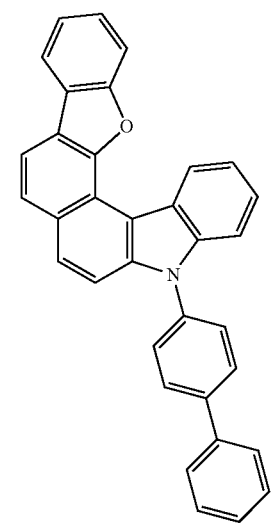
C-38
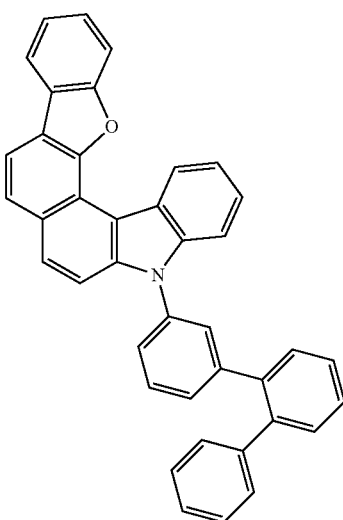

C-39
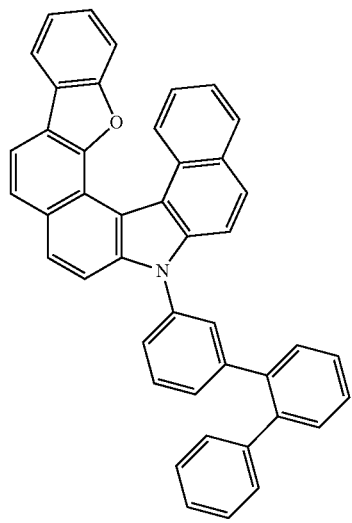
C-40
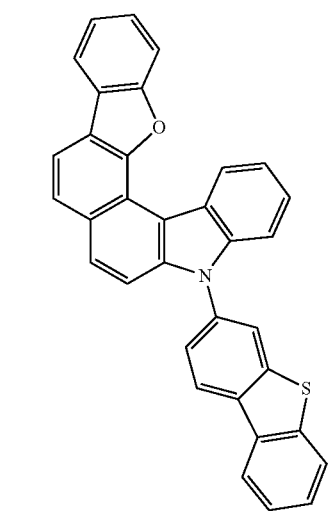
C-41
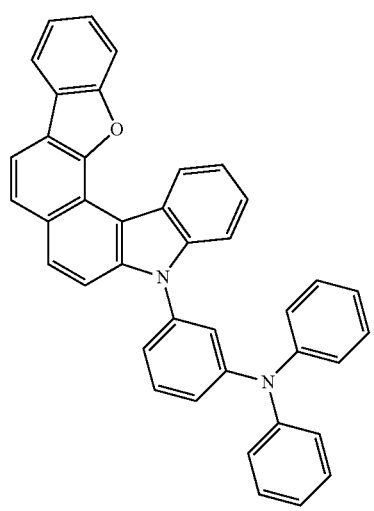
C-42
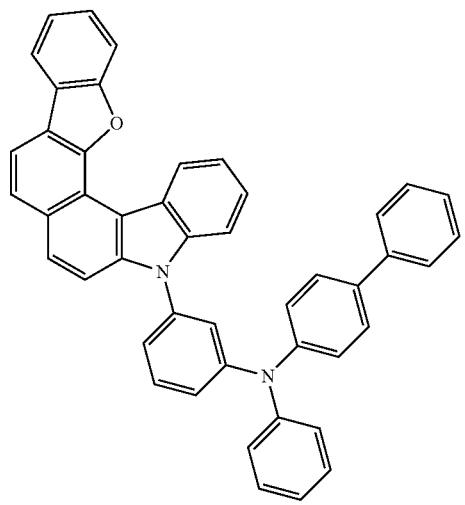
C-43
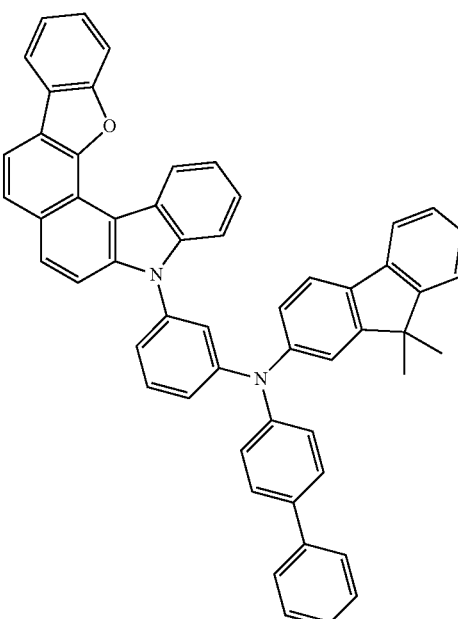
C-44
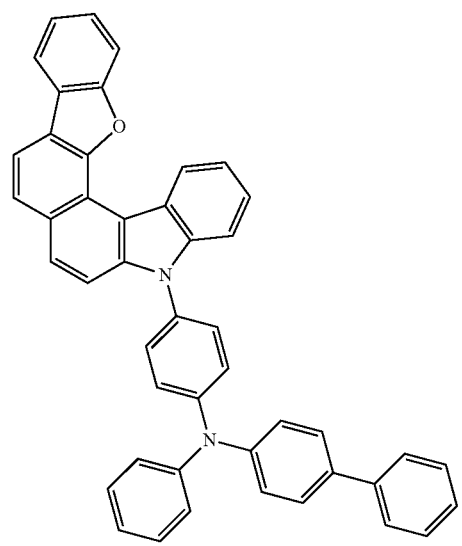

C-45
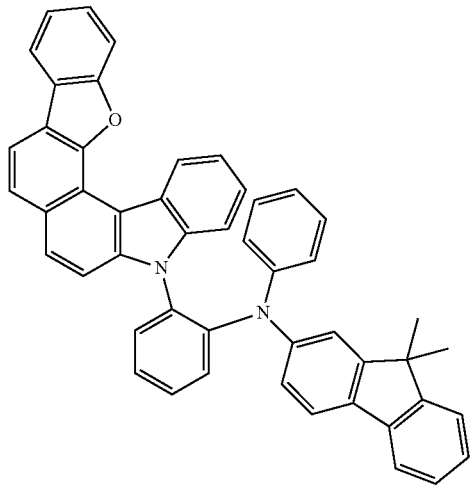
C-46
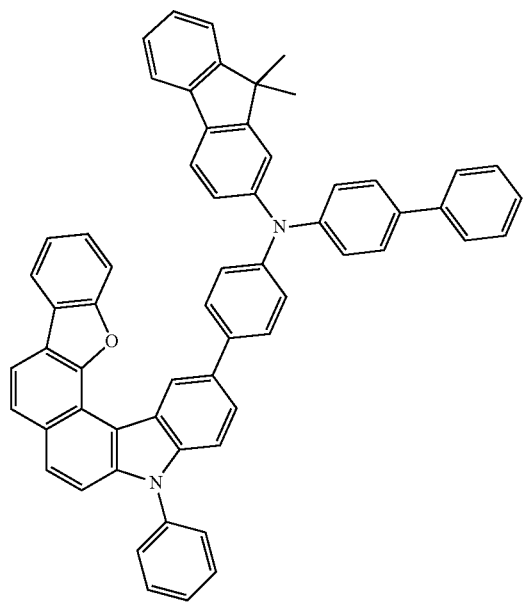
C-47
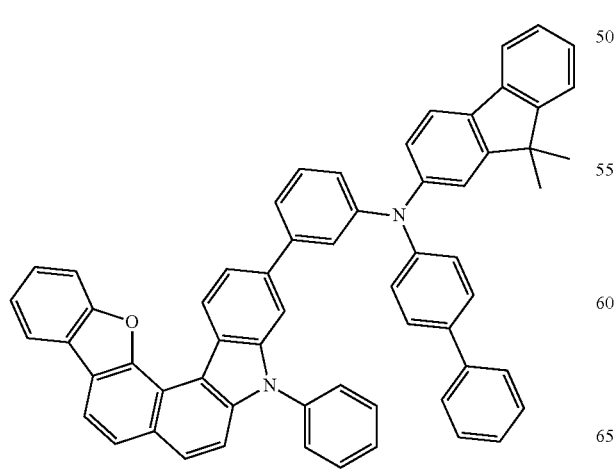
C-48
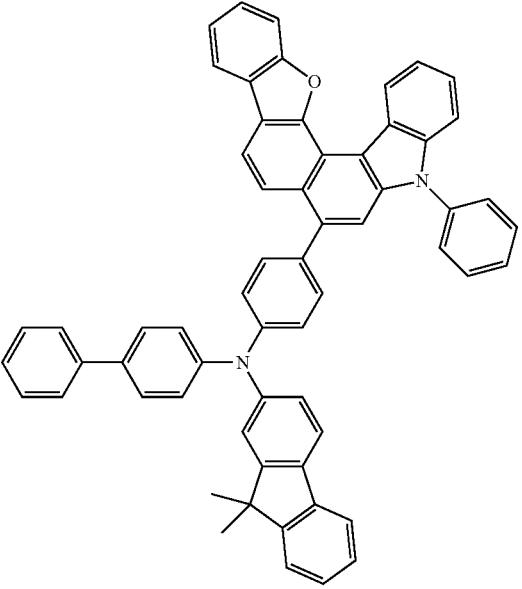
C-49
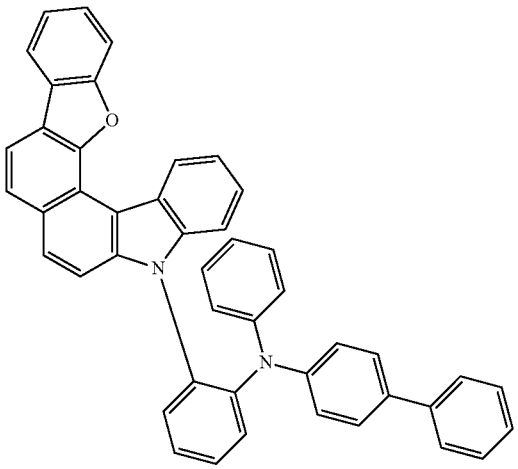
C-50
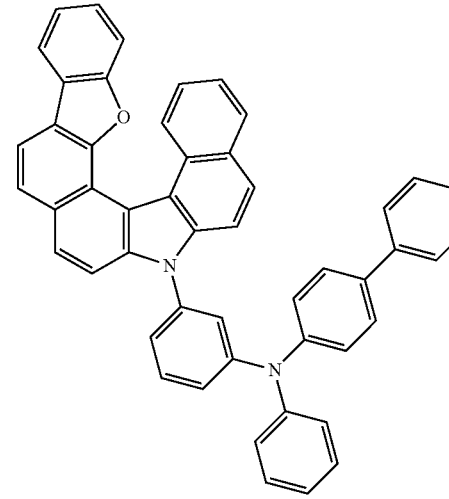

C-51
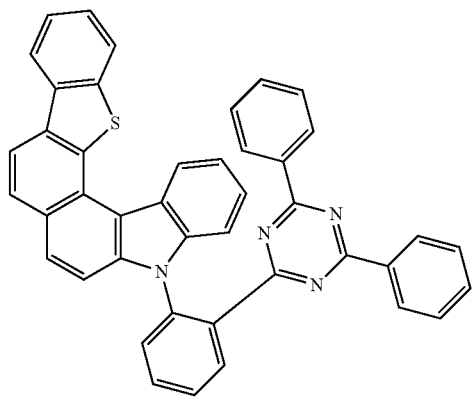
C-52
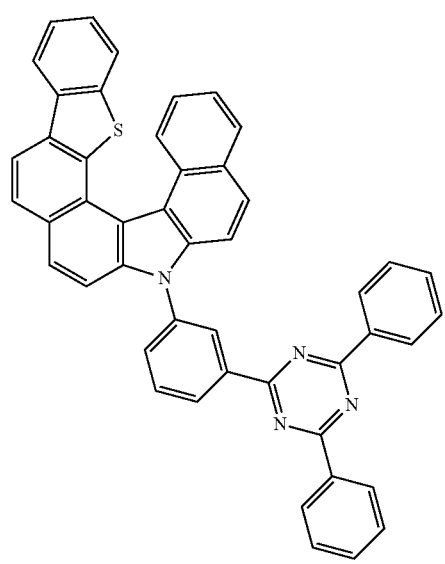
C-53
C-54
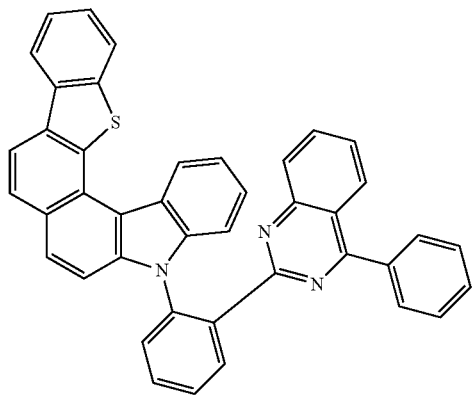
C-55
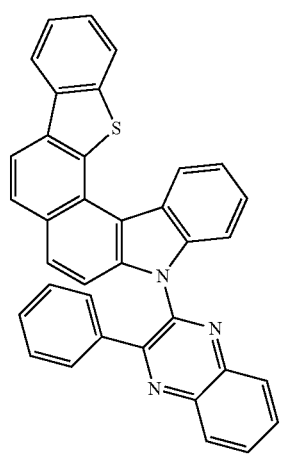
C-56
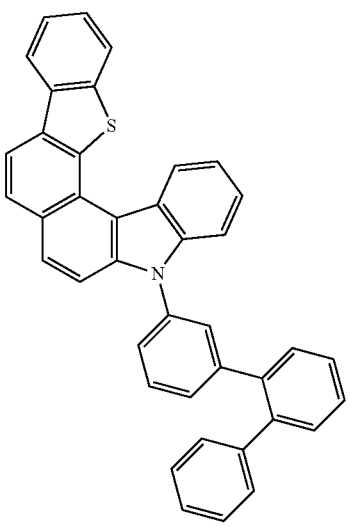

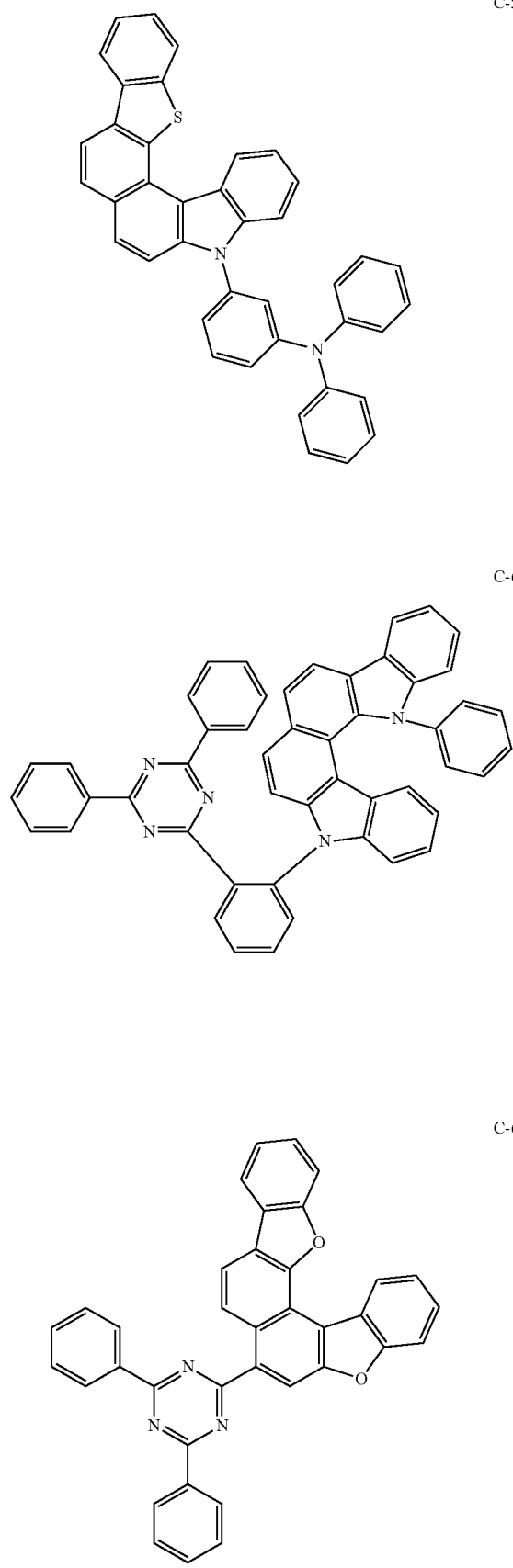
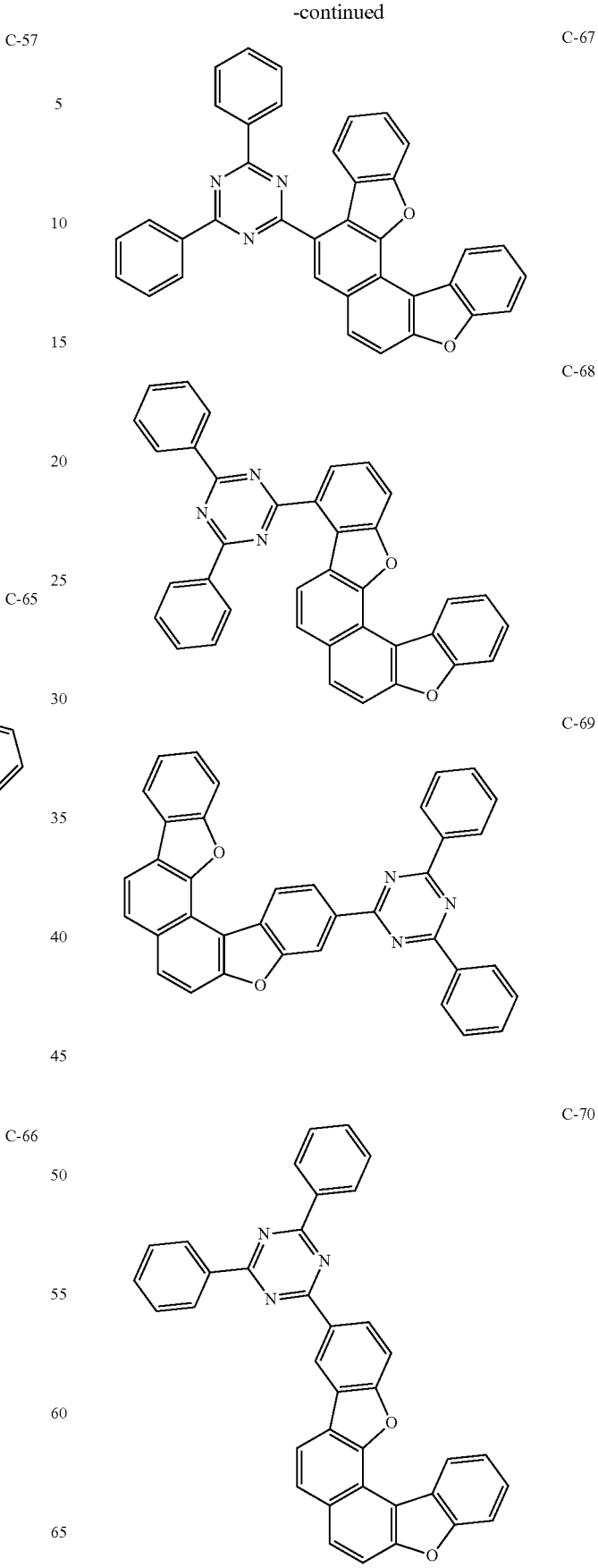

C-71
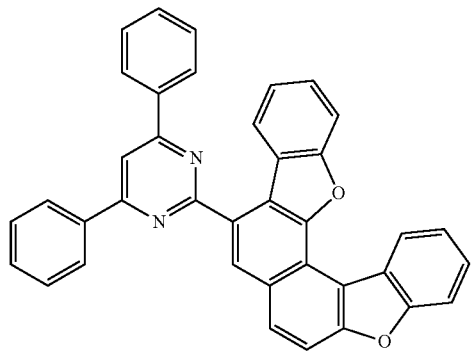
C-72
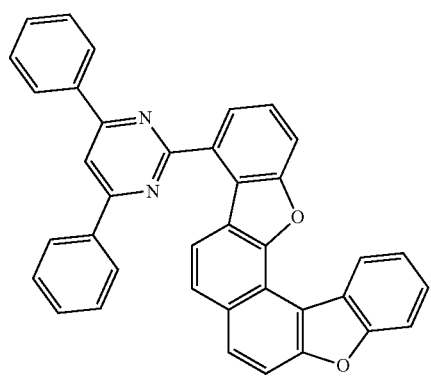
C-73
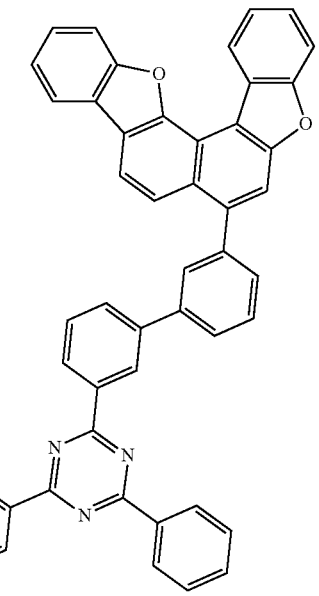
C-74
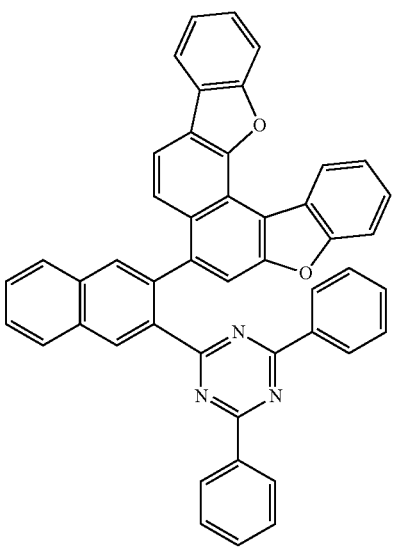
C-75
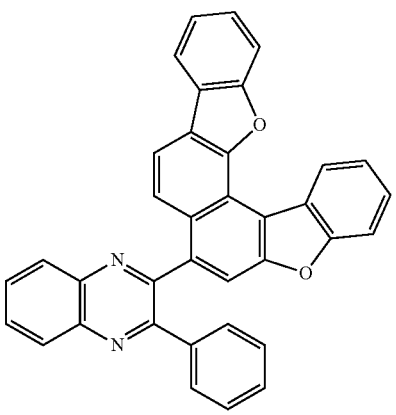
C-76

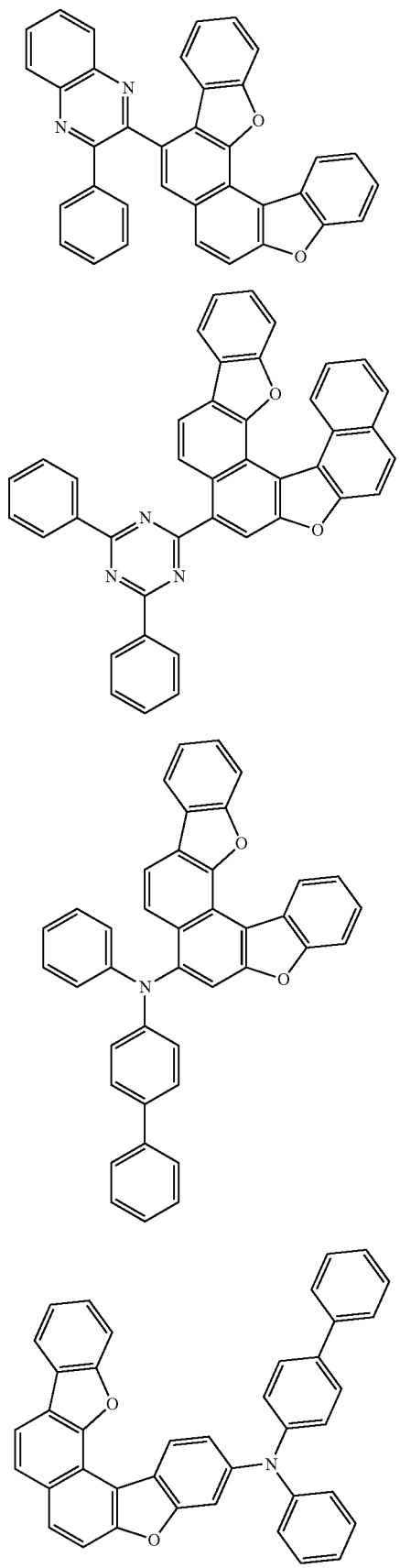

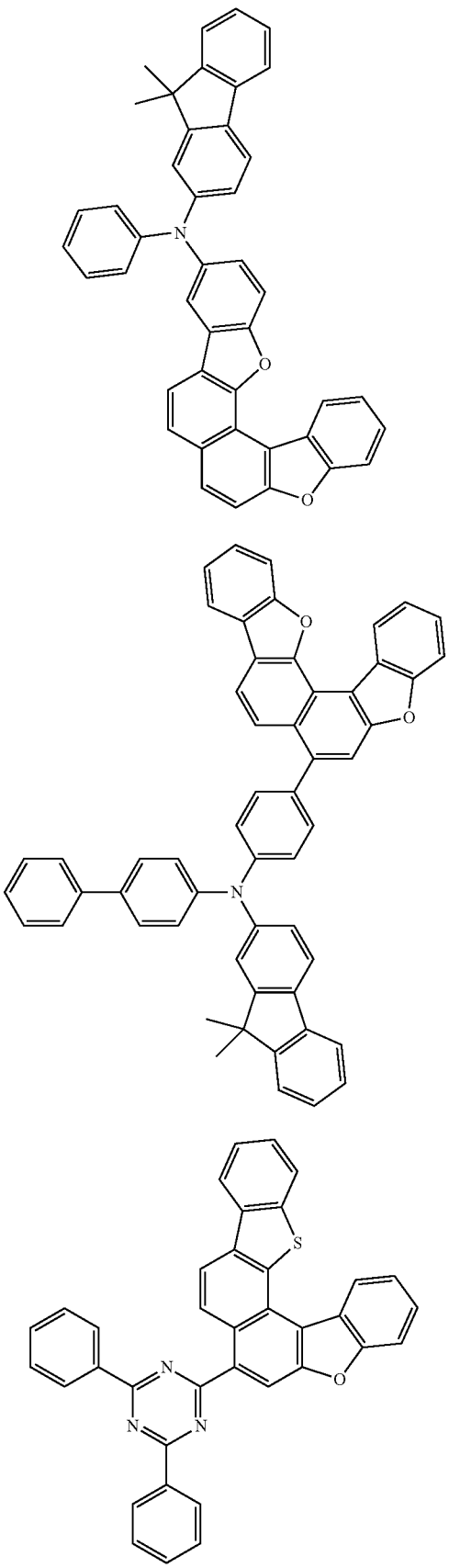
C-83
C-84
C-85
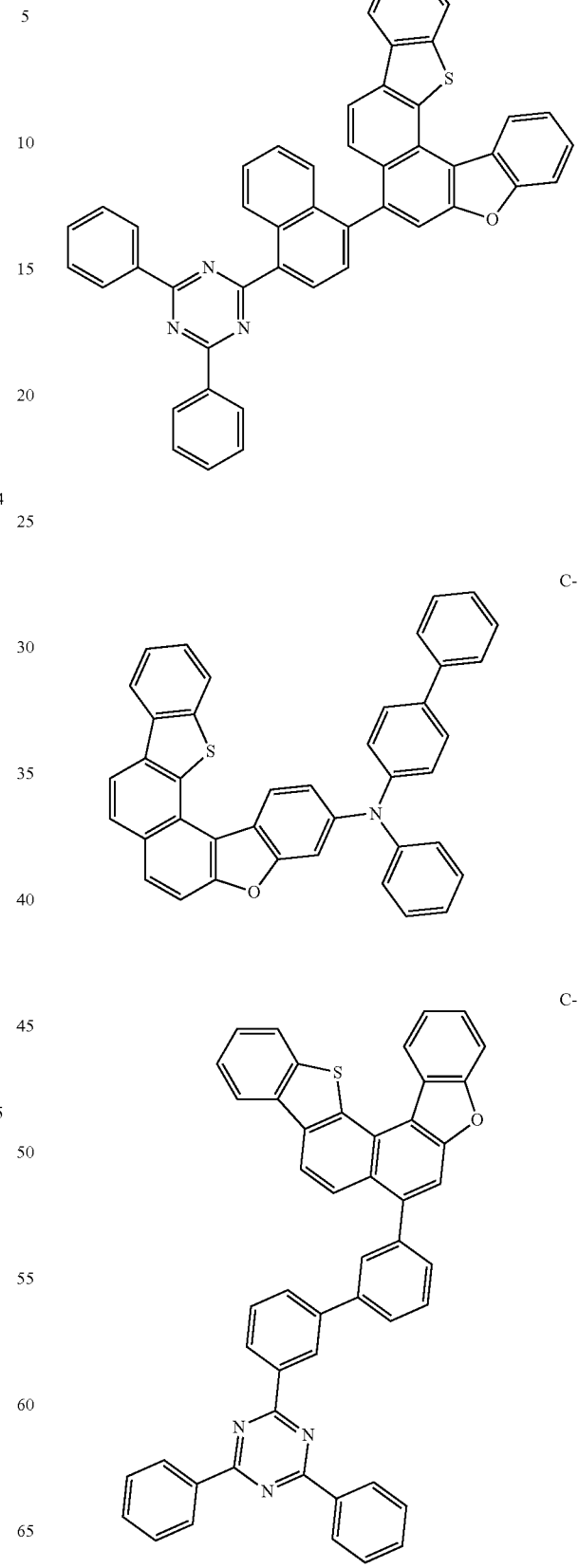
C-86
C-87
C-88

C-89
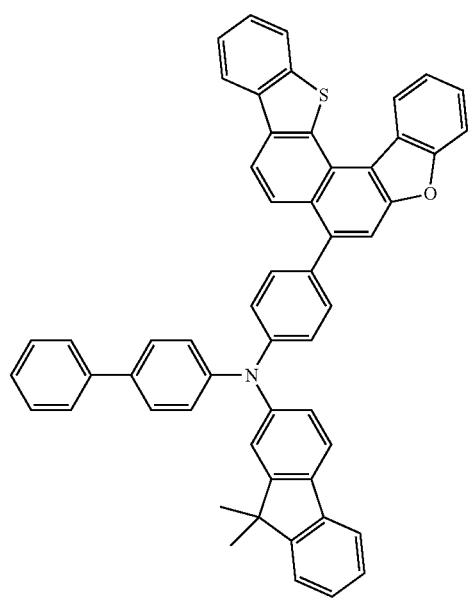
C-96
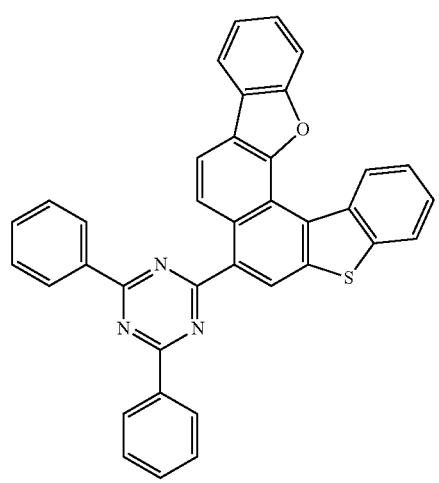
C-97
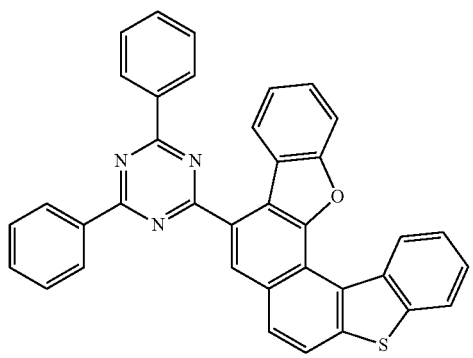
C-98
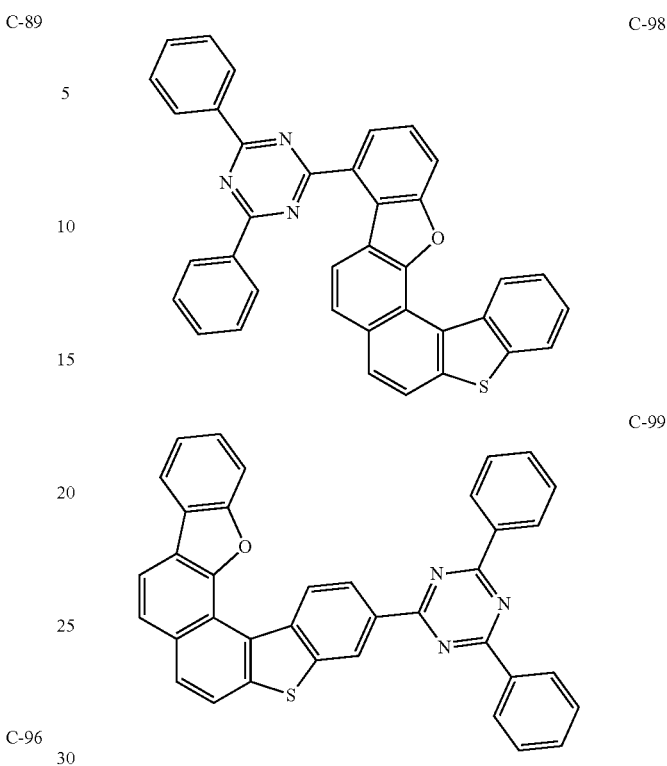
C-99
C-100
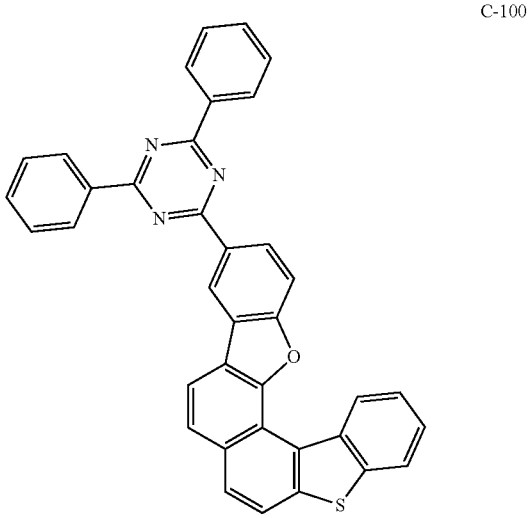
C-101
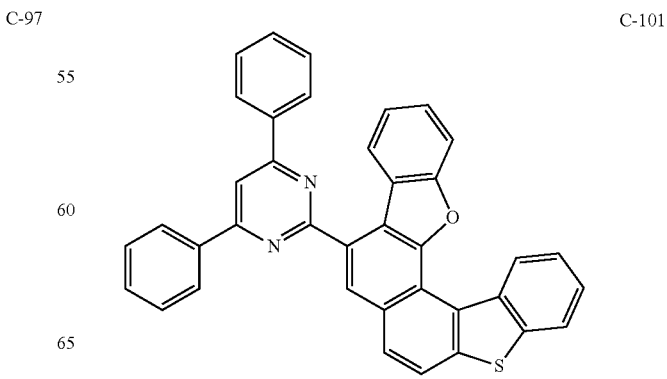

C-102
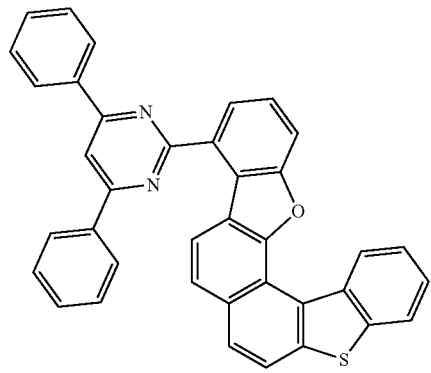
C-103
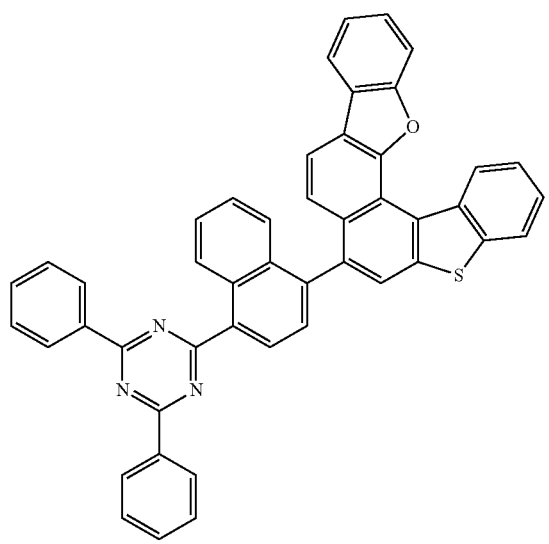
C-104
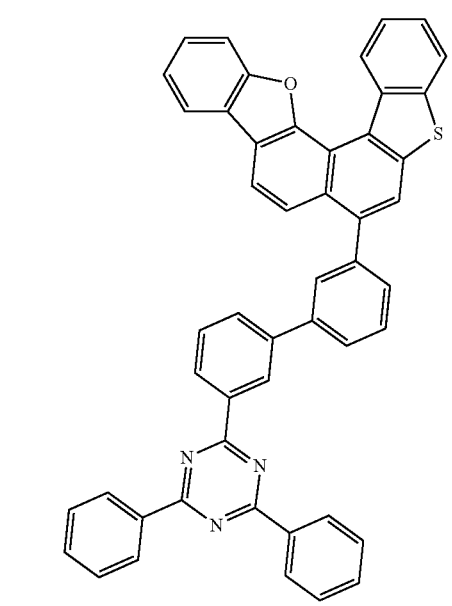
C-105
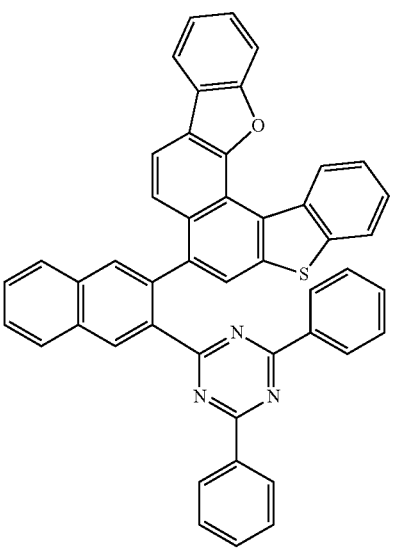
C-106
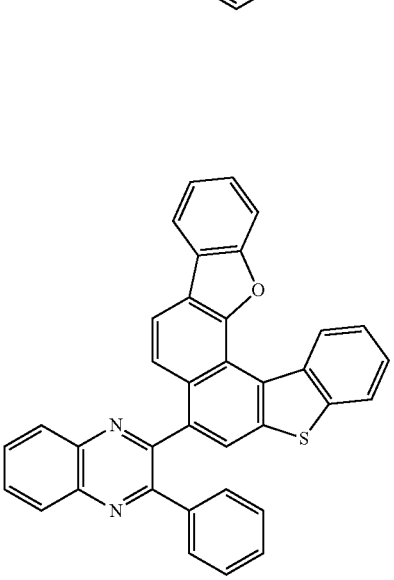
C-107
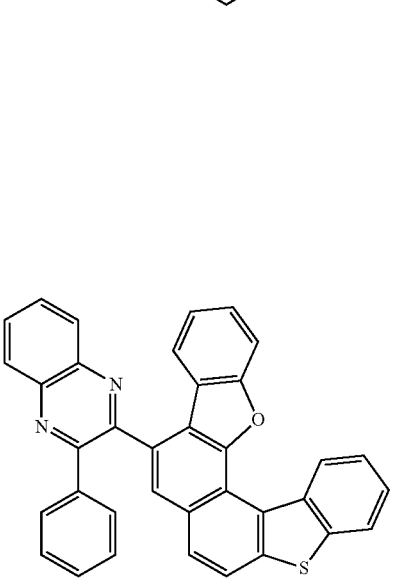

C-108
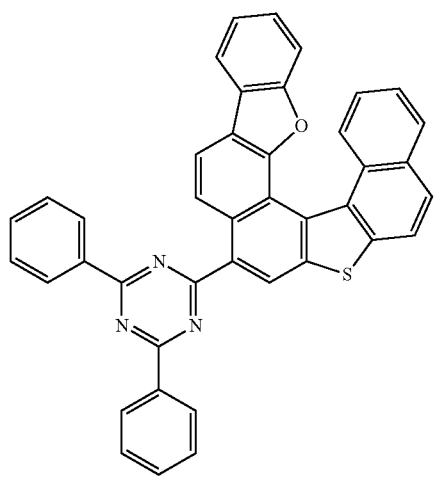
C-109
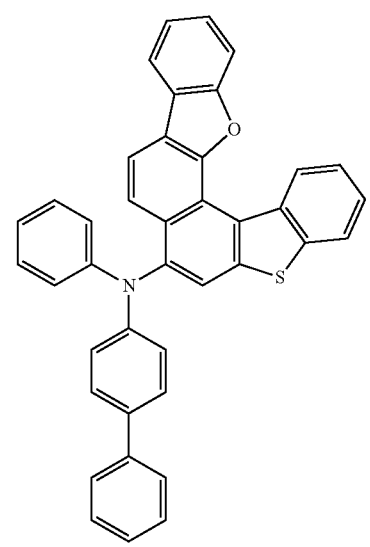
C-110
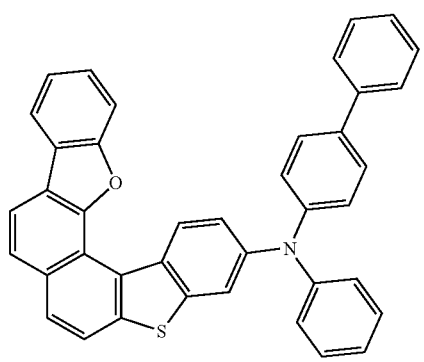
C-111
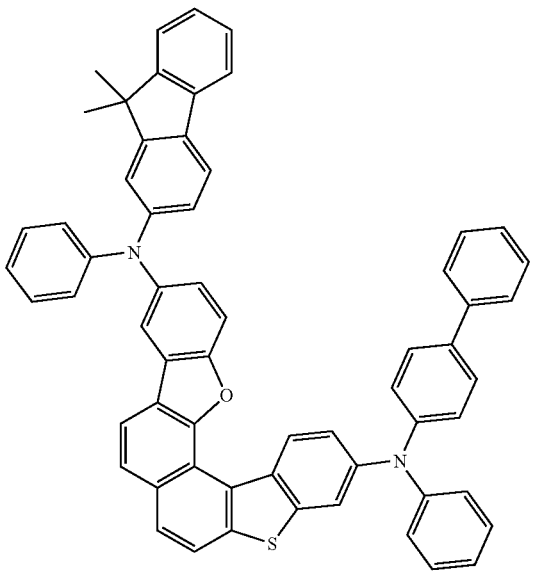
C-112
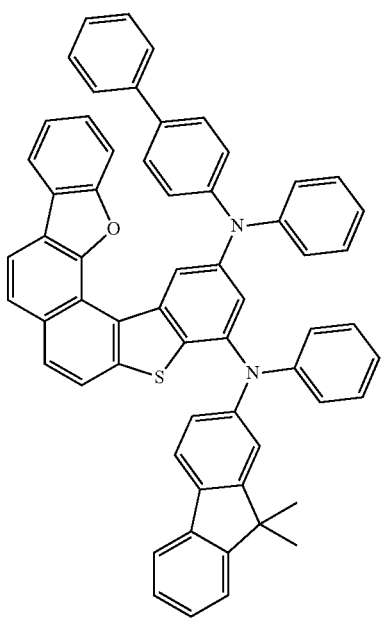

C-113
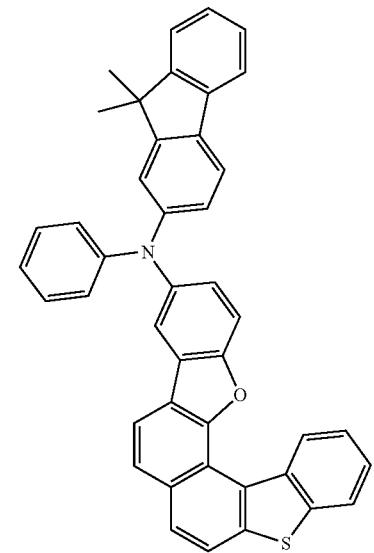
C-114
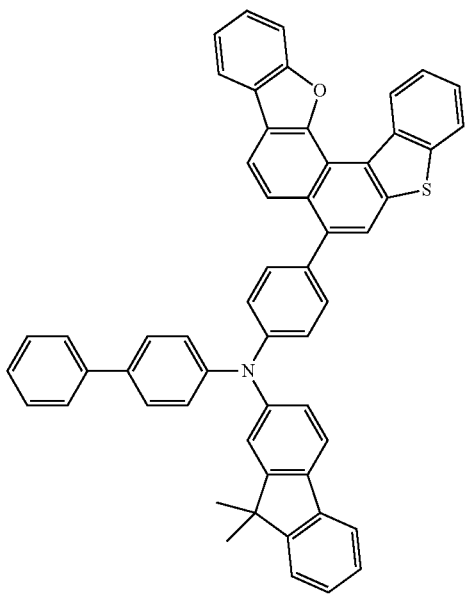
C-115
C-116
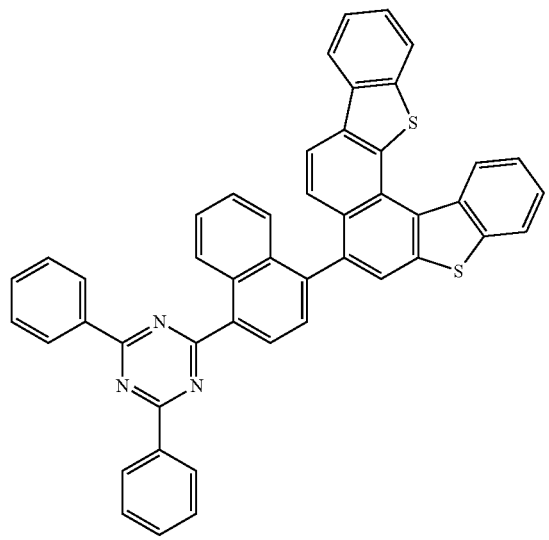
C-117
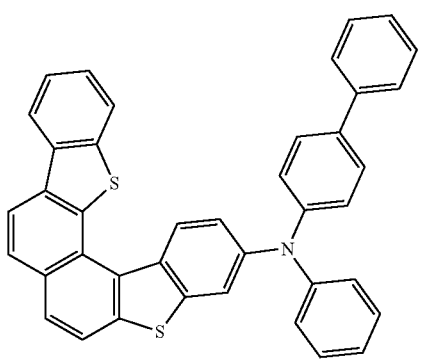
C-118
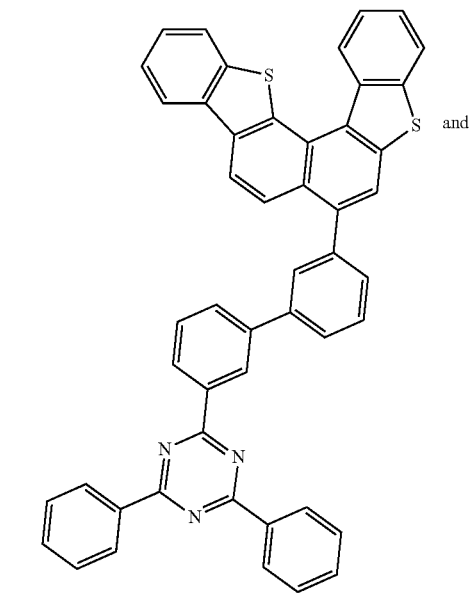
and C-119
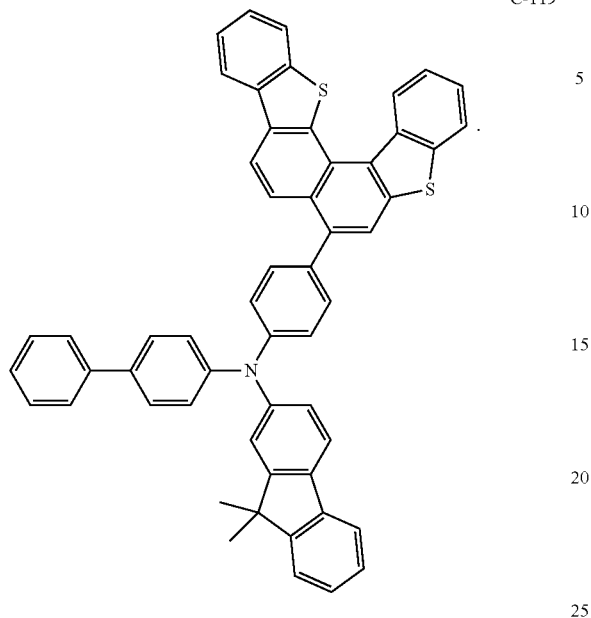
* * * * *